(12) United States Patent
Beigel et al.

(10) Patent No.: US 10,366,983 B2
(45) Date of Patent: Jul. 30, 2019

(54) SEMICONDUCTOR DEVICES INCLUDING CONTROL LOGIC STRUCTURES, ELECTRONIC SYSTEMS, AND RELATED METHODS

(71) Applicant: Micron Technology, Inc., Boise, ID (US)

(72) Inventors: Kurt D. Beigel, Boise, ID (US); Scott E. Sills, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/858,128

(22) Filed: Dec. 29, 2017

(65) Prior Publication Data

US 2019/0206861 A1    Jul. 4, 2019

(51) Int. Cl.
*H01L 27/06* (2006.01)
*H01L 27/092* (2006.01)
(Continued)

(52) U.S. Cl.
CPC .......... *H01L 27/0688* (2013.01); *G11C 5/025* (2013.01); *G11C 7/10* (2013.01);
(Continued)

(58) Field of Classification Search
CPC ............... H01L 27/0688; H01L 27/092; H01L 29/42392; H01L 29/78696; H01L 29/0642; H01L 29/78642; H01L 29/6675; H01L 27/1052; H01L 21/823807; H01L 21/823814; H01L 21/823885; H01L 21/8221; G11C 29/44; G11C 7/10; G11C 29/1201; G11C 29/14; G11C 5/025; G11C 5/147; G11C 5/145; G11C 8/10;
(Continued)

(56) References Cited

U.S. PATENT DOCUMENTS

| 4,740,826 A | 4/1988 | Chatterjee |
| 5,038,325 A | 8/1991 | Douglas et al. |

(Continued)

FOREIGN PATENT DOCUMENTS

| JP | 2000-311952 A | 11/2000 |
| KR | 10-2013-0103942 A | 9/2013 |

OTHER PUBLICATIONS

"International Technology Roadmap for Semiconductors 2013 Edition" ("ITRS"), all pages (Year: 2013).*

(Continued)

*Primary Examiner* — Fernando Hidalgo
(74) *Attorney, Agent, or Firm* — TraskBritt

(57) ABSTRACT

A semiconductor device includes a stack structure comprising decks. Each deck of the stack structure comprises a memory element level comprising memory elements and control logic level in electrical communication with the memory element level, the control logic level comprising a first subdeck structure comprising a first number of transistors comprising a P-type channel region or an N-type channel region and a second subdeck structure comprising a second number of transistors comprising the other of the P-type channel region or the N-type channel region overlying the first subdeck structure. Related semiconductor devices and methods of forming the semiconductor devices are disclosed.

41 Claims, 26 Drawing Sheets

(51) Int. Cl.

| | | |
|---|---|---|
| *H01L 29/423* | (2006.01) | |
| *H01L 29/786* | (2006.01) | |
| *H01L 29/06* | (2006.01) | |
| *H01L 21/822* | (2006.01) | |
| *H01L 21/8238* | (2006.01) | |
| *G11C 29/44* | (2006.01) | |
| *G11C 5/02* | (2006.01) | |
| *G11C 29/14* | (2006.01) | |
| *G11C 29/12* | (2006.01) | |
| *G11C 7/10* | (2006.01) | |
| *H01L 29/66* | (2006.01) | |
| *H01L 27/105* | (2006.01) | |
| *G11C 7/12* | (2006.01) | |
| *G11C 5/14* | (2006.01) | |
| *H03K 19/20* | (2006.01) | |
| *H03K 19/0948* | (2006.01) | |
| *G11C 8/10* | (2006.01) | |
| *G11C 8/08* | (2006.01) | |

(52) U.S. Cl.
CPC .......... *G11C 29/1201* (2013.01); *G11C 29/14* (2013.01); *G11C 29/44* (2013.01); *H01L 21/8221* (2013.01); *H01L 21/823807* (2013.01); *H01L 21/823814* (2013.01); *H01L 21/823885* (2013.01); *H01L 27/092* (2013.01); *H01L 27/1052* (2013.01); *H01L 29/0642* (2013.01); *H01L 29/42392* (2013.01); *H01L 29/6675* (2013.01); *H01L 29/78642* (2013.01); *H01L 29/78696* (2013.01); *G11C 5/145* (2013.01); *G11C 5/147* (2013.01); *G11C 7/12* (2013.01); *G11C 8/08* (2013.01); *G11C 8/10* (2013.01); *H03K 19/0948* (2013.01); *H03K 19/20* (2013.01)

(58) Field of Classification Search
CPC . G11C 7/12; G11C 8/08; H03K 19/20; H03K 19/0948
USPC .......................................................... 365/51
See application file for complete search history.

(56) References Cited

U.S. PATENT DOCUMENTS

| | | |
|---|---|---|
| 5,521,860 A | 5/1996 | Ohkubo |
| 5,612,563 A | 3/1997 | Fitch et al. |
| 6,094,068 A | 7/2000 | Nomura et al. |
| 6,252,427 B1 | 6/2001 | Domae et al. |
| 6,349,399 B1 | 2/2002 | Manning |
| 6,424,001 B1 | 7/2002 | Forbes et al. |
| 6,691,252 B2 | 2/2004 | Hughes et al. |
| 6,721,206 B2 | 4/2004 | Abedifard |
| 6,774,426 B2 | 8/2004 | Abedifard |
| 6,924,560 B2 | 8/2005 | Wang et al. |
| 7,265,393 B2 | 9/2007 | Schuele et al. |
| 7,372,091 B2 | 5/2008 | Leslie |
| 7,408,224 B2 | 8/2008 | Kim |
| 7,629,633 B2 | 12/2009 | Chan et al. |
| 7,825,460 B2 | 11/2010 | Breitwisch et al. |
| 8,294,212 B2 | 10/2012 | Wang et al. |
| 8,958,228 B2 | 2/2015 | Samachisa et al. |
| 9,105,320 B2 | 8/2015 | Schubert et al. |
| 9,112,138 B2 | 8/2015 | Ramaswamy et al. |
| 9,281,044 B2 | 3/2016 | Ramaswamy et al. |
| 9,530,790 B1 | 12/2016 | Lu et al. |
| 9,653,617 B2 | 5/2017 | Zhou et al. |
| 9,792,987 B1 | 10/2017 | Chou et al. |
| 2006/0049461 A1 | 3/2006 | Schuele et al. |
| 2006/0097304 A1 | 5/2006 | Yoon et al. |
| 2009/0057722 A1 | 3/2009 | Masuoka et al. |
| 2009/0114971 A1 | 5/2009 | Cai et al. |
| 2009/0213639 A1 | 8/2009 | Toda |
| 2010/0213525 A1 | 8/2010 | Masuoka et al. |
| 2010/0219483 A1 | 9/2010 | Fuijo et al. |
| 2013/0003433 A1* | 1/2013 | Hishida ................. G11C 5/025 365/51 |
| 2013/0234240 A1 | 9/2013 | Moon et al. |
| 2014/0151776 A1 | 6/2014 | Beigel et al. |
| 2014/0361239 A1 | 12/2014 | Ramaswamy et al. |
| 2015/0131381 A1 | 5/2015 | Rhie |
| 2016/0035418 A1 | 2/2016 | Castro et al. |
| 2016/0155855 A1 | 6/2016 | Ramaswamy et al. |
| 2016/0240533 A1 | 8/2016 | Oxland |
| 2016/0343727 A1 | 11/2016 | Kim et al. |
| 2016/0351722 A1 | 12/2016 | Zhou et al. |
| 2018/0047753 A1* | 2/2018 | Yamazaki ........... H01L 27/0688 |
| 2018/0061835 A1 | 3/2018 | Yang et al. |
| 2018/0308853 A1 | 10/2018 | Bell et al. |
| 2018/0342584 A1* | 11/2018 | Boemmels ............ H01L 29/152 |

OTHER PUBLICATIONS

Bonnaud et al., Verticasl Channel Thin Film Transistor: Improvement Approach Similar to Multigate Monolithic CMOS Technology, ECS Transactions, vol. 37, vol. 1, (2011), pp. 29-37.

Chan et al., Amorphous Silicon Thin-Film Transistors with 90° Vertical Nanoscale Channel, Appl. Phys. Lett, vol. 86, (2005), pp. 253501-1-253501-3.

Fairchild Semiconductor, CMOS, The Ideal Logic Family, Application Note 77, (Jan. 1983), 12 pages.

ITRS, International Technology Roadmap for Semiconductors, 2013 Edition, Process Integration, Devices, and Structures, 51 pages.

Li et al., Skybridge-3D-CMOS: A Fine-Grained 3D CMOS Integrated Circuit Technology, IEEE Transactions on Nanotechnology, vol. 16, No. 4, (Jul. 2017), pp. 639-652.

Michal, Vratislav, On the Low-Power Design, Stability Improvement and Frequency Estimation of the CMOS Ring Oscillator, Radioelektronika (Radioelektronika), 2012 22nd International Conference, Apr. 17-18, 2012, 4 pages.

Nelson et al., Defeating the Trade-Off Between Process Complexity and Electrical Performance with Vertical Zinc Oxide Transistors, Appl. Phys. Lett., vol. 101, (2012), pp. 183503-1-183503-4.

Yakimets et al, Vertical GAAFETs for the Ultimate CMOS Scaling, IEEE Transactions on Electron Devices, vol. 26, No. 5, (May 2015), pp. 1433-1439.

Zhao et al., Three-Dimensional Flexible Complementary Metal-Oxide-Semiconductor Logic Circuits Based on Two-Layer Stacks of Single-Walled Carbon Nanotube Networks, ACS Nano, vol. 10, (2016), pp. 2193-2202.

International Written Opinion from International Application No. PCT/US2018/067489, dated Apr. 19, 2019, 6 pages.

International Search Report from International Application No. PCT/US2018/067489, dated Apr. 19, 2019, 3 pages.

* cited by examiner

SEMICONDUCTOR DEVICES INCLUDING CONTROL LOGIC STRUCTURES, ELECTRONIC SYSTEMS, AND RELATED METHODS

TECHNICAL FIELD

Embodiments of the disclosure relate to the field of semiconductor device design and fabrication. More particularly, embodiments of the disclosure relate to control logic devices including stacked decks of transistors, to control logic assemblies, semiconductor devices including the control logic devices, and to methods of forming the control logic devices and semiconductor devices.

BACKGROUND

Semiconductor device designers often desire to increase the level of integration or density of features within a semiconductor device by reducing the dimensions of the individual features and by reducing the separation distance between neighboring features. In addition, semiconductor device designers often desire to design architectures that are not only compact, but offer performance advantages, as well as simplified designs.

One example of a semiconductor device is a memory device. Memory devices are generally provided as internal integrated circuits in computers or other electronic devices. There are many types of memory including, but not limited to, random-access memory (RAM), read only memory (ROM), dynamic random access memory (PRAM), synchronous dynamic random access memory (SDRAM), flash memory, and resistance variable memory. Nonlimiting examples of resistance variable memory include resistive random access memory (ReRAM), conductive bridge random access memory (conductive bridge RAM), magnetic random access memory (MRAM), phase change material (PCM) memory, phase change random access memory (PCRAM), spin-torque-transfer random access memory (STTRAM), oxygen vacancy-based memory, and programmable conductor memory.

A typical memory cell of a memory device includes one access device, such as a transistor, and one memory storage structure, such as a capacitor. Modern applications for semiconductor devices can employ significant quantities of memory cells, arranged in memory arrays exhibiting rows and columns of the memory cells. The memory cells may be electrically accessed through digit lines (e.g., bit lines) and word lines (e.g., access lines) arranged along the rows and columns of the memory cells of the memory arrays. Memory arrays can be two-dimensional (2D) so as to exhibit a single deck (e.g., a single tier, a single level) of the memory cells, or can be three-dimensional (3D) so as to exhibit multiple decks (e.g., multiple levels, multiple tiers) of the memory cells.

Control logic devices within a base control logic structure underlying a memo array of a memory device have been used to control operations (e.g., access operations, read operations, write operations) on the memory cells of the memory device. An assembly of the control logic devices may be provided in electrical communication with the memory cells of the memory array by way of routing and interconnect structures. However, as the number of memory cells and a corresponding number of decks of a 3D memory array increases, electrically connecting the memory cells of the different decks of the 3D memory array to the assembly of control logic devices within the base control logic structure located below the memory array can create sizing and spacing complications associated with the increased quantities and dimensions of routing and interconnect structures required to facilitate the electrical connection. In addition, the quantities, dimensions, and arrangements of the different control logic devices employed within the base control logic structure can also undesirably impede reductions to the size of a memory device, increases to the storage density of the memory device, and/or reductions in fabrication costs.

It would, therefore, be desirable to have improved semiconductor devices, control logic assemblies, and control logic devices facilitating higher packing densities, as well as methods of forming the semiconductor devices, control logic assemblies, and control logic devices.

DETAILED DESCRIPTION

Figure 1:
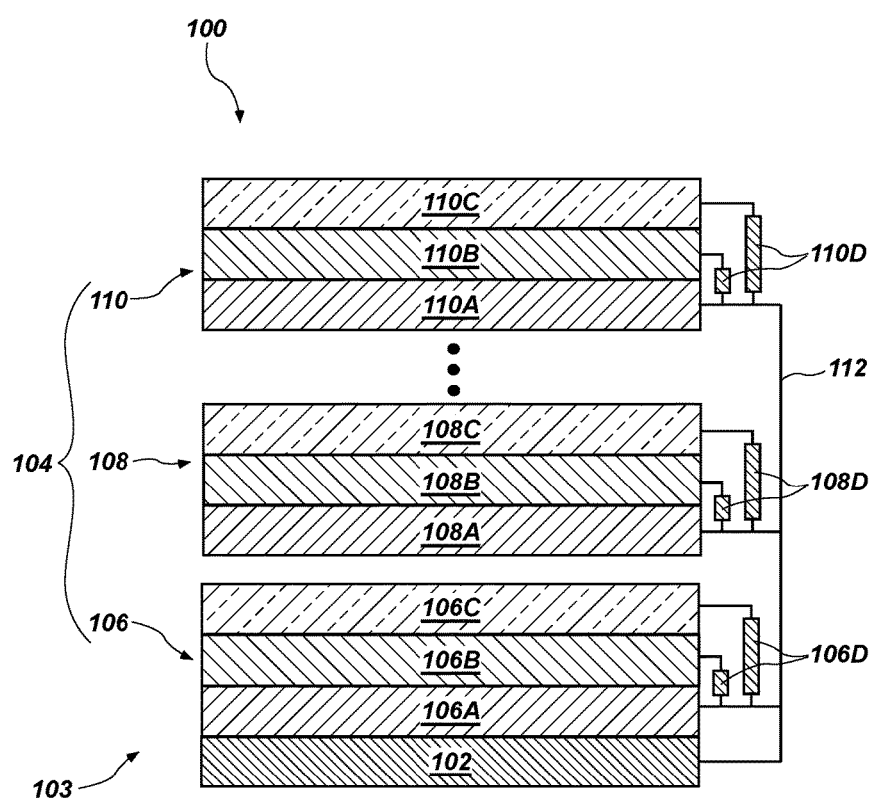
FIG. 1 is a simplified side elevation view of a semiconductor device, in accordance with an embodiment of the disclosure.

The illustrations included herewith are not meant to be actual views of any particular systems or semiconductor structures, but are merely idealized representations that are employed to describe embodiments herein. Elements and features common between figures may retain the same numerical designation except that, for ease of following the description, for the most part, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a semiconductor device, a thin film transistor control logic structure, or a complete description of a process flow for manufacturing such semiconductor devices or control logic structures. Only those process acts and structures necessary to understand the embodiments described herein are described in detail below. Additional acts to form a complete semiconductor device or control logic structure including the structures described herein may be performed by conventional techniques.

According to embodiments disclosed herein, a semiconductor device comprises a multi-deck structure including a base control logic structure and a stack structure over the base control logic structure. The stack structure includes decks, each deck comprising a memory element level, an access device level, and a thin film transistor (TFT) control logic level (e.g., a control logic level including one or more field-effect transistors including films of active semiconductor materials, dielectric materials, and metallic contacts). The TFT control logic level comprises, in some embodiments, a TFT CMOS device and includes a first subdeck structure comprising one of NMOS transistors and PMOS transistors and a second subdeck structure over the first subdeck structure and comprising the other of the NMOS transistors and the PMOS transistors. The first subdeck structure and the second subdeck structure may be vertically displaced from each other. The NMOS transistors, the PMOS transistors, or both may comprise a vertically extending channel region extending in a direction substantially orthogonal to the base control logic structure. In other embodiments, the NMOS transistors, the PMOS transistors, or both may comprise a laterally extending channel region, and may comprise planar transistors.

Arranging the semiconductor device to include the decks, each deck including a TFT control logic level, may reduce interconnect circuitry between each deck and the base control logic structure and any access device levels and memory element levels associated with each deck. Accordingly, the thin film transistor control logic levels may be formed to comprise CMOS circuitry with a reduced number (e.g., none) of sockets or interconnects down to the base control logic structure between the memory elements and access devices of each deck and the base control logic structure. In addition, since the subdeck structures are vertically displaced, the NMOS transistors and the PMOS transistors may be formed separately and associated with a particular deck having its own memory element level and access device level.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, at least 99.9% met, or even 100.0% met.

As used herein, the term "about" in reference to a given parameter is inclusive of the stated value and has the meaning dictated by the context (e.g., it includes the degree of error associated with measurement of the given parameter).

As used herein, the term "NMOS" transistor means and includes a so-called metal-oxide transistor having a P-type channel region. The gate of the NMOS transistor may comprise a conductive metal, another conductive material, such as polysilicon, or a combination thereof. As used herein, the term "PMOS" transistor means and includes a so-called metal-oxide transistor having an N-type channel region. The gate of the PMOS transistor may comprise a conductive metal, another conductive material, such as polysilicon, or a combination thereof. Accordingly, the gate structures of such transistors may include conductive materials that are not necessarily metals.

FIG. 1 shows a simplified side elevation view of a semiconductor device 100 (e.g., a 3D memory device), in accordance with embodiments of the disclosure. As shown in FIG. 1, the semiconductor device 100 includes a base control logic structure 102 and a stack structure 103 overlying with the base control logic structure 102. As described in further detail below, the stack structure 103 includes decks 104 (e.g., tiers) each individually including a thin film transistor (TFT) control logic level, an access device level over the TFT control logic level, a memory element level over the access device level, and interconnect structures extending between the TFT control logic level and each of the access device level and the memory element level. Each TFT control logic level of the decks 104 may individually include one or more control logic devices (e.g., TFT CMOS devices) exhibiting subdecks (e.g., sublevels) of transistors (e.g., NMOS transistors, PMOS transistors) thereof, as also described in further detail below. The base control logic structure 102 is in electrical communication with one or more (e.g., each) of the decks 104 of the stack structure 103 by way of interconnect structures 112 extending between the base control logic structure 102 and one or more levels (e.g., the TFT control logic level) of the one or more decks 104 of the stack structure 103.

The base control logic structure 102 may include devices and circuitry for controlling various operations of the stack structure 103. The devices and circuitry included in the base control logic structure 102 may be selected relative to devices and circuitry included in the TFT control logic levels of the decks 104 of the stack structure 103. The devices and circuitry included in the base control logic structure 102 may be different than the devices and circuitry included in the TFT control logic levels of the decks 104 of the stack structure 103, and may be used and shared by different decks 104 of the stack structure 103 to facilitate desired operation of the stack structure 103. By way of non-limiting example, the base control logic structure 102 may include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), drain supply voltage ($V_{DD}$) regulators, and various chip/deck control circuitry. The devices and circuitry included in the base control logic structure 102 may employ different conventional CMOS devices (e.g., conventional CMOS inverters, conventional CMOS NAND gates, conventional CMOS transmission pass gates, etc.), which are not described in detail herein. In turn, as described in further detail below, the devices and circuitry included in the TFT control logic level of each of the decks 104 of the stack structure 103 may not be shared by different decks 104 of the stack structure 103, and may be dedicated to effectuating and controlling various operations (e.g., access device level operations, and memory element level operations) of the deck 104 associated therewith not encompassed within the functions of the devices and circuitry included in the base control logic structure 102.

With continued reference to FIG. 1, the stack structure 103 may include any desired number of the decks 104. For clarity and ease of understanding of the drawings and related description, FIG. 1 shows the stack structure 103 as including three (3) decks 104. A first deck 106 may include a first TFT control logic level 106A, a first access device level 106B on or over the first TFT control logic level 106A, a first memory element level 106C on or over the first access device level 106B, and first interconnect structures 106D extending between and electrically coupling the first TFT control logic level 106A to each of the first access device level 106B and the first memory element level 106C. A second deck 108 may overlie the first deck 106 and may include a second TFT control logic level 108A, a second access device level 108B on or over the second TFT control logic level 108A, a second memory element level 108C on or over the second access device level 108B, and second interconnect structures 108D extending between and electrically coupling the second TFT control logic level 108A to each of the second access device level 108B and the second memory element level 108C. A third deck 110 may overlie the second deck 108 and may include a third TFT control logic level 110A, a third access device level 110B on or over the third TFT control logic level 110A, a third memory element level 110C on or over the third access device level 110B, and third interconnect structures 110D extending between and electrically coupling the third TFT control logic level 110A to each of the third access device level 110B and the third memory element level 110C. In additional embodiments, the stack structure 103 includes a different number of decks 104. For example, the stack structure 103 may include greater than two (2) decks 104 (e.g., greater than or equal to two (2) decks 104, greater than or equal to four (4) decks 104, greater than or equal to eight (8) decks 104, greater than or equal to sixteen (16) decks 104, greater than or equal to thirty-two (32) decks, greater than or equal to sixty-four (64) decks 104), or may include less than three (3) decks 104 (e.g., less than or equal to two (2) decks 104).

Although FIG. 1 illustrates that each of the first deck 106, the second deck 108, and the third deck 110 include the respective TFT control logic level 106A, 108A, 110A below the respective access device levels 106B, 108B, 110B and the respective memory element levels 106C, 108C, 110C, the disclosure is not so limited. In other embodiments, the TFT control logic level 106A, 108A, 110A of at least one of the first deck 106, the second deck 108, and the third deck 110 may be located above each of the respective access device levels 106B, 108B, 110B and the respective memory element levels 106C, 108C, 110C, or between respective ones of the access device levels 106B, 108B, 110B and the memory element levels 106C, 108C, 110C.

The memory element levels (e.g., the first memory element level 106C, the second memory element level 108C, the third memory element level 110C) of the each of the decks 104 (e.g., the first deck 106, the second deck 108, the third deck 110) of the stack structure 103 may each individually include an array of memory elements. The array may, for example, include rows of the memory elements extending in a first lateral direction, and columns of the memory elements extending in a second lateral direction perpendicular to the first lateral direction. In other embodiments, the rows of memory elements and the columns of the memory elements may not be perpendicular to each other. By way of nonlimiting example, the rows of the memory elements and the columns of the memory elements may be arranged in a hexagonal close-packed orientation for increasing a density of the memory elements (e.g., the memory cells).

The memory elements of the array may comprise RAM elements, ROM elements, DRAM elements, SDRAM elements, flash memory elements, resistance variable memory elements, or another type of memory element. In some embodiments, the memory elements comprise DRAM elements. In additional embodiments, the memory elements comprise resistance variable memory elements. Nonlimiting examples of resistance variable memory elements include ReRAM elements, conductive bridge RAM elements, MRAM elements, PCM memory elements, PCRAM elements, STTRAM elements, oxygen vacancy-based memory elements, and programmable conductor memory elements.

The access device levels (e.g., the first access device level 106B, the second access device level 108B, the third access device level 110B) of each of the decks 104 (e.g., the first deck 106, the second deck 108, the third deck 110) of the stack structure 103 may each individually include an array of access devices (e.g., TFT access devices). The access devices of the access device level (e.g., the first access device level 106B, the second access device level 108B, the third access device level 110B) of a given deck 104 (e.g., the first deck 106, the second deck 108, the third deck 110) may be operatively associated with the memory elements of the memory element level (e.g., the first memory element level 106C, the second memory element level 108C, the third memory element level 110C) of the given deck 104. The quantity and lateral positioning of the access devices of the access device level of the given deck 104 may, for example, correspond to the quantity and lateral positioning of the memory elements of the memory element level of the given deck 104. The access devices of the access device level may underlie and be in electrical communication with the memory elements of the memory element level. Although FIG. 1 illustrates that the access device levels 106B, 108B, 110B underlie the memory element levels 106C, 108C, 110C, the disclosure is not so limited. In other embodiments, the access device levels 106B, 108B, 110B may overlie the memory element levels 106C, 108C, 110C. Similarly, the access device levels 106B, 108B, 110B may overlie the TFT control logic levels 106A, 108A, 110A.

Together the access devices of the access device level and the memory elements of the memory element level operatively associated therewith may form memory cells for each of the decks 104 of the stack structure 103. The access devices may, for example, each individually include a channel region between a pair of source/drain regions, and a gate configured to electrically connect the source/drain regions to one another through the channel region. The access devices may comprise planar access devices (e.g., planar TFT access devices) or vertical access devices (e.g., vertical TFT access devices). Planar access devices can be distinguished from vertical access devices based upon the direction of current flow between the source and drain regions thereof. Current flow between the source and drain regions of a vertical access device is primarily substantially orthogonal (e.g., perpendicular) to a primary (e.g., major) surface of a substrate or base (e.g., the base control logic structure 102) thereunder, and current flow between source and drain regions of a planar access device is primarily parallel to the primary surface of the substrate or base thereunder.

The TFT control logic levels (e.g., the first TFT control logic level 106A, the second TFT control logic level 108A, the third TFT control logic level 110A) of the each of the decks 104 (e.g., the first deck 106, the second deck 108, the third deck 110) of the stack structure 103 may include devices and circuitry for controlling various operations of the memory element level (e.g., the first memory element level 106C, the second memory element level 108C, the third memory element level 110C) and the access device level (e.g., the first access device level 106B, the second access device level 108B, the third access device level 110B) of the deck 104 not encompassed (e.g., effectuated, carried out, covered) by the devices and circuitry of the base control logic structure 102. By way of non-limiting example, the TFT control logic levels may each individually include one or more (e.g., each) of decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), word line (WL) drivers, repair circuitry (e.g., column repair circuitry, row repair circuitry), I/O devices (e.g., local I/O devices), test devices, array multiplexers (MUX), error checking and correction (ECC) devices, and self-refresh/wear leveling devices. As described in further detail below, the devices and circuitry included in the TFT control logic levels may employ TFT CMOS devices (e.g., CMOS inverters, CMOS NAND gates (e.g., a two-input NAND circuit), CMOS pass gates (e.g., CMOS transmission pass gates), etc.) including vertically stacked (e.g., displaced) PMOS and NMOS transistors. By way of nonlimiting example, the devices and circuitry of each of the TFT control logic levels may comprise a first subdeck structure comprising one of NMOS transistors and PMOS transistors (e.g., an array of NMOS transistors or PMOS transistors) and a second subdeck structure over the first subdeck structure and comprising the other of the NMOS transistors and the PMOS transistors (e.g., an array of the other of NMOS transistors and PMOS transistors). At least some of the transistors of the first subdeck structure may be in electrical communication with at least some of the transistors of the second subdeck structure to form one or more TFT CMOS devices (including one or more CMOS circuits).

The devices and circuitry of the TFT control logic level of each of the decks 104 may only be utilized to effectuate and control operations within a single (e.g., only one) deck 104 of the stack structure 103 (e.g., may not be shared between two or more of the decks 104), or may be utilized to effectuate and control operations within multiple (e.g., more than one) decks 104 of the stack structure 103 (e.g., may be shared between two or more of the decks 104). In addition, each of the TFT control logic levels (e.g., the first TFT control logic level 106A, the second TFT control logic level 108A, and the third TFT control logic level 110A) of the stack structure 103 may exhibit substantially the same configuration (e.g., substantially the components and component arrangements), or at least one of the TFT control logic levels of the stack structure 103 may exhibit a different configuration (e.g., different components and/or a different component arrangement) than at least one other of the TFT control logic levels.

Thus, a semiconductor device according to embodiments of the disclosure comprises a base control logic structure comprising control logic devices, and a stack structure in electrical communication with the base control logic structure. The stack structure comprises stacked decks each deck of the stacked decks individually comprising a memory element level comprising memory elements, an access device level comprising access devices electrically connected to the memory elements of the memory element level, and a control logic level in electrical communication with the memory element level and the access device level and comprising additional control logic devices. At least one of the additional control logic devices of the control logic level of one or more of the decks of the stacked decks comprises a CMOS device comprising a first number of transistors comprising one of N-type channel regions or P-type channel regions disposed over a second number of transistors comprising the other of the N-type channel regions and the P-type channel regions. The TFT control logic level may further be in electrical communication with the base control logic structure.

Figure 2:
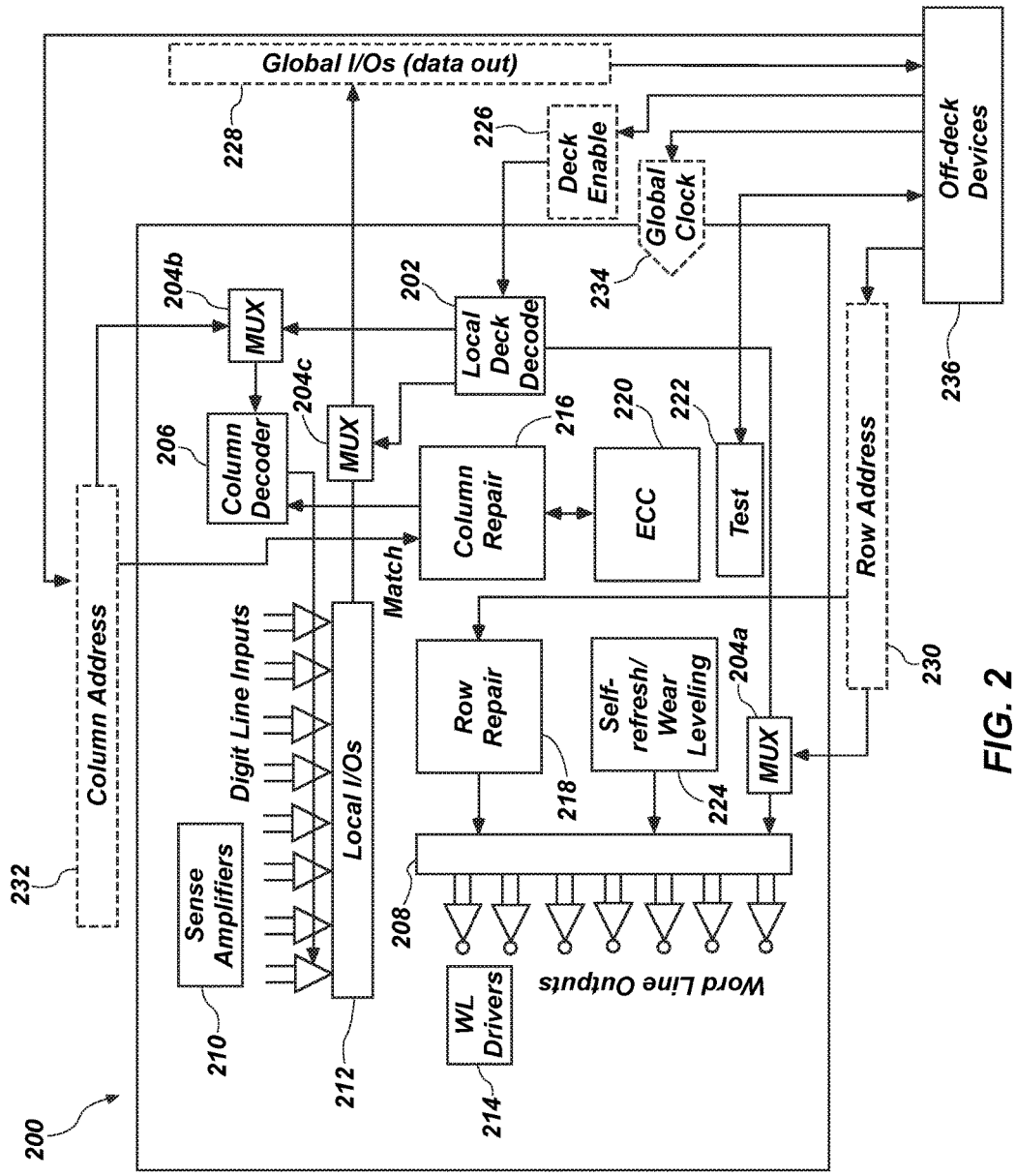
FIG. 2 is a simplified block diagram of a thin film transistor (TFT) control logic level of the semiconductor device shown in FIG. 1, in accordance with embodiments of the disclosure.

FIG. 2 is a block diagram of a configuration of a TFT control logic level 200 fix use in one or more of the decks 104 (FIG. 1) of the stack structure 103 (FIG. 1) of the semiconductor device 100 shown in FIG. 1. The TFT control logic level 200 may include a variety of control logic devices and circuits that would otherwise be included in off-deck circuitry (e.g., circuitry not presented within the TFT control logic level 200), such as circuitry within a base control logic structure (e.g., the base control logic structure 102 shown in FIG. 1). For example, as shown in FIG. 2, an assembly of control logic devices and circuits present within the TFT control logic level 200 may include one or more (e.g., each) of a local deck decoder 202, multiplexers (MUX) 204 (illustrated in FIG. 2 as a first MUX 204a, a second MUX 204b, and a third MUX 204c), a column decoder 206, a row decoder 208, sense amplifiers 210, local I/O devices 212, WL drivers 214, a column repair device 216, a row repair device 218, a memory test device 222, an ECC device 220, and a self-refresh/wear leveling device 224. The assembly of control logic devices and circuits present within the TFT control logic level 200 may be operatively associated with (e.g., in electrical communication with) additional control logic devices and circuits outside of the TFT control logic level 200 (e.g., within one or more additional levels and/or structures, such the base control logic structure 102 shown in FIG. 1), such as a deck enable signal 226, global data signal 228, row address signal 230, column address signal 232, global clock devices 234, and other off-deck devices 236 (e.g., a controller, a host). While FIG. 2 depicts a particular configuration of the TFT control logic level 200, one of ordinary skill in the art will appreciate that different control logic assembly configurations, including different control logic devices and circuits and/or different arrangements of control logic devices and circuits, are known in the art which may be adapted to be employed in embodiments of the disclosure. FIG. 2 illustrates just one non-limiting example of the TFT control logic level 200.

As shown in FIG. 2, one or more off-deck devices 236 located outside of the TFT control logic level 200 (e.g., in the base control logic structure 102 shown in FIG. 1) may be configured and operated to convey signals (e.g., a deck enable signal 226, a row address signal 230, a column address signal 232) to different devices of the TFT control logic level 200. For example, the off-deck devices 236 may send a deck enable signal 226 to the local deck decoder 202, which may decode the deck enable signal 226 and activate one or more of the MUX 204 (e.g., the first MUX 204a, the second MUX 204b, and/or the third MUX 204c) of the TFT control logic level 200. As described in further detail below, when activated, the MUX 204 may individually be configured and operated to select one of several input signals and then forward the selected input into a single line.

The first MUX 204a (e.g., a row MUX) of the TFT control logic level 200 may be in electrical communication with the local deck decoder 202 and the row decoder 208 of the TFT control logic level 200. The first MUX 204a may be activated by signal(s) from the local deck decoder 202, and may be configured and operated to selectively forward at least one row address signal 230 from the off-deck devices 236 to the row decoder 208. The row decoder 208 may be configured and operated to select particular word lines of a deck (e.g., one of the first deck 106, the second deck 108, and the third deck 110 shown in FIG. 1) including the TFT control logic level 200 based on the row address signal 230 received thereby.

With continued reference to FIG. 2, the row repair device 218 of the TFT control logic level 200 may be in electrical communication with the row decoder 208, and may be configured and operated to substitute a defective row of memory elements of a memory element array of a memory element level (e.g., one of the memory element levels 106C, 108C, 110C shown in FIG. 1) operatively associated with (e.g., within the same deck 104 shown in FIG. 1) the TFT control logic level 200 for a spare, non-defective row of memory elements of the memory element array of the memory element level. The row repair device 218 may transform a row address signal 230 directed to the row decoder 208 (e.g., from the first MUX 204a) identifying the defective row of memory elements into another row address signal identifying the spare, non-defective row of memory elements. Defective rows (and columns) of memory elements may, for example, be determined using the memory test device 222 of the TFT control logic level 200, as described in further detail below.

The WL drivers 214 of the TFT control logic level 200 may be in electrical communication with the row decoder 208, and may be configured and operated to activate word lines of a deck (e.g., one of the first deck 106, the second deck 108, and the third deck 110 shown in FIG. 1) including the TFT control logic level 200 based on word line selection commands received from the row decoder 208. The memory elements of a memory element level (e.g., one of the memory element levels 106C, 108C, 110C shown in FIG. 1) operatively associated with the TFT control logic level 200 may be accessed by way of access devices of an access device level (e.g., one of the access device levels 106B, 108B, 110B shown in FIG. 1) operatively associated with the TFT control logic level 200 for reading or programming by voltages placed on the word lines using the WL drivers 214.

The self-refresh/wear leveling device 224 of the TFT control logic level 200 may be in electrical communication with the row decoder 208, and may be configured and operated to periodically recharge the data stored in memory elements of a memory element level (e.g., one of the memory element levels 106C, 108C, 110C shown in FIG. 1) operatively associated with (e.g., within the same deck 104 shown in FIG. 1) the TFT control logic level 200. During a self-refresh/wear leveling operation, the self-refresh/wear leveling device 224 may be activated in response to an external command signal, and may generate different row address signals that may be forwarded to the row decoder 208. The row decoder 208 may then select particular word lines of a deck (e.g., one of the first deck 106, the second deck 108, and the third deck 110 shown in FIG. 1) including the TFT control logic level 200 based on the different row address signals received from the self-refresh/wear leveling device 224. The row decoder 208 may then communicate with the WL drivers 214 to activate the selected word lines, and charges accumulated in capacitors of memory elements operatively associated with the selected word lines may then be amplified by a sense amplifier and then stored in the capacitors again.

Still referring to FIG. 2, the second MUX 204b (e.g., a column MUX) of the TFT control logic level 200 may be in electrical communication with the local deck decoder 202 and the column decoder 206 of the TFT control logic level 200. The second MUX 204b may be activated by signal(s) from the local deck decoder 202, and may be configured and operated to selectively forward at least one column address signal 232 from the off-deck devices 236 to the column decoder 206. The column decoder 206 may be configured and operated to select particular digit lines (e.g., bit lines) of a deck (e.g., one of the first deck 106, the second deck 108, and the third deck 110 shown in FIG. 1) including the TFT control logic level 200 based on the column address selection signal received thereby.

The column repair device 216 of the TFT control logic level 200 may be in electrical communication with the column decoder 206, and may be configured and operated to substitute a defective column of memory elements of a memory element array of a memory element level (e.g., one of the memory element levels 106C, 108C, 110C shown in FIG. 1) operatively associated with (e.g., within the same deck 104 shown in FIG. 1) the TFT control logic level 200 for a spare, non-defective column of memory elements of the memory element array of the memory element level. The column repair device 216 may transform a column address signal 232 directed to the column decoder 206 (e.g., from the second MUX 204b) identifying the defective column of memory elements into another column address signal identifying the spare, non-defective column of memory elements. As previously discussed, defective columns (and rows) of memory elements may, for example, be determined using the memory test device 222 of the TFT control logic level 200, as described in further detail below.

The ECC device 220 of the TFT control logic level 200 may be configured and operated to generate an ECC code (also known as "check bits"). The ECC code may correspond to a particular data value, and may be stored along with the data value in a memory element of a memory element level (e.g., one of the memory element levels 106C, 108C, 110C shown in FIG. 1) operatively associated with (e.g., within the same deck 104 shown in FIG. 1) the TFT control logic level 200. When the data value is read back from the memory element, another ECC code is generated and compared with the previously-generated ECC code to access the memory element. If non-zero, the difference in the previously-generated ECC code and the newly-generated ECC code indicates that an error has occurred. If an error condition is detected, the ECC device 220 may then be utilized to correct the erroneous data.

The memory test device 222 of the TFT control logic level 200 may be configured and operated to identify defective (e.g., faulty) memory elements of a memory element array of a memory element level (e.g., one of the memory element levels 106C, 108C, 110C shown in FIG. 1) operatively associated with (e.g., within the same deck 104 shown in FIG. 1) the TFT control logic level 200. The memory test device 222 may attempt to access and write test data to memory elements at different addresses (e.g., different column addresses, different row addresses) within the memory element array. The memory test device 222 may then attempt to read data stored at the memory elements, and compare the read data to the test data expected at the memory elements. If the read data is different than the expected test data, the memory test device 222 may identify the memory elements as defective. The defective memory elements (e.g., defective rows of memory elements, defective columns of memory elements) identified by the memory test device 222 may then be acted upon and/or avoided by other components (e.g., the row repair device 218, the column repair device 216) of the TFT control logic level 200.

With continued reference to FIG. 2, the local I/O devices 212 of the TFT control logic level 200 may be configured and operated to receive data from digit lines selected by the column decoder 206 during read operations, and to output data to digit lines selected by the column decoder 206 during write operations. As shown in FIG. 2, the local I/O devices 212 may include sense amplifiers 210 configured and operated to receive digit line inputs from the digit lines selected by the column decoder 206 and to generate digital data values during read operations. During write operations, the local I/O devices 212 may program data into memory elements of a memory element level operatively associated with the TFT control logic level 200 by placing proper voltages on the digit lines selected by the column decoder 206. For binary operation, one voltage level is typically placed on a digit line to represent a binary "1" and another voltage level to represent a binary "0".

The third MUX 204c of the TFT control logic level 200 may be in electrical communication with the local I/O devices 212 and the local deck decoder 202. The third MUX 204c may be activated by signal(s) received from the local deck decoder 202, and may be configured and operated to receive digital data values generated by the local I/O devices 212 and to generate a global data signal 228 therefrom. The global data signal 228 may be forwarded to one or more off-deck devices 236 (e.g., a controller).

In accordance with embodiments of the disclosure, one or more of the components (e.g., one or more of the local deck decoder 202, the MUX 204 (the first MUX 204a, the second MUX 204b, the third MUX 204c), the column decoder 206, the row decoder 208, the sense amplifiers 210, the local I/O devices 212, the WL drivers 214, the column repair device 216, the row repair device 218, the ECC device 220, the memory test device 222, the self-refresh/wear leveling device 224) of the TFT control logic level 200 may employ one or more TFT CMOS devices exhibiting one of PMOS transistors and NMOS transistors over the other of the PMOS transistors and the NMOS transistors. In other words, the PMOS transistors may be vertically displaced (e.g., located above or located below) from the NMOS transistors. For example, a first subdeck structure may include PMOS transistors arranged in a pattern, group, arrangement, array, etc. and may overlie a second subdeck structure including NMOS transistors arranged in a pattern, group, arrangement, array, etc. The PMOS transistors may be vertical PMOS transistors having a vertically oriented (e.g., in a direction perpendicular to a major surface of a substrate (e.g., the base control logic structure 102) on which the first subdeck is formed) channel region. In other embodiments, the PMOS transistors may be planar PMOS transistors having a laterally oriented channel region. The NMOS transistors may be vertical NMOS transistors, planar NMOS transistors, or a combination thereof.

Accordingly, one or more components of at least one of the TFT control logic levels (e.g., the first TFT control logic level 106A, the second TFT control logic level 108A, the third TFT control logic level 110A) of one or more of the decks 104 (e.g., the first deck 106, the second deck 108, the third deck 110) of the stack structure 103 of the semiconductor device 100 previously described with reference to FIG. 1 may include one or more TFT CMOS devices comprising a first subdeck structure of one of PMOS transistors and NMOS transistors over a second subdeck structure of the other of the PMOS transistors and the NMOS transistors. Nonlimiting examples of such TFT CMOS devices are described in further detail below with reference to FIG. 3A through FIG. 11B Thus, a TFT control logic assembly according to embodiments of the disclosure comprises TFT control logic devices selected from the group comprising decoders, sense amplifiers, word line drivers, repair devices, memory test devices, multiplexers, error checking and correction devices, and self-refresh/wear leveling devices. At least one of the TFT control logic devices comprises a first subdeck structure comprising one of NMOS transistors and PMOS transistors arranged over a second subdeck structure comprising the other of the NMOS transistors and the PMOS transistors. The NMOS transistors may each comprise a vertically oriented channel region and may be referred to as a vertical NMOS transistor. Similarly, the PMOS transistors may each comprise a vertically oriented channel region and may be referred to as a vertical PMOS transistor. In other embodiments, one or both of the NMOS transistors may comprise a laterally extending channel region and may be referred to as a planar NMOS transistor and each of the PMOS transistors may comprise a laterally extending channel region and may be referred to as a planar PMOS transistor. The NMOS transistors and the PMOS transistors may be arranged as bottom gate transistors, top gate transistors, double gate transistors, gate all around (GAA) transistors, saddle gate transistors, or other transistor structures.

Accordingly, in some embodiments, a method of operating a semiconductor device comprises controlling functions of a stack structure having multiple decks, each deck of the stack structure comprising memory cells using control logic levels of the multiple decks, the control logic level each comprising at least one control logic device comprising a first subdeck structure comprising transistors having one of a P-type channel region and an N-type channel region overlying a second subdeck structure comprising transistors having the other of the P-type channel region and the N-type channel region, and controlling additional functions of the stack structure using a base control logic structure in electrical communication with the control logic levels of the stack structure.

Figure 3A:
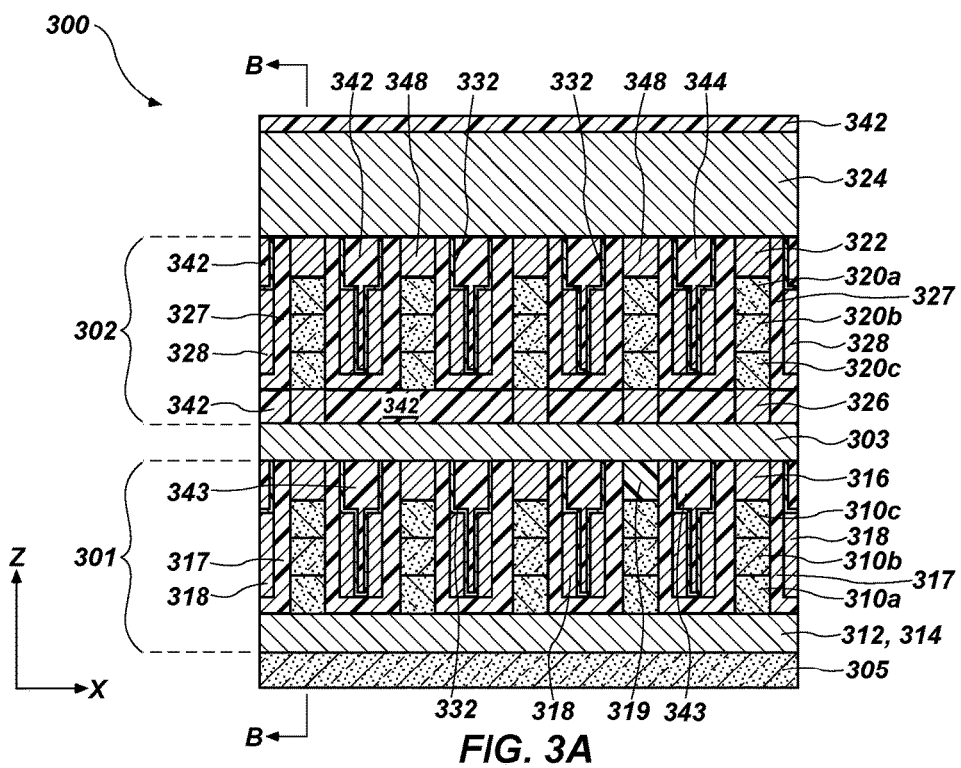
FIG. 3A and FIG. 3B are simplified cross-sectional views of a TFT control logic level including metal-oxide-semiconductor (CMOS) circuits, in accordance with embodiments of the disclosure.
Figure 3B:
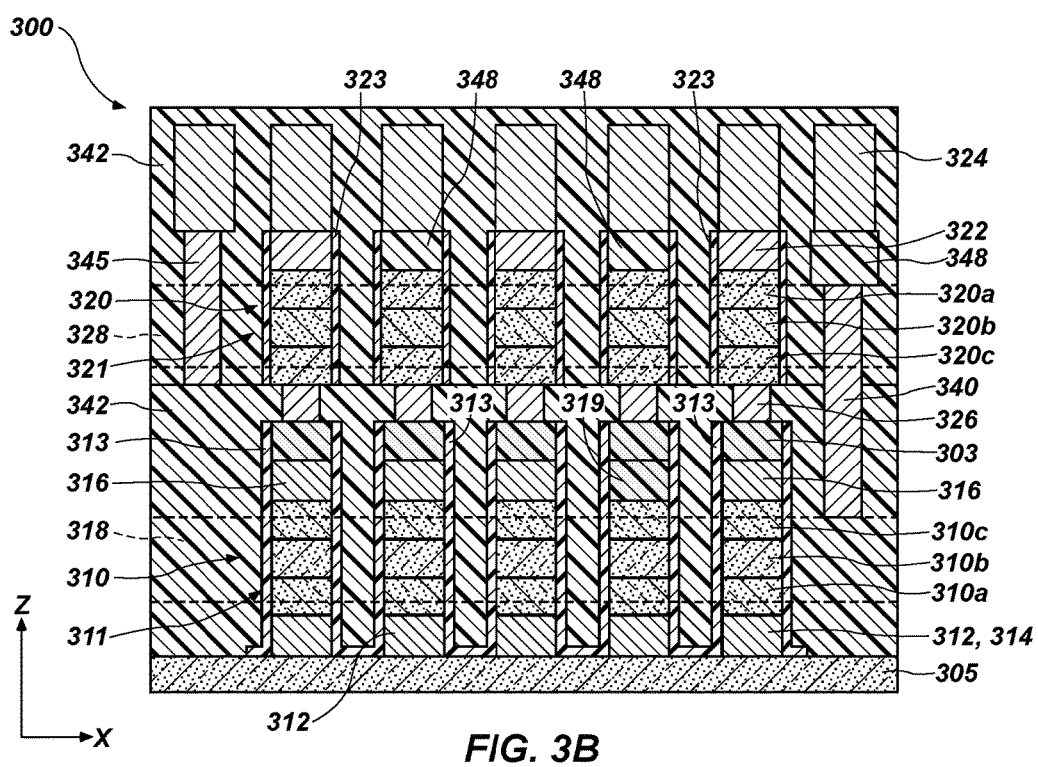
Figure 3C:
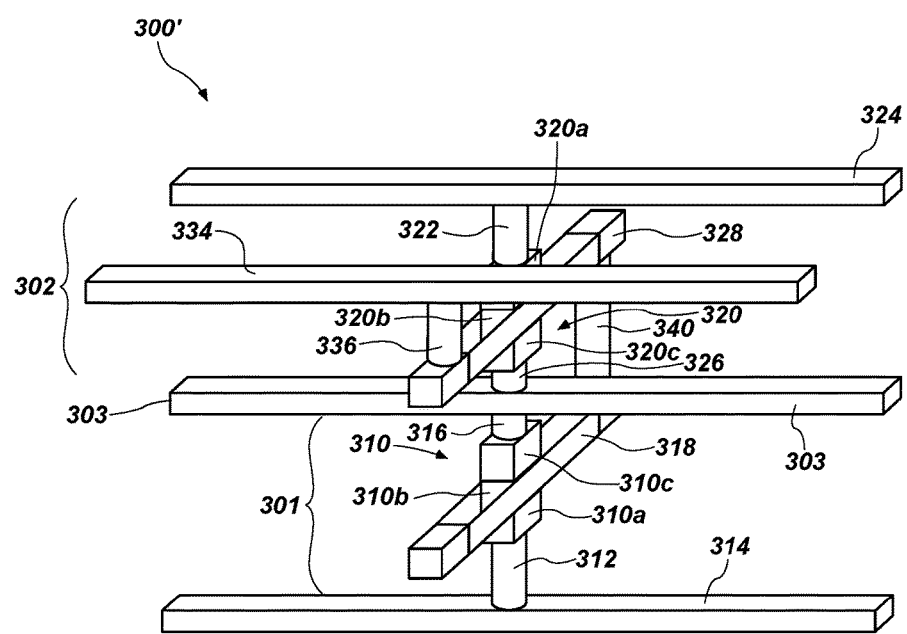
FIG. 3C is a perspective view of the CMOS inverter of FIG. 3A and FIG. 3B.
Figure 3C:
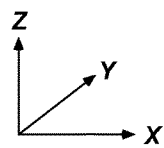

FIG. 3A is a simplified cross-sectional view of a TFT control logic level 300 including TFT CMOS circuits, in accordance with embodiments of the disclosure. FIG. 3B is a simplified cross-sectional view of the TFT control logic level taken along section line B-B of FIG. 3A. FIG. 3C is a simplified perspective view of a single CMOS TFT inverter 300', in accordance with embodiments of the disclosure. The CMOS TFT inverter 300' may comprise a portion at least one TFT control logic level (e.g., at least one of the first TFT control logic level 106A, the second TFT control logic level 108A, and the third TFT control logic level 110A).

The TFT control logic level 300 may include vertically stacked subdeck structures (e.g., levels), such as a first subdeck (e.g., sublevel) structure 301 and a second subdeck (e.g., sublevel) structure 302 over the first subdeck structure 301 arranged over a substrate 305. The substrate 305 may comprise, for example, one or more of a deck (e.g., the first deck 104 (FIG. 1), and the base control logic structure 102 (FIG. 1)). The first subdeck structure 301 may be in electrical communication with the second subdeck structure 302 via an output structure 303, as will be described herein. The first subdeck structure 301 may include vertical NMOS transistors 310 (e.g., an array of vertical NMOS transistors 310), each including a semiconductive pillar 311 including an N-type source region 310a, an N-type drain region 310c, and a P-type channel region 310b between the N-type source region 310a and the N-type drain region 310c. The N-type source region 310a and the N-type drain region 310c of the vertical NMOS transistor 310 may each individually be formed of and include at least one N-type conductivity material. As used herein, an N-type conductivity material may include, for example, polysilicon doped with at least one N-type dopant (e.g., arsenic ions, phosphorous ions, antimony ions). The P-type channel region 310b of the vertical NMOS transistor 310 may be formed of and include at least one P-type conductivity material. As used herein, a P-type conductivity material may include, for example, polysilicon doped with at least one P-type dopant (e.g., boron ions).

The second subdeck structure 302 may include vertical PMOS transistors 320 (e.g., an array of vertical PMOS transistors), each including a semiconductive pillar 321 including a P-type source region 320a, a P-type drain region 320c, and an N-type channel region 320b between the P-type source region 320a and the P-type drain region 320c. The P-type source region 320a and the P-type drain region 320c may include a P-type conductivity material, and may include the same material as the P-type channel region 310b of the vertical NMOS transistors 310. The N-type channel region 320b may include an N-type conductivity material and may include the same material as one or both of the N-type source region 310a and the N-type drain region 310c of the vertical NMOS transistors 310.

The vertical NMOS transistor 310 may exhibit any desired dimensions (e.g., channel width, channel thickness, channel length). By way of nonlimiting example, in some embodiments, the channel width (extending in the y-direction) of each of the semiconductive pillars 311 may be within a range from about 20 nm to about 200 nm and the channel thickness (extending in the x-direction) of each of the semiconductive pillars 311 may be within a range from about 10 nm to about 50 nm. In some embodiments, the channel length (extending in the z-direction) may be within a range from about 50 nm to about 200 nm. Similarly, the vertical PMOS transistors 320 may exhibit any desired dimensions (e.g., channel width, channel thickness, channel length). By way of nonlimiting example, in some embodiments, the channel width (extending in the y-direction) of each of the semiconductive pillars 311 may be within a range from about 20 nm to about 200 nm and the channel thickness (extending in the x-direction) of each of the semiconductive pillars 311 may be within a range from about 10 nm to about 50 nm. In some embodiments, the channel length (extending in the z-direction) is within a range from about 50 nm to about 200 nm. In some embodiments, the dimensions of the vertical NMOS transistors 310 are substantially the same as the dimensions of the vertical PMOS transistors 320.

In some embodiments, at least one (e.g., each of) the vertical NMOS transistors 310 of the first subdeck structure 301 may be electrically coupled to and associated with a corresponding vertical PMOS transistor 320 through the output structure 303 to form a CMOS circuit (e.g., a CMOS inverter). The vertical PMOS transistor 320 associated with a particular vertical NMOS transistor 310 may be located directly above the particular vertical NMOS transistor 310. However, the disclosure is not so limited and the vertical PMOS transistor 320 may not be located directly above the associated vertical NMOS transistor 310 and may be laterally offset therefrom.

The vertical NMOS transistors 310 may each include a source contact 312 in electrical communication with the N-type source region 310a. The source contact 312 may be in electrical communication with a ground (GND) structure 314.

The vertical NMOS transistors 310 may further include a drain contact 316 in electrical communication with the N-type drain region 310c. The drain contact 316 may provide electrical communication between the N-type drain region 310c and the output structure 303.

In some embodiments, at least some of the vertical NMOS transistors 310 may not be in electrical communication with the output structure 303. In some such embodiments, at least some of the vertical NMOS transistors 310 are electrically isolated from the output structure 303 by a dielectric material 319. In yet other embodiments, substantially all of the vertical NMOS transistors are in electrical communication with the output structure 303.

The vertical PMOS transistors 320 may each include a source contact 322 in electrical communication with the P-type source region 320a. The source contact 322 may be in electrical communication with a $V_{DD}$ structure (also referred to as a "drain supply voltage" structure) 324. Accordingly, the source contact 322 may provide electrical communication between the P-type source region 320a and the $V_{DD}$ structure 324.

In some embodiments, at least some of the vertical PMOS transistors 320 may not be in electrical communication with the $V_{DD}$ structure 324. In some such embodiments, at least some of the vertical PMOS transistors 320 may be electrically isolated from the $V_{DD}$ structure 324, such as by a dielectric material 348, which may comprise, for example, silicon dioxide, silicon nitride, a silicon oxynitride, or combinations thereof. In other embodiments, substantially all of the vertical PMOS transistors 320 are in electrical communication with the $V_{DD}$ structure 324.

The vertical PMOS transistors 320 may further include a drain contact 326 in electrical communication with the P-type drain region 320c. The drain contact 326 may provide electrical communication between the P-type drain region 320c and the output structure 303. Accordingly, each of the vertical NMOS transistors 310 may be in electrical communication with a corresponding vertical PMOS transistor 320 through corresponding drain contacts 316, 326.

With continued reference to FIG. 3A through FIG. 3C, the vertical NMOS transistors 310 may each include a gate dielectric material 317 and a gate electrode 318 over the gate dielectric material 317. The gate electrode 318 is illustrated in FIG. 3B in broken lines to show the relative location of the gate electrode 318, although it is understood that the gate electrode 318 would not be in the cross-sectional view of FIG. 3B. The gate dielectric material 317 of each vertical NMOS transistor 310 may extend over at least sidewalls of the semiconductive pillar 311 (e.g., over sidewalls of the N-type source region 310a, the P-type channel region 310b, and the N-type drain region 310c). In some embodiments, the gate dielectric material 317 extends over the sidewalls of the source contact 312 and the drain contact 316.

The gate dielectric material 317 may include electrically insulative materials, such as phosphosilicate glass, borosilicate glass, borophosphosilicate glass (BPSG), fluorosilicate glass, silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride, another gate dielectric material, a dielectric carbon nitride material (e.g., silicon carbon nitride (SiCN)), a dielectric carboxynitride material (e.g., silicon carboxynitride (SiOCN)), or combinations thereof.

The gate electrode 318 may extend over sidewalls of at least the P-type channel region 310b and may, in some embodiments, extend over at least a portion of each of the N-type source region 310a and the N-type drain region 310c. However, the disclosure is not so limited and in other embodiments, the gate electrode 318 may not extend over sidewalls of the N-type source region 310a and the N-type drain region 310c and may extend over only sidewalls of the P-type channel region 310b.

The gate electrode 318 may include an electrically conductive material. As used herein, an "electrically conductive material" may refer to one or more of a metal, such as tungsten, titanium, nickel, platinum, ruthenium, aluminum, copper, molybdenum, gold, a metal alloy, a metal-containing material (e.g., metal nitrides, metal silicides, metal carbides, metal oxides), a conductively-doped semiconductor material (e.g., conductively-doped silicon, conductively-doped germanium, conductively-doped silicon germanium, etc.), polysilicon, other materials exhibiting electrical conductivity, or combinations thereof. Electrically conductive materials may include at least one of titanium nitride (TiN), tantalum nitride (TaN), tungsten nitride (WN), titanium aluminum nitride (TiAlN), elemental titanium (Ti), elemental platinum (Pt), elemental rhodium (Rh), elemental ruthenium (Ru), elemental molybdenum (Mo), elemental iridium (Ir), iridium oxide ($IrO_x$), elemental ruthenium (Ru), ruthenium oxide ($RuO_x$), elemental tungsten (W), elemental aluminum (Al), elemental copper (Cu), elemental gold (Au), elemental silver (Ag), polysilicon, alloys thereof, or combinations thereof. In some embodiments, the gate electrode 318 comprises titanium nitride.

The gate electrode 318 may be formed to exhibit any desired dimensions (e.g., length, width, height). By way of non-limiting example, each gate electrode 318 may have a width within a range of from about 1 nm to about 30 nm (e.g., from about 5 nm to about 20 nm, or from about 5 nm to about 10 nm), and a height within a range of from about 5 nm to about 100 nm (e.g., from about 10 nm to about 50 nm, or from about 20 nm to about 30 nm).

Each of the vertical PMOS transistors 320 may include a gate dielectric material 327 and a gate electrode 328 over the gate dielectric material 327. The gate dielectric material 327 of each of the PMOS transistors 320 may extend over at least sidewalls of the semiconductive pillar 321 (e.g., over sidewalls of the P-type source region 320a, the N-type channel region 320b, and the P-type drain region 320c). In some embodiments, the gate dielectric material 327 extends over sidewalls of the source contact 322 and the drain contact 326. In yet other embodiments, the gate dielectric material 327 extends over sidewalls of only one of the source contact 322 and the drain contact 326.

The gate electrode 328 may extend over sidewalls of at least the N-type channel region 320b and may, in some embodiments, extend over at least a portion of sidewalls of each of the P-type source region 320a and the P-type drain region 320c. However, the disclosure is not so limited and in other embodiments, the gate electrode 328 may not extend over sidewalls of the P-type source region 320a and the P-type drain region 320c.

The gate dielectric material 327 and the gate electrode 328 may include the same materials described above with reference to the gate dielectric material 317 and the gate electrode 318, respectively. In some embodiments, the gate dielectric material 327 and the gate electrode 328 comprise the same material as the gate dielectric material 317 and the gate electrode 318, respectively.

In some embodiments, a gate contact 340 may electrically connect the gate electrode 318 of at least one vertical NMOS transistor 310 to the gate electrode 328 of at least one corresponding vertical PMOS transistor 320. The gate contact 340 may include an electrically conductive material, such as, for example, titanium, tungsten, copper, aluminum, gold, silver, platinum, rhodium, ruthenium, molybdenum, iridium, titanium nitride, tantalum nitride, titanium aluminum nitride, polysilicon, another conductive material, or combinations thereof. In other embodiments, at least some of the gate electrodes 318 may be electrically isolated from the gate contacts 340 by a dielectric material. In some embodiments, at least another gate contact 345 comprising an electrically conductive material may be electrically coupled to the $V_{DD}$ structure 324 and may electrically couple at least one of the gate electrodes 318, 328 to a word line driver (e.g., the word line driver 214 (FIG. 2)).

Adjacent vertical NMOS transistors 310 may be electrically isolated from each other via one or more dielectric materials 343 (FIG. 3A). Similarly, adjacent vertical PMOS transistors 320 may be electrically isolated from each other by one or more dielectric materials 344 (FIG. 3A). The vertical NMOS transistors 310 and the vertical PMOS transistors 320 may be isolated from each other by another dielectric material 342. Each of the dielectric materials 342, 343, 344 may comprise an electrically insulative material, such as, for example, silicon dioxide, silicon nitride, phosphosilicate glass, borosilicate glass, borophosphosilicate glass, another electrically insulative material, or combinations thereof.

In some embodiments, a liner material 332 may overlie sidewalls of the gate dielectric materials 317, 327 and the gate electrodes 318, 328 between adjacent vertical NMOS transistors 310 and adjacent vertical PMOS transistors 320, respectively. The liner material 332 may include, for example, silicon nitride, silicon oxide, a silicon oxynitride, or combinations thereof.

With reference to FIG. 3B, a liner material 313 may overlie sides of the vertical NMOS transistors 310 and may overlie, for example, sidewalls of the source contact 312, the N-type source region 310a, the P-type channel region 310b, the N-type drain region 310c, and the drain contact 316. In some embodiments, the liner material 313 may overlie sidewalls of the GND structure 314 and sidewalls of the output structure 303.

Similarly, a liner material 323 may overlie sidewalls of the vertical PMOS transistors 320. The liner material 323 may overlie sidewalls of the P-type drain region 320c, the N-type channel region 320b, and the P-type source region 320a. In some embodiments, the liner material 323 overlies sidewalls of the source contact 322.

With reference to FIG. 3C, an input structure 334 may be electrically connected to at least one of the gate electrode 318 and the gate electrode 328, such as through a contact structure 336.

Each of the GND structure 314, the $V_{DD}$ structure 324, the output structure 303, and the input structure 334 of the TFT control logic level 300 may exhibit conventional configurations (e.g., conventional dimensions, conventional shapes, conventional conductive material compositions, conventional material distributions, conventional orientations, conventional arrangements), which are not described in detail herein. Each of the GND structure 314, $V_{DD}$ structure 324, the output structure 303, and the input structure 334 may comprise a suitable electrically conductive material.

Although FIG. 3A through FIG. 3C illustrate that the second subdeck structure 302 including the vertical PMOS transistors 320 is directly above the first subdeck structure 301 including vertical NMOS transistors 310, the disclosure is not so limited. In other embodiments, the first subdeck structure 301 overlies the second subdeck structure 302 such that the vertical NMOS transistors 310 overlies vertical PMOS transistors 320. In some such embodiments, a location of the $V_{DD}$ structure 324 and a location of the GND structure 314 may be positioned at suitable locations, as would be understood by one of ordinary skill in the art.

Accordingly, a TFT control logic level of a semiconductor device may include a first subdeck structure of vertical NMOS transistors and vertical PMOS transistors and a second deck structure of the other of vertical NMOS transistors and vertical PMOS transistors overlying the first subdeck structure. The first subdeck structure and the second subdeck structure may be arranged to comprise a plurality of CMOS circuits, such as a plurality of CMOS inverters.

FIG. 4 through FIG. 12B are simplified perspective views of additional TFT CMOS devices according to embodiments of the disclosure that may be included in the TFT control logic levels (e.g., the TFT control logic level 200 shown in FIG. 2; one or more of the first TFT control logic level 106A, the second TFT control logic level 108A, and the third TFT control logic level 110A shown in FIG. 1) of the disclosure. Throughout FIG. 4 through FIG. 12B and the written description associated therewith, functionally similar features (e.g., structures) are referred to with similar reference numerals incremented by 100. To avoid repetition, not all features shown in FIG. 4 through FIG. 12B are described in detail herein. Rather, unless described otherwise below, throughout FIG. 4 and FIG. 12B (and the written description associated therewith), a feature designated by a reference numeral that is a 100 increment of the reference numeral of a previously-described feature (whether the previously-described feature is first described before the present paragraph, or is first described after the present paragraph) will be understood to be substantially similar to the previously-described feature.

Figure 4:
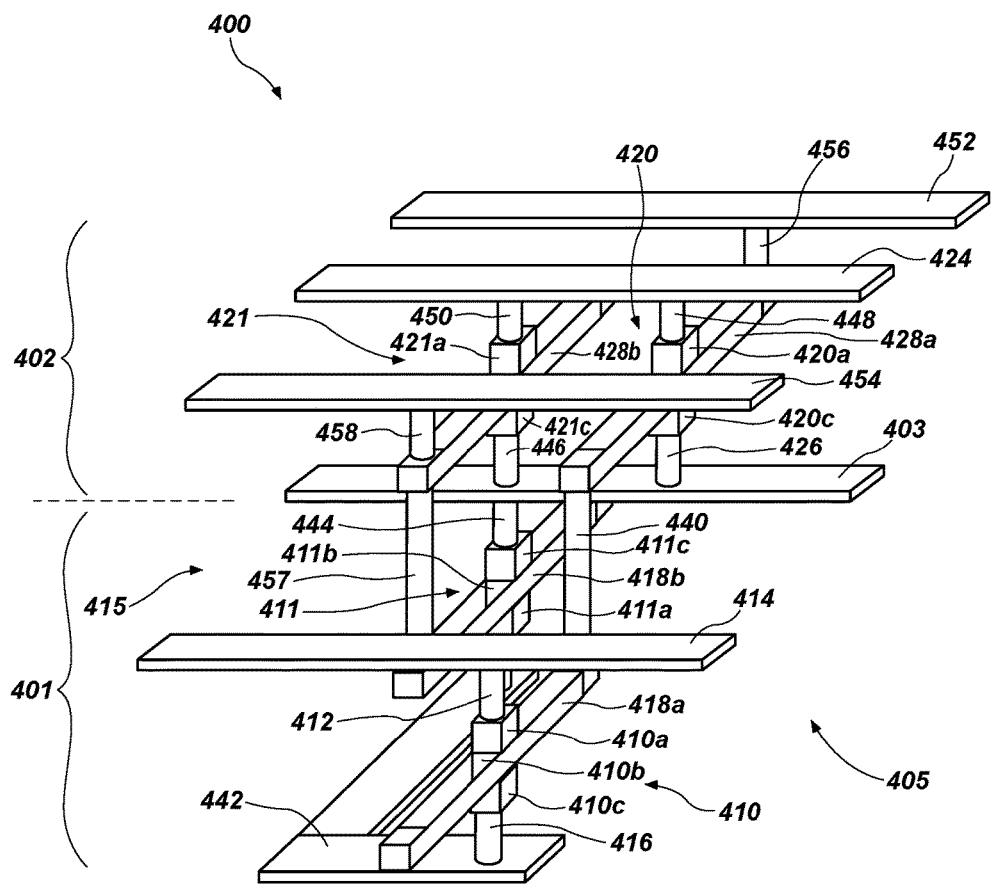
FIG. 4 is a simplified perspective view of a two-input negative-AND (NAND) circuit, in accordance with embodiments of the disclosure.

FIG. 4 is a simplified perspective view of a two-input NAND circuit 400, in accordance with embodiments of the disclosure. The two-input NAND circuit 400 includes a first subdeck structure 401 and a second subdeck structure 402 overlying the first subdeck structure 401. The two-input NAND circuit 400 may include a first CMOS circuit 405 including a first vertical NMOS transistor 410 and a first vertical PMOS transistor 420 associated with the first vertical NMOS transistor 410. A second CMOS circuit 415 of the two-input NAND circuit 400 may include a second vertical NMOS transistor 411 and a second vertical PMOS transistor 421 associated with the second vertical NMOS transistor 411.

The first subdeck structure 401 may include the first vertical NMOS transistor 410 and the second vertical NMOS transistor 411. The first vertical NMOS transistor 410 may include a semiconductive pillar comprising an N-type source region 410a, an N-type drain region 410c, and a P-type channel region 410b between the N-type source region 410a and the N-type drain region 410c. Similarly, the second vertical NMOS transistor 411 may include an N-type source region 411a, an N-type drain region 411c, and a P-type channel region 411b between the N-type source region 411a and the N-type drain region 411c. Each of the N-type regions and the P-type regions may include the same materials described above with reference to the respective N-type regions (e.g., the N-type source region 310a, the N-type drain region 310c, and the N-type channel region 320b) and the P-type regions (e.g., the P-type source region 320a, the P-type drain region 320c, and the P-type channel region 310b) described above with reference to FIG. 3A through FIG. 3C).

The first vertical NMOS transistor 410 may include a gate electrode 418a extending over at least sidewalls of the P-type channel region 410b. The second vertical NMOS transistor 411 may include a gate electrode 418b extending over at least sidewalls of the P-type channel region 411b. The gate electrodes 418a, 418b may include a conductive material, as described above with reference to the gate electrodes 318, 328 (FIG. 3A through FIG. 3C). Although not illustrated in FIG. 4 for clarity, a gate dielectric material may be disposed between the gate electrode 418a and the first vertical NMOS transistors 410 and a gate dielectric material may be disposed between the gate electrode 418b and the second vertical NMOS transistor 411.

The second subdeck structure 402 may include the first vertical PMOS transistor 420 and the second vertical PMOS transistor 421. The first vertical PMOS transistor 420 may include a P-type source region 420a, a P-type drain region 420c, and an N-type channel region (not visible in the view of FIG. 4) between the P-type source region 420a and the P-type drain region 420c. Similarly, the second vertical PMOS transistor 421 may include a P-type source region 421a, a P-type drain region 421c, and an N-type channel region (not visible in the view of FIG. 4) between the P-type source region 421a and the P-type drain region 421c.

The first vertical PMOS transistor 420 may include a gate electrode 428a disposed over at least sidewalls of the N-type channel region thereof. The second vertical PMOS transistor 421 may include a gate electrode 428b disposed over at least sidewalls of the N-type channel region thereof. The gate electrodes 428a, 428b may include a conductive material, as described above with reference to the gate electrodes 418a, 428b. Although not illustrated in FIG. 4 for clarity, a gate dielectric material may be disposed between the gate electrode 428a and the first vertical PMOS transistor 420 and a gate dielectric material may be disposed between the gate electrode 428b and the second vertical PMOS transistor 421.

The first vertical NMOS transistor 410 may be electrically connected to a GND structure 414 via a source contact 412. The source contact 412 may include a suitable electrically conductive material for providing an electrical connection between the GND structure 414 and the N-type source region 410a. A drain contact 416 may be in electrical communication with the N-type drain region 410c of the first vertical NMOS transistor 410 to electrically connect the N-type drain region 410c to an electrically conductive interconnect structure 442.

The electrically conductive interconnect structure 442 may be in electrical communication with a source contact (not shown in the view of FIG. 4) of the second vertical NMOS transistor 411 to electrically connect the N-type source region 411a of the second vertical NMOS transistor 411 to the electrically conductive interconnect structure 442 and the first vertical NMOS transistor 410.

The N-type drain region 411c of the second vertical NMOS transistor 411 may be in electrical communication with the output structure 403 via a drain contact 444. The drain contact 444 may include a suitable electrically conductive material for providing electrical communication between the N-type drain region 411c and the output structure 403.

The P-type drain region 420c and the P-type drain region 421c of the respective first vertical PMOS transistor 420 and the second vertical PMOS transistor 421 may be in electrical communication with the output structure 403 via a respective drain contact 426 and drain contact 446.

The P-type source region 420a and the P-type source region 421a of the respective first vertical PMOS transistor 420 and the second vertical PMOS transistor 421 may be in electrical communication with a $V_{DD}$ structure 424 via a respective source contact 448 and source contact 450. Each of the source contacts 448, 450 may include a suitable electrically conductive material for providing an electrical connection between the $V_{DD}$ structure 424 and each of the P-type source region 420a and the P-type source region 421a.

The gate electrode 428a of the first vertical PMOS transistor 420 may be electrically connected to a first input structure 452 via a contact structure 456. The gate electrode 428a of the first vertical PMOS transistor 420 may further be in electrical communication with the gate electrode 418a of the first vertical NMOS transistor 410 via a gate contact 440.

The gate electrode 428b of the second vertical PMOS transistor 421 may be electrically connected to a second input structure 454 via a contact structure 458. The gate electrode 428b may further be in electrical communication with the gate electrode 418b of the second vertical NMOS transistor 411 via a gate contact 457.

The gate contact 440 and the gate contact 457 may comprise suitable electrically conductive materials for forming electrical connections between the respective gate electrode 418a and the gate electrode 428a and between the gate electrode 418b and the gate electrode 428b. By way of nonlimiting example, the gate contact 440 and the gate contact 457 may comprise tungsten, tungsten nitride, titanium, titanium nitride, aluminum, copper, ruthenium, molybdenum, silver, gold, polysilicon, another conductive material, or combinations thereof.

Each of the GND structure 414, the output structure 403, the interconnect structure 442, the first input structure 452, the second input structure 454, and the $V_{DD}$ structure 424 may exhibit conventional configurations (e.g., conventional dimensions, conventional shapes, conventional conductive material compositions, conventional material distributions, conventional orientations, conventional arrangements), which are not described in detail herein, which are not described in detail herein. Each of the GND structure 414, the output structure 403, the interconnect structure 442, the first input structure 452, the second input structure 454, and the $V_{DD}$ structure 424 may comprise a suitable electrically conductive material.

Accordingly, the two-input NAND circuit 400 may include a first subdeck structure 401 including NMOS transistors and a second subdeck structure 402 including PMOS transistors disposed over the first subdeck structure 401. For example, the two-input NAND circuit 400 may include the first vertical PMOS transistor 420 and the second vertical PMOS transistor 421 over the first vertical NMOS transistor 410 and the second vertical NMOS transistor 411. The first subdeck structure 401 and the second subdeck structure 402 may include a plurality of two-input NAND circuits 400. Accordingly, in some embodiments, the two-input NAND circuit 400 may comprise a TFT control logic level 106A, 108A, 110A having a dual deck structure.

Although FIG. 4 has been described and illustrated as including only a single two-input NAND circuit 400, the disclosure is not so limited. It will be understood that a TFT control logic level may comprise a plurality of two-input NAND circuits 400, wherein the TFT control logic level comprises a first subdeck structure of one of NMOS transistors and PMOS transistors and a second subdeck structure of the other of NMOS transistors and PMOS transistors.

Figure 5:
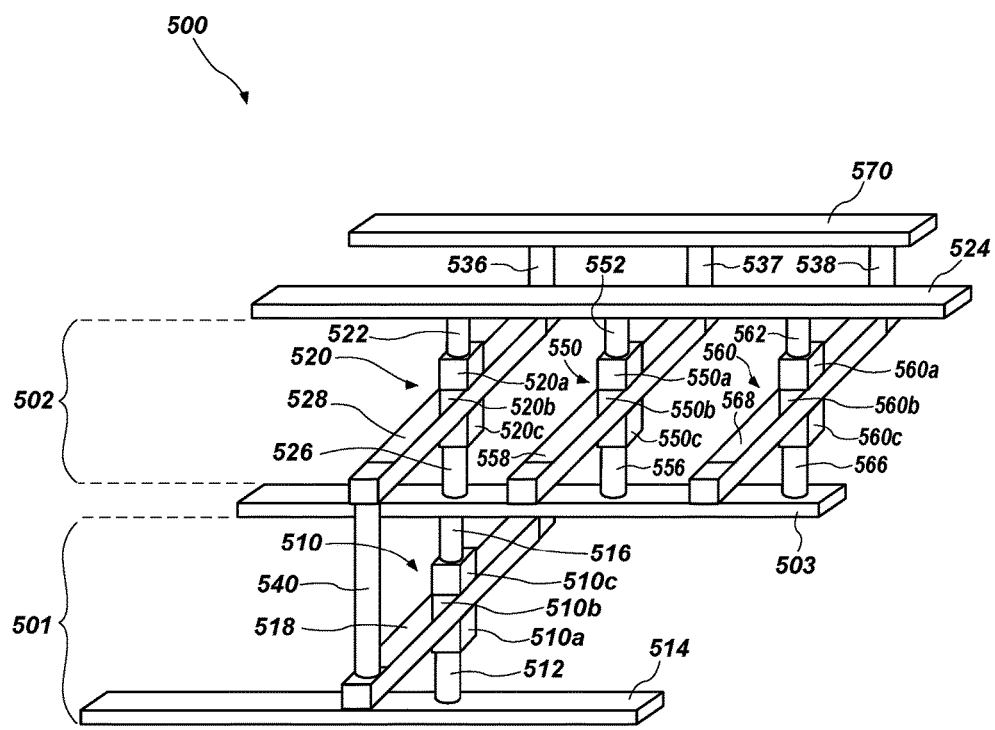
FIG. 5 is a simplified perspective view of a balanced CMOS inverter, in accordance with embodiments of the disclosure.
Figure 5:
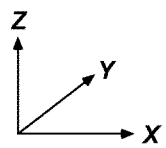

FIG. 5 is a simplified perspective view of a balanced CMOS inverter 500, in accordance with embodiments of the disclosure. The balanced CMOS inverter 500 includes a first subdeck structure 501 and a second subdeck structure 502 overlying the first subdeck structure 501.

As shown in FIG. 5, the balanced CMOS inverter 500 may be similar to the CMOS inverter 300' previously described with reference to FIG. 3C, except that the balanced CMOS inverter 500 includes a CMOS circuit including a single vertical NMOS transistor 510 and multiple (e.g., more than one) vertical PMOS transistors, such as a first vertical PMOS transistor 520, a second vertical PMOS transistor 550, and a third vertical PMOS transistor 560. Multiple vertical PMOS transistors 520, 550, 560 may be employed to balance the driving strengths of the different transistors (e.g., the vertical NMOS transistor 510, the first vertical PMOS transistor 520, the second vertical PMOS transistor 550, and the third vertical PMOS transistor 560) of the CMOS circuit so as to maximize noise margins and obtain symmetrical characteristics. As depicted in FIG. 5, in some embodiments, the CMOS circuit includes a single (e.g., only one) vertical NMOS transistor 510, and three (3) vertical PMOS transistors. In additional embodiments, the CMOS circuit includes a different number of vertical PMOS transistors. For example, the CMOS circuit may include a single (e.g., only one) vertical NMOS transistor 510 and two (2) vertical PMOS transistors.

The first subdeck structure 501 includes the vertical NMOS transistor 510. The vertical NMOS transistor 510 may include a semiconductive pillar comprising an N-type source region 510a, an N-type drain region 510c, and a P-type channel region 510b between the N-type source region 510a and the N-type drain region 510c. The N-type source region 510a and the N-type drain region 510c may include the same materials described above with reference to the N-type regions (e.g., the N-type source region 310a, the N-type drain region 310c, and the N-type channel region 320b) and the P-type channel region 510b may include the same material described above with reference to the P-type regions (e.g., the P-type channel region 310b, the P-type source region 320a, and the P-type drain region 320c) with reference to FIG. 3A through FIG. 3C.

The vertical NMOS transistor 510 may include a gate electrode 518 extending over at least sidewalls of the P-type channel region 510b. The gate electrode 518 may include an electrically conductive material, as described above with reference to the gate electrode 318 (FIG. 3A through FIG. 3C). Although not illustrated in FIG. 5 for clarity, a gate dielectric material may be disposed between the gate electrode 518 and the vertical NMOS transistor 510.

The second subdeck structure 502 may include the first vertical PMOS transistor 520, the second vertical PMOS transistor 550, and the third vertical PMOS transistor 560. The first vertical PMOS transistor 520 may include a P-type source region 520a, a P-type drain region 520c, and an N-type channel region 520b between the P-type source region 520a and the P-type drain region 520c. Similarly, the second vertical PMOS transistor 550 may include a P-type source region 550a, a P-type drain region 550c, and an N-type channel region 550b between the P-type source region 550a and the P-type drain region 550c. The third vertical PMOS transistor 560 may include a P-type source region 560a, a P-type drain region 560c, and an N-type channel region 560b between the P-type source region 560a and the P-type drain region 560c. Each of the N-type regions and the P-type regions may include the same materials described above with reference to the N-type regions (e.g., the N-type source region 310a, the N-type drain region 310c, and the N-type channel region 320b) and the P-type regions (e.g., the P-type source region 320a, the P-type drain region 320c, and the P-type channel region 310b) described above with reference to FIG. 3A through FIG. 3C).

The vertical NMOS transistor 510 may be electrically connected to a GND structure 514 via a source contact 512. The source contact 512 may include a suitable electrically conductive material for providing an electrical connection between the GND structure 514 and the N-type source region 510a. A drain contact 516 comprising a suitable electrically conductive material may be in electrical communication with the N-type drain region 510c of the vertical NMOS transistor 510 to electrically connect the N-type drain region 510c to an output structure 503.

The first vertical PMOS transistor 520 may include a gate electrode 528 disposed over at least sidewalls of the N-type channel region 520b thereof. The second vertical PMOS transistor 550 may include a gate electrode 558 disposed over at least sidewalls of the N-type channel region 550b thereof. The third vertical PMOS transistor 560 may include a gate electrode 568 disposed over at least sidewalls of the N-type channel region 560b thereof. The gate electrodes 528, 558, 568 may include an electrically conductive material, as described above with reference to the gate electrode 328 (FIG. 3A through FIG. 3C). Although not illustrated in FIG. 5 for clarity, a gate dielectric material may be disposed between the gate electrode 528 and the first vertical PMOS transistor 520, a gate dielectric material may be disposed between the gate electrode 558 and the second vertical PMOS transistor 550, and a gate dielectric material may be disposed between the gate electrode 568 and the third vertical PMOS transistor 560.

The P-type drain region 520c, 550c, 560c of each of the respective first vertical PMOS transistor 520, the second vertical PMOS transistor 550, and the third vertical PMOS transistor 560 may be in electrical communication with the output structure 503 via a respective drain contact 516, 526, 566, each of which may comprise a suitable electrically conductive material.

The P-type source regions 520a, 550a, 560a of the respective first vertical PMOS transistor 520, the second vertical PMOS transistor 550, and the third vertical PMOS transistor 560 may be in electrical communication with a $V_{DD}$ structure 524 via a respective source contact 522, 552, 562. Each of the source contacts 522, 552, 562 may include a suitable electrically conductive material for providing an electrical connection between the $V_{DD}$ structure 524 and each of the P-type source regions 520a, 550a, 560a.

The gate electrode 528 of the first vertical PMOS transistor 520 may be electrically connected to an input structure 570 via contact structure 536. Similarly, the gate electrode 558 of the second vertical PMOS transistor 550 and the gate electrode 568 of the third vertical PMOS transistor 560 may be in electrical communication with the input structure 570 via respective contact structures 537, 538. Each of the contact structures 536, 537, 538 may comprise an electrically conductive material.

The gate electrode 528 of the first vertical PMOS transistor 520 may be electrically connected to the gate electrode 518 of the vertical NMOS transistor 510 via a gate contact 540. Since the gate electrode 528 is electrically connected to the input structure 570 and the input structure 570 is electrically connected to the gate electrodes 558, 556, each of the gate electrodes 558, 568 are also electrically connected to the gate electrode 518. The gate contact 540 may comprise a suitable electrically conductive material for establishing electrical communication between the gate electrode 518 and the gate electrode 528. By way of non-limiting example, the gate contact 540 may comprise tungsten, tungsten nitride, titanium, titanium nitride, aluminum, copper, ruthenium, molybdenum, silver, gold, polysilicon, another conductive material, or combinations thereof.

Each of the GND structure 514, the output structure 503, the input structure 570, and the $V_{DD}$ structure 524 may comprise a suitable electrically conductive material and may exhibit conventional configurations (e.g., conventional dimensions, conventional shapes, conventional conductive material compositions, conventional material distributions, conventional orientations, conventional arrangements), which are not described in detail herein, which are not described in detail herein.

Accordingly, the balanced CMOS inverter 500 includes a vertical NMOS transistor 510 and more than one vertical PMOS transistors 520, 550, 560. The vertical NMOS transistor 510 may be located on a separate subdeck than each of the vertical PMOS transistors 520, 550, 560.

Figure 6:
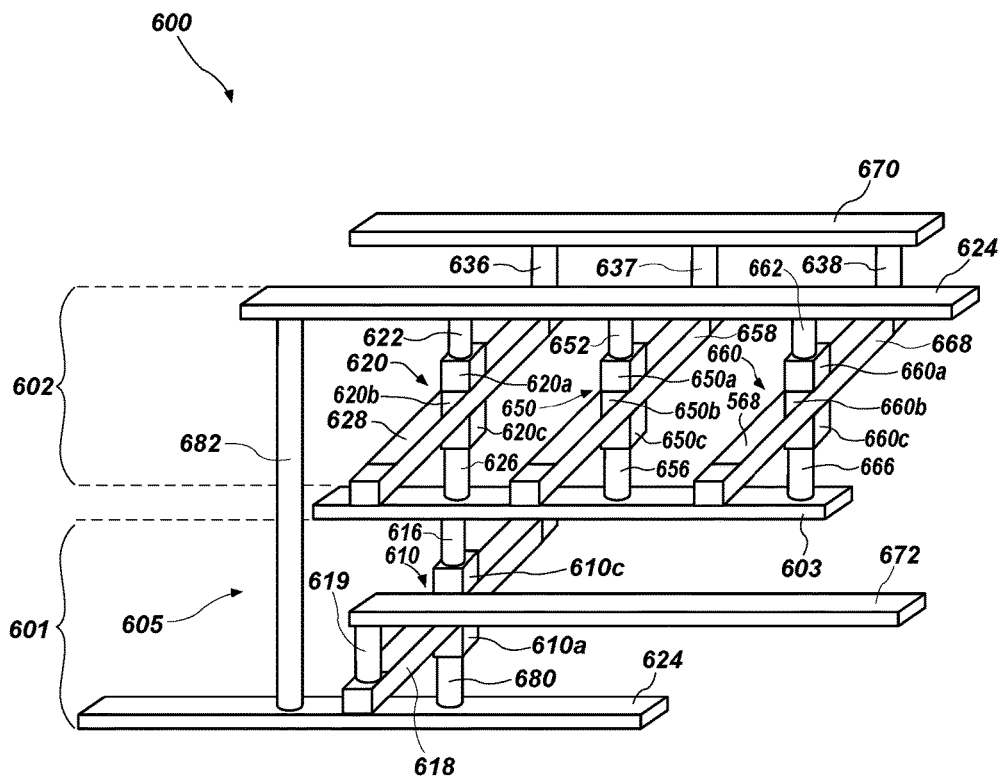
FIG. 6 is a simplified perspective view of a CMOS transmission pass gate, in accordance with embodiments of the disclosure.
Figure 6:
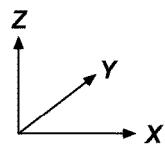

FIG. 6 is a simplified perspective view of a CMOS transmission pass gate 600, in accordance with embodiments of the disclosure. The CMOS transmission pass gate 600 includes a CMOS circuit 605, an output structure 603, an input structure 624, a first gate input structure 672, and a second gate input structure 670.

The CMOS transmission pass gate 600 may include a first subdeck structure 601 and a second subdeck structure 602 disposed vertically over the first subdeck structure 601. The first subdeck structure 601 may include a vertical NMOS transistor 610 and the second subdeck structure 602 may include multiple (e.g., more than one) vertical PMOS transistors, such as a first vertical PMOS transistor 620, a second vertical PMOS transistor 650, and a third vertical PMOS transistor 660. Accordingly, the CMOS circuit 605 of the CMOS transmission pass gate 600 may include the vertical NMOS transistor 610 in the first subdeck structure 601 and multiple vertical PMOS transistors in the second subdeck structure 602.

The multiple vertical PMOS transistors 620, 650, 660 may be employed to balance the driving strengths of the different transistors (e.g., the vertical NMOS transistor 610, the first vertical PMOS transistor 620, the second vertical PMOS transistor 650, and the third vertical PMOS transistor 660) of the CMOS circuit 605 so as to maximize noise margins and obtain symmetrical characteristics. Although FIG. 6 illustrates that the CMOS circuit 605 includes a single vertical NMOS transistor 610 and three vertical PMOS transistors, the disclosure is not so limited. In other embodiments, the CMOS circuit 605 includes a different number of vertical PMOS transistors, such as, for example, a single vertical PMOS transistor or two vertical PMOS transistors.

The vertical NMOS transistor 610 of the CMOS circuit 605 may include an N-type source region 610a, an N-type drain region 610c, and a P-type channel region (not illustrated in the view of FIG. 6) between the N-type source region 610a and the N-type drain region 610c. In addition, each of the first vertical PMOS transistor 620, the second vertical PMOS transistor 650, and the third vertical PMOS transistor 660 individually include a P-type source region 620a, 650a, 660a, a P-type drain region 620c, 650c, 660c, and an N-type channel region 620b, 650b, 660b between a respective P-type drain region and a P-type source region.

The vertical NMOS transistor 610 may include a gate electrode 618 disposed around at least sides of the P-type channel region. The gate electrode 618 may be in electrical communication with the first gate input structure 672 via a gate contact 619, which may comprise a suitable electrically conductive material.

The first vertical PMOS transistor 620 may include a gate electrode 628 disposed around at least sides of the N-type channel region 620b, the second vertical PMOS transistor 650 may include a gate electrode 658 disposed around at least sides of the N-type channel region 650b, and the third vertical PMOS transistor 660 may include a gate electrode 668 disposed around at least sides of the N-type channel region 660b. In some embodiments, each of the gate electrodes 628, 658, 668 are vertically aligned with each other. Each of the gate electrodes 628, 658, 668 may be in electrical communication with the second gate input structure 670 via a respective gate contact, such as a respective first gate contact 636, a second gate contact 637, and a third gate contact 638, each of which may comprise a suitable electrically conductive material.

The input structure 624 may be in electrical communication with each of the vertical NMOS transistor 610, the first vertical PMOS transistor 620, the second vertical PMOS transistor 650, and the third vertical PMOS transistor 660. By way of nonlimiting example, the input structure 624 may include a first portion in electrical communication with the vertical NMOS transistor 610 through an electrically conductive source contact 680. The first portion of the input structure 624 may be in electrical communication with a second portion of the input structure 624 through an electrically conductive contact structure 682. The second portion may be located in the second subdeck structure 602 and may be in electrical communication with each of the first vertical PMOS transistor 620, the second vertical PMOS transistor 650, and the third vertical PMOS transistor 660 through a respective source contact 622, source contact 652, and source contact 662, each of which may comprise an electrically conductive material.

The output structure 603 may be in electrical communication with each of the vertical NMOS transistor 610, the first vertical PMOS transistor 620, the second vertical PMOS transistor 650, and the third vertical PMOS transistor 660. By way of nonlimiting example, the output structure 603 may be in electrical communication with the vertical NMOS transistor 610 through a drain contact 616. The output structure 603 may in electrical communication with the first vertical PMOS transistor 620 through a drain contact 626, with the second vertical PMOS transistor 650 through a drain contact 656, and with the third vertical PMOS transistor 660 through a drain contact 666. Each of the drain contacts 616, 626, 656, 666 may comprise an electrically conductive material.

The output structure 603, the input structure 624, the first gate input structure 672, and the second gate input structure 670 of the CMOS transmission pass gate 600 may exhibit conventional configurations (e.g., conventional dimensions, conventional shapes, conventional conductive material compositions, conventional material distributions, conventional orientations, conventional arrangements), which are not described in detail herein. Each of the output structure 603, the input structure 624, the first gate input structure 672, and the second gate input structure 670 may comprise a suitable electrically conductive material.

Figure 7:
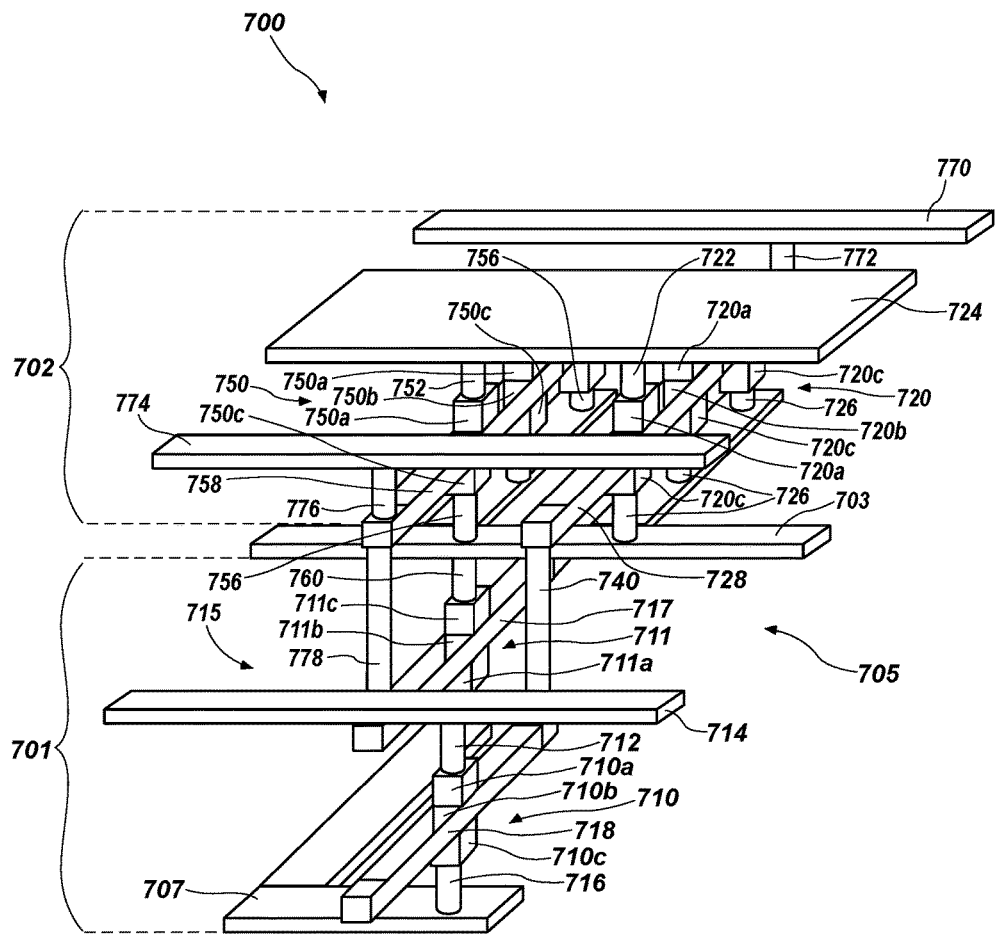
FIG. 7 is a simplified perspective view of a balanced two-input NAND circuit, in accordance with embodiments of the disclosure.

FIG. 7 is a simplified perspective view of a balanced two-input NAND circuit 700, in accordance with embodiments of the disclosure. The balanced two-input NAND circuit 700 includes a CMOS circuit 705, an additional CMOS circuit 715, a GND structure 714, a $V_{DD}$ structure 724, an interconnect structure 707, an output structure 703, a first input structure 770, and a second input structure 772.

As shown in FIG. 7, the balanced two-input NAND circuit 700 includes a first subdeck structure 701 and a second subdeck structure 702 overlying the first subdeck structure 701.

The balanced two-input NAND circuit 700 may be similar to the two-input NAND circuit 400 described above with reference to FIG. 4, except that the CMOS circuit 705 includes a single vertical NMOS transistor 710 and a first set of vertical PMOS transistors 720 including multiple (e.g., more than one) vertical PMOS transistors, and the second CMOS circuit 715 may include a single vertical NMOS transistor 711 and a second set of vertical PMOS transistors 750 including multiple (e.g., more than one) vertical PMOS transistors 750. In some embodiments, the CMOS circuit 705 includes one vertical NMOS transistor 710 and three vertical PMOS transistors 720 and the CMOS circuit 715 includes one vertical NMOS transistor 711 and three vertical PMOS transistors 750. In additional embodiments, the CMOS circuit 705 includes a different number of vertical PMOS transistors 720 and/or the CMOS circuit 715 includes a different number of additional PMOS transistors 750. For example, the CMOS circuit 705 may include one vertical NMOS transistor 710 and two (2) vertical PMOS transistors 720, and/or the CMOS circuit 715 may include one vertical NMOS transistor 711 and two (2) vertical PMOS transistors 750.

The vertical NMOS transistor 710 of the CMOS circuit 705 includes an N-type source region 710a, an N-type drain region 710c, and a P-type channel region 710b between the N-type source region 710a and the N-type drain region 710c. In addition, each of the vertical PMOS transistors 720 of the CMOS circuit 705 includes a P-type source region 720a, a P-type drain region 720c, and an N-type channel region 720b between the P-type source region 720a and the P-type drain region 720c.

The vertical NMOS transistor 711 of the CMOS circuit 715 includes an N-type source region 711a, an N-type drain region 711c, and a P-type channel region 711b between the N-type source region 711a and the N-type drain region 711c. In addition, each of the vertical PMOS transistors 750 of the CMOS circuit 715 includes a P-type source region 750a, a P-type drain region 750c, and an N-type channel region 750b between the P-type source region 750a and the P-type drain region 750c.

The vertical NMOS transistor 710 may further include a gate electrode 718 disposed around at least sides of the P-type channel region 710b. The vertical NMOS transistor 711 may further include a gate electrode 717 disposed around at least sides of the P-type channel region 711b.

A gate electrode 728 may extend along and be disposed around at least sides of the P-type channel region 720b of each of the vertical PMOS transistors 720. The gate electrode 728 may be shared between each of the vertical PMOS transistors 720. Similarly, a gate electrode 758 may extend along and be disposed around at least sides of the P-type channel region 750b of each of the vertical PMOS transistors 750 and may be shared between each of the vertical PMOS transistors 750.

The vertical NMOS transistor 710 may be in electrical communication with the GND structure 714 through a source contact 712. The vertical NMOS transistor 710 may further be in electrical communication with the interconnect structure 707 through a drain contact 716. The interconnect structure 707 may be in electrical communication with the vertical NMOS transistor 711 of the CMOS circuit 715 through a source contact (not shown in the view illustrated in FIG. 7) electrically connected to the N-type source region 711a.

The vertical NMOS transistor 711 may be in electrical communication with the output structure 703 through a drain contact 760. The output structure 703 may further be in electrical communication with each of the vertical PMOS transistors 720 and the vertical PMOS transistors 750 through respective drain contacts 726, 756 electrically connected to the P-type drain regions 720c, 750c of the respective vertical PMOS transistors 720 and the vertical PMOS transistors 750. Each of the drain contacts 760, 726, 756 may comprise an electrically conductive material.

The vertical PMOS transistors 720 and the vertical PMOS transistors 750 may be in electrical communication with the $V_{DD}$ structure 724 through respective source contacts 722 electrically coupled to the P-type source region 720a of each of the vertical PMOS transistors 720 and through respective source contacts 752 electrically coupled to the P-type source region 750a of each of the vertical PMOS transistors 750. Each of the source contacts 722, 752 may comprise an electrically conductive material.

The gate electrode 728 of the vertical PMOS transistors 720 may be in electrical communication with the first input structure 770 through a gate contact 776 comprising an electrically conductive material. The gate electrode 728 may further be in electrical communication with the gate electrode 718 of the vertical NMOS transistor 710 through a gate contact 740 comprising an electrically conductive material.

The gate electrode 758 of the vertical PMOS transistors 750 may be in electrical communication with the second input structure 772 through a gate contact 776 comprising an electrically conductive material. The gate electrode 758 may further be in electrical communication with the gate electrode 717 of the vertical NMOS transistors 711 via a gate contact comprising an electrically conductive material 778 extending between the gate electrode 758 and the gate electrode 717.

The GND structure 714, the $V_{DD}$ structure 724, the interconnect structure 707, the output structure 703, the first input structure 770, and the second input structure 772 of the balanced two-input NAND circuit 700 may exhibit conventional configurations (e.g., conventional dimensions, conventional shapes, conventional conductive material compositions, conventional material distributions, conventional orientations, conventional arrangements), which are not described in detail herein. Each of the GND structure 714, the $V_{DD}$ structure 724, the interconnect structure 707, the output structure 703, the first input structure 770, and the second input structure 772 may comprise a suitable electrically conductive material.

Figure 8A:
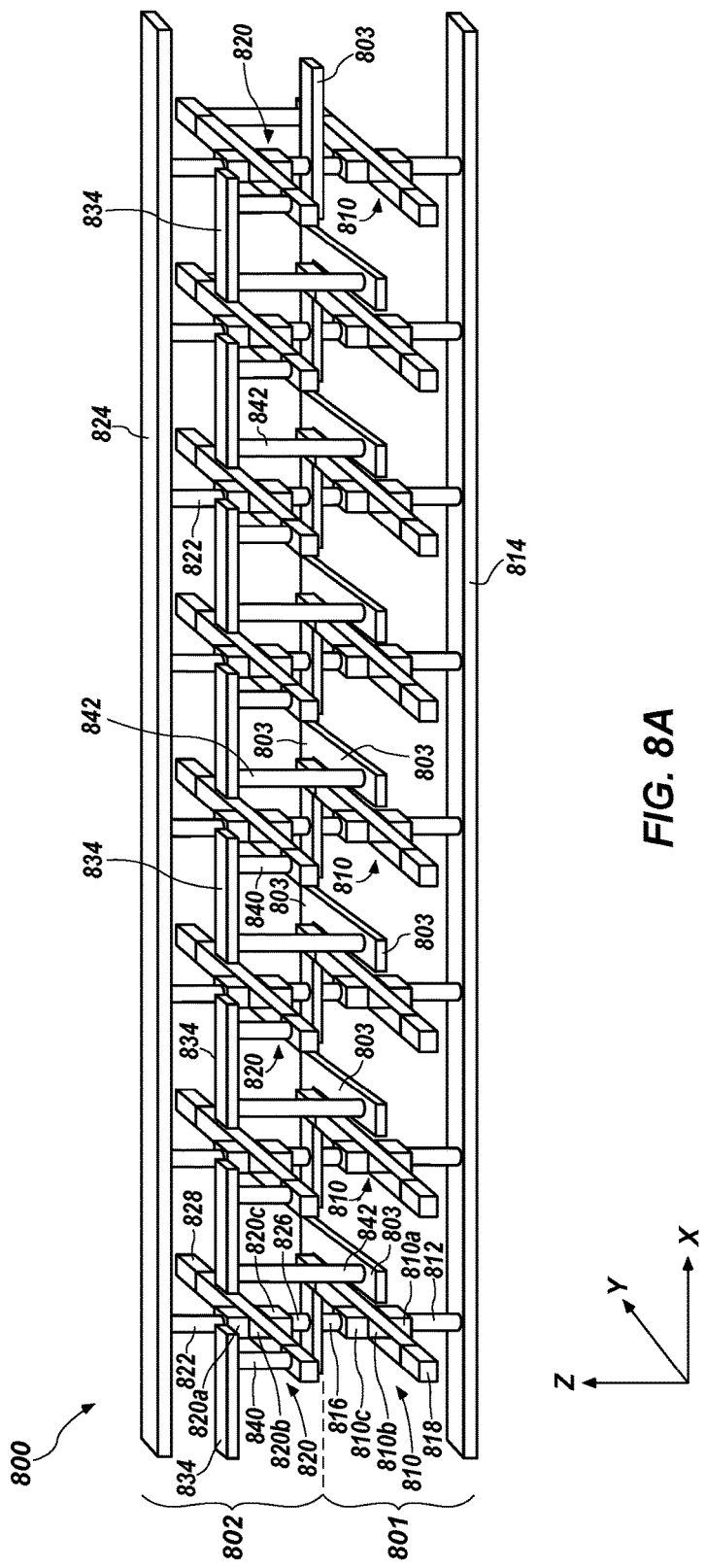
FIG. 8A is a simplified perspective view of a ring oscillator in accordance with embodiments of the disclosure.

FIG. 8A is a simplified perspective view of a ring oscillator 800, in accordance with embodiments of the disclosure. The ring oscillator 800 may include a first subdeck structure 801 comprising a plurality of NMOS transistors 810 and a second subdeck structure 802 comprising a plurality of PMOS transistors 820 overlying the first subdeck structure 801. The ring oscillator 800 includes a GND structure 814, an input structure 834, a $V_{DD}$ structure 824, and an output structure 803. The ring oscillator 800 may include adjacent sets of an NMOS transistor 810 and a corresponding PMOS transistor 820 overlying the NMOS transistor 810.

The first subdeck structure 801 may include a plurality of NMOS transistors 810. Each NMOS transistor 810 may include an N-type source region 810a, an N-type drain region 810c, and a P-type channel region 810b between the N-type source region 810a and the N-type drain region 810c. The N-type source region 810a may be in electrical communication with the GND structure 814 via a source contact 812 comprising an electrically conductive material. The N-type drain region 810c may be in electrical communication with the output structure 803 via a drain contact 816 comprising an electrically conductive material.

The PMOS transistors 820 may each comprise a P-type source region 820a, a P-type drain region 820c, and an N-type channel region 820b between the P-type source region 820a and the P-type drain region 820c. The N-type drain region 820c may be in electrical communication with the output structure 803 through a drain contact 826. The P-type source region 820a may be in electrical communication with the $V_{DD}$ structure 824 via a source contact 822.

The NMOS transistors 810 may each include a gate electrode 818 disposed around at least sidewalls of the P-type channel region 810b. Although not illustrated for clarity, a gate dielectric material may be disposed between the each gate electrode 818 and each respective vertical NMOS transistor 810. The PMOS transistors 820 may each include a gate electrode 828 disposed around at least sidewalls of the N-type channel region 820b. Although not illustrated for clarity, a gate dielectric material may be disposed between the each gate electrode 828 and each respective vertical PMOS transistor 820.

The gate electrode 828 of each vertical PMOS transistor 820 may be in electrical communication with the input structure 834 through a gate contact 840 comprising an electrically conductive material. The output structure 803 of one set of a vertical NMOS transistor 810 and a vertical PMOS transistor 820 may be in electrical communication with an input structure 834 of an adjacent set of a vertical NMOS transistor 810 and a vertical PMOS transistor 820 through a contact structure 842.

The gate electrode 828 of each vertical PMOS transistor 820 may be in electrical communication with a gate electrode 818 of a respective vertical NMOS transistor 810 through a gate contact structure (not illustrated in the view of FIG. 8A).

Figure 8B:
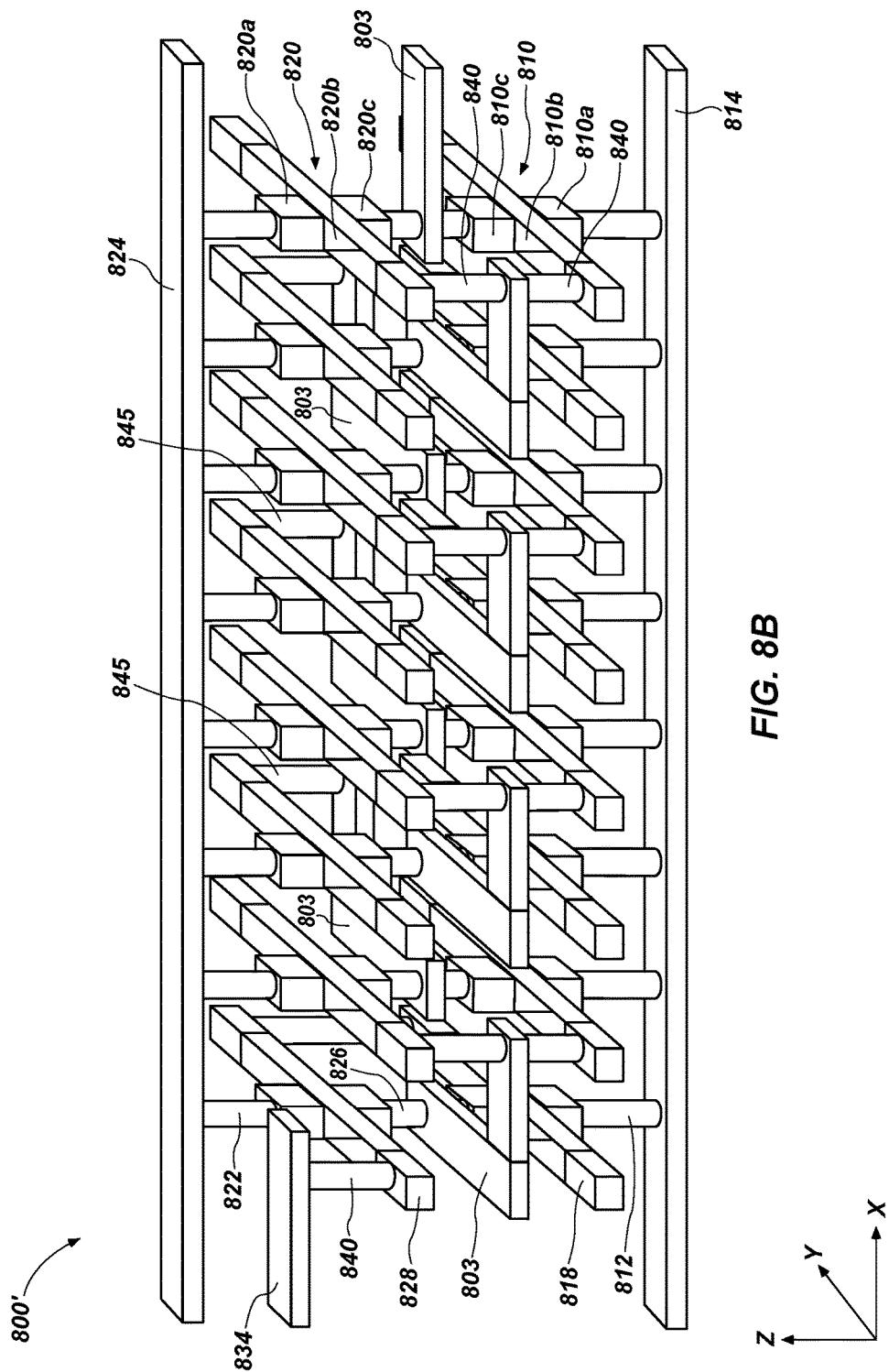
FIG. 8B is a simplified perspective view of another ring oscillator, in accordance with other embodiments of the disclosure.

FIG. 8B is a simplified perspective view of another embodiment of a ring oscillator 800', in accordance with embodiments of the disclosure. The ring oscillator 800' may include a greater density of vertical NMOS transistors 810 and vertical PMOS transistors 820 than the ring oscillator 800. The ring oscillator 800' may include adjacent sets of an NMOS transistor 810 and a corresponding PMOS transistor 820. The output structure 803 of a first set of an NMOS transistor 810 and a corresponding PMOS transistor 820 may be in electrical communication with the gate electrode 818 of an adjacent, second set of an NMOS transistor 810 and PMOS transistor 820 through a gate contact 840. The output structure 803 from the second set may be in electrical communication with the gate electrode 818 of an adjacent third set of an NMOS transistor 810 and an associated PMOS transistor 820 through a gate contact 845 located on an opposite side of the vertical NMOS transistors 810 and the vertical PMOS transistors 820 than the gate contact 840. Accordingly, about one-half of the gate contacts (e.g., the gate contacts) 840 electrically connecting the gate electrodes 818, 828 of adjacent sets of the NMOS transistors 810 and the PMOS transistors 820 may be located on a first side of the gate electrodes 818, 828 and about one-half of the gate contacts (e.g., the gate contacts 845) electrically connecting the gate electrodes 818, 828 of adjacent sets of the NMOS transistors 810 and the PMOS transistors 820 may be located on a second side of the gate electrodes 818, 828.

Accordingly, the output structure 803 of each set of the vertical NMOS transistor 810 and the vertical PMOS transistor 820 and associated gate contacts 840, 845 may alternate between a first side and a second side of the ring oscillator 800'.

Although FIG. 3 through FIG. 8B have been illustrated as including a first subdeck structure comprising an array of vertical NMOS transistors or vertical PMOS transistors and a second subdeck structure comprising an array of the other of vertical NMOS transistors or vertical PMOS transistors over the first subdeck structure, the disclosure is not so limited. In other embodiments, one or both of the first subdeck structure and the second subdeck structure may include an array of planar NMOS transistors and/or an array of planar PMOS transistors.

Figure 9:
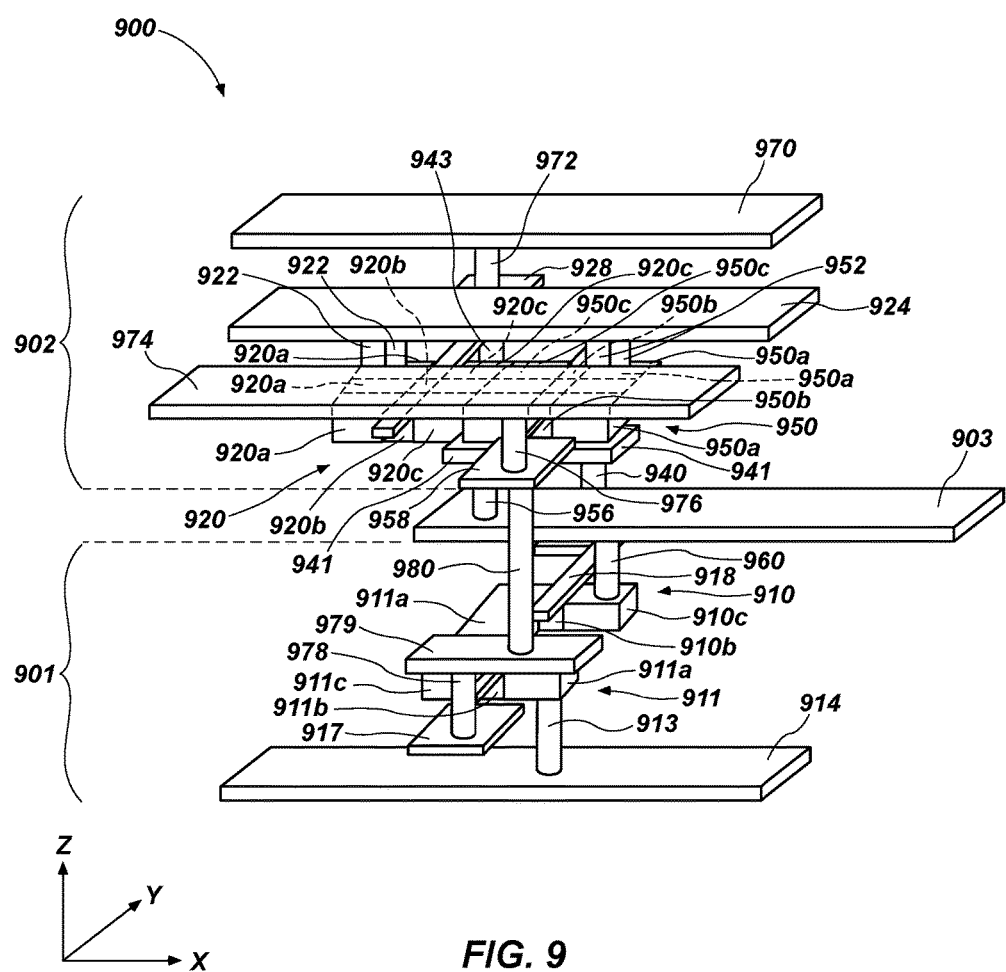
FIG. 9 is a simplified perspective view of a balanced two-input NAND circuit comprising NMOS transistors and PMOS transistors with a planar channel region, in accordance with embodiments of the disclosure.

Referring to FIG. 9, a balanced two-input NAND circuit 900 comprising NMOS transistors and PMOS transistors with a planar channel region, in accordance with embodiments of the disclosure is described. The balanced two-input NAND circuit 900 includes a GND structure 914, a $V_{DD}$ structure 924, an output structure 903, a first input structure 970, and a second input structure 974.

As shown in FIG. 9, the balanced two-input NAND circuit 900 includes a first subdeck structure 901 and a second subdeck structure 902 overlying the first subdeck structure 901.

The balanced two-input NAND circuit 900 may include a first CMOS circuit comprising a planar NMOS transistor 910 in electrical communication with multiple (e.g., more than one) planar PMOS transistors 920. A second CMOS circuit of the balanced two-input NAND circuit 900 may comprise a planar NMOS transistor 911 in electrical communication with multiple (e.g., more than one) planar PMOS transistors 950. In some embodiments, the first CMOS circuit includes one planar NMOS transistor 910 and three planar PMOS transistors 920 and the second CMOS circuit includes one planar NMOS transistor 911 and three planar PMOS transistors 950. In additional embodiments, the first CMOS circuit and/or the second CMOS circuit each include a different number of respective planar PMOS transistors 920 and planar PMOS transistors 950. For example, the first CMOS circuit and/or the second CMOS circuit may include two planar PMOS transistors 920 and two planar PMOS transistors 950, respectively.

The planar NMOS transistor 910 includes an N-type source region 910a, an N-type drain region 910c, and a P-type channel region 910b between the N-type source region 910a and the N-type drain region 910c. Each of the planar PMOS transistors 920 includes a P-type source region 920a, a P-type drain region 920c, and an N-type channel region 920b between the P-type source region 920a and the P-type drain region 920c. Portions of the P-type source region 920a, the P-type drain region 920c, and the N-type channel region 920b under the second input structure 974 in the view of FIG. 9 are shown in broken lines.

The planar NMOS transistor 911 includes an N-type source region 911a, an N-type drain region 911c, and a P-type channel region 911b between the N-type source region 911a and the N-type drain region 911c. Each of the planar PMOS transistors 950 includes a P-type source region 950a, a P-type drain region 950c, and an N-type channel region 950b between the P-type source region 950a and the P-type drain region 950c. Portions of the P-type source region 950a, the P-type drain region 950c, and the N-type channel region 950b under the second input structure 974 in the view of FIG. 9 are shown in broken lines.

The planar NMOS transistor 910 includes a gate electrode 918 disposed over the P-type channel region 910b. In the view illustrated in FIG. 9, the gate electrode 918 overlies the P-type channel region 910b and the associated planar NMOS transistor 910 may be referred to as a so-called "top gate" transistor. In other embodiments, the gate electrode 918 may underlie the P-type channel region 910b and the planar NMOS transistor 910 may be referred to as a so-called "bottom-gate" transistor. In yet other embodiments, the planar NMOS transistor 910 may include a gate electrode over the P-type channel region 910b and under the P-type channel region 910b and may comprise, for example, a double gate transistor. In further embodiments, the NMOS transistor 910 may include a gate electrode 918 disposed on one or more sides of the P-type channel region 910b.

The planar NMOS transistor 911 may include a gate electrode 917 overlying the P-type channel region 911b. In other embodiments, the planar NMOS transistor 911 includes a gate electrode underlying the P-type channel region 911b, a gate electrode overlying and a gate electrode underlying the P-type channel region 911b, or a gate electrode on one or more sides of the P-type channel region 911b.

A gate electrode 928 may be disposed over the N-type channel region 920b of each of the planar PMOS transistors 920. The gate electrode 928 may be shared between the set of planar PMOS transistors 920. Similarly, a gate electrode 958 may be disposed over the N-type channel region 950b of each of the planar PMOS transistors 950 and the gate electrode 958 may be shared between the set of planar PMOS transistors 950. As described above with reference to the gate electrodes 917, 918, the gate electrodes 928, 958 may overlie the respective N-type channel regions 920b, 950b or may underlie the respective N-type channel regions 920b, 950b. In other embodiments, the planar PMOS transistors 920 and the planar PMOS transistors 950 may each include a gate electrode above the respective N-type channel regions 920b, 950b and below the respective N-type channel regions 920b, 950b. In yet other embodiments, each of the planar PMOS transistors 920 and the planar PMOS transistors 950 may each include a gate electrode on one or more sides of the respective N-type channel regions 920b, 950b.

The planar NMOS transistor 911 may be in electrical communication with the GND structure 914 through a source contact 913, which may comprise an electrically conductive material. The planar NMOS transistor 911 may further be in electrical communication with the planar NMOS transistor 910 through the N-type source region 911a, which may be in electrical communication with the N-type drain region 910c of the planar NMOS transistor 910.

The planar NMOS transistor 910 may be in electrical communication with the output structure 903 through a drain contact 960. The output structure 903 may further be in electrical communication with each of the planar PMOS transistors 920 and the planar PMOS transistors 950 through drain contacts 956, which may be electrically coupled to the P-type drain regions 920c, 950c of the respective planar PMOS transistors 920 and the planar PMOS transistors 950. Each of the drain contacts 956, 960 may comprise an electrically conductive material.

The planar PMOS transistors 920 and the planar PMOS transistors 950 may be in electrical communication with the $V_{DD}$ structure 924 through respective source contacts 922 electrically coupled to the P-type source region 920a of each of the planar PMOS transistors 920 and through respective source contacts 952 electrically coupled to the P-type source regions 950a of each of the planar PMOS transistors 950. Each of the source contacts 922, 952 may comprise an electrically conductive material.

The gate electrode 928 of the planar PMOS transistors 920 may be in electrical communication with the first input structure 970 through a gate contact 972. An electrically conductive interconnect structure 941 may be in electrical communication with gate electrode 928 through a gate contact 943. The electrically conductive interconnect structure 941 may be in electrical communication with the gate electrode 918 of the planar NMOS transistor 910 through a gate contact 940 electrically coupled to the electrically conductive interconnect structure 941 and the gate electrode 918.

The gate electrode 958 of the planar PMOS transistors 950 may be in electrical communication with the second input structure 974 through a gate contact 976. The gate electrode 958 may further be in electrical communication with the gate electrode 917 of the planar NMOS transistor 911 through a gate contact 980 in electrical communication with the gate electrode 958 and an electrically conductive interconnect structure 979, which is in turn in electrical communication with a gate contact 978 in electrical communication with the gate electrode 917.

The GND structure 914, the $V_{DD}$ structure 924, the output structure 903, the first input structure 970, and the second input structure 974 of the balanced two-input NAND circuit 900 may exhibit conventional configurations (e.g., conventional dimensions, conventional shapes, conventional conductive material compositions, conventional material distributions, conventional orientations, conventional arrangements), which are not described in detail herein. Each of the GND structure 914, the $V_{DD}$ structure 924, the output structure 903, the first input structure 970, and the second input structure 974 of the balanced two-input NAND circuit 900 may comprise a suitable electrically conductive material.

Although FIG. 9 illustrates that the second subdeck structure 902 including the lateral PMOS transistors overlying the first subdeck structure 901 including the lateral NMOS transistors 910, the disclosure is not so limited. In other embodiments, the array of lateral NMOS transistors 910 may overlie the array of lateral PMOS transistors 920.

Although the NMOS transistors and the PMOS transistors of FIG. 3A through FIG. 9 have been described and illustrated as comprising a vertical channel region or a horizontal channel region and having a particular orientation, the disclosure is not so limited. In other embodiments, each of the NMOS transistors and the PMOS transistors may comprise any transistor structure known in the art, such as, for example, bottom gate transistors, top gate transistors, double gate transistors, gate all around (GAA) transistors, single gate transistors, transistors including saddle-shaped channel regions, or other transistor structures.

Accordingly, in at least some embodiments, a semiconductor device comprises a stack structure comprising decks, each deck of the stack structure comprising a memory element level comprising memory elements, and a control logic level in electrical communication with the memory element level, the control logic level comprising a first subdeck structure comprising a first number of transistors comprising a P-type channel region or an N-type channel region and a second subdeck structure comprising a second number of transistors comprising the other of the P-type channel region and the N-type channel region overlying the first subdeck structure.

Accordingly, in some embodiments, a semiconductor device comprises a stack structure comprising multiple decks. Each deck of the stack structure comprises a memory element level comprising memory elements, an access device level comprising access devices electrically connected to the memory elements of the memory element level, and a control logic level. The control logic level comprises a first subdeck structure comprising a first number of transistors, each transistor of the first number of transistors comprising one of an N-type channel region or a P-type channel region, and a second subdeck structure over the first subdeck structure and comprising a second number of transistors, each transistor of the second number of transistors comprising the other of the N-type channel region or the P-type channel region.

Accordingly, in some embodiments, a semiconductor device comprises a first deck structure comprising a first memory element level, a first access device level, and a first control logic level, and a second deck structure over the first deck structure, the second deck structure comprising a second memory element level, a second access device level, and a second control logic level, wherein at least one of the first control logic level and the second control logic level comprises at least one CMOS device in electrical communication with a base control logic structure.

Figure 10A:
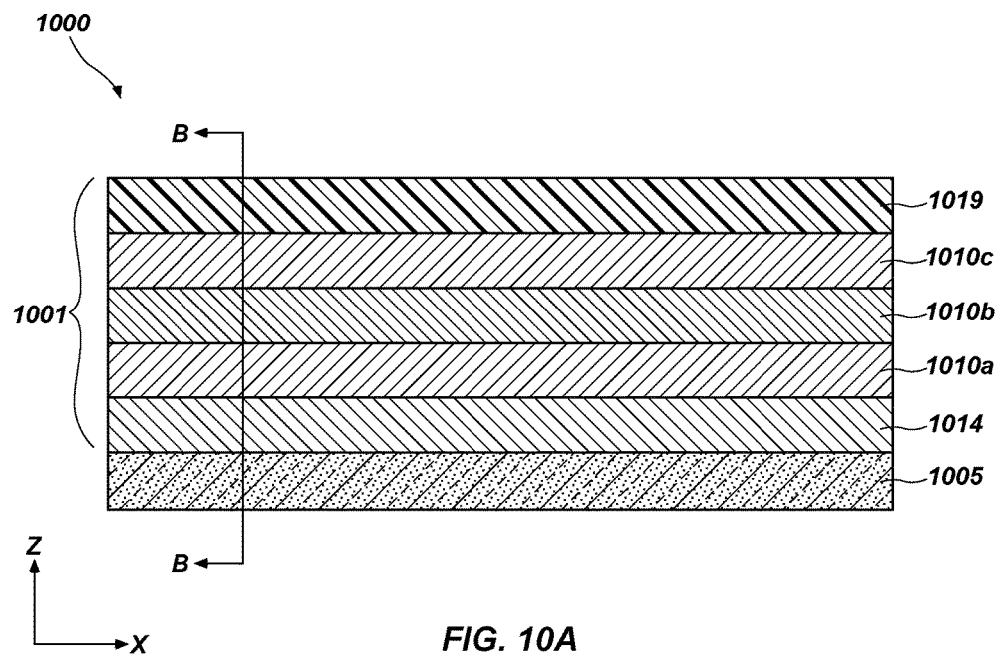
FIG. 10A through FIG. 10Z are simplified partial cross-sectional views illustrating a method of forming a semiconductor device including an array of CMOS inverters, in accordance with embodiments of the disclosure.
Figure 10B:
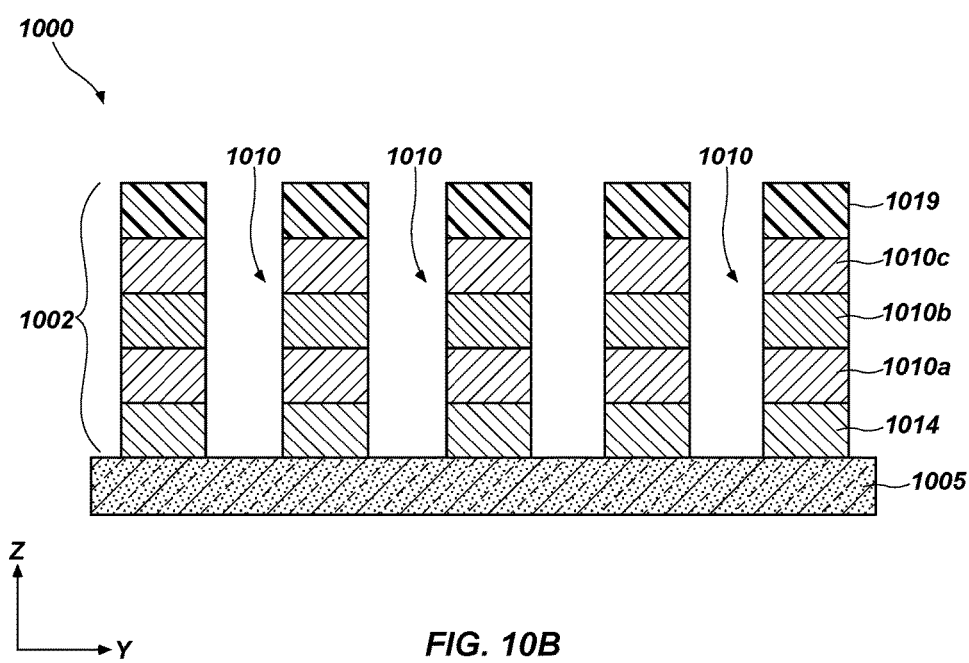
Figure 10C:
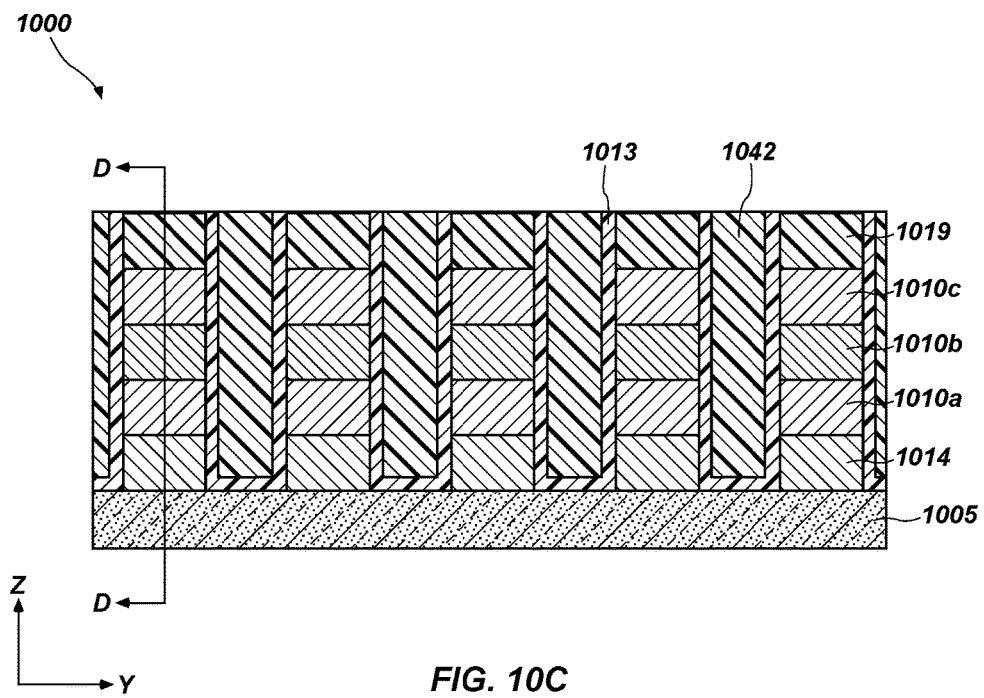
Figure 10D:
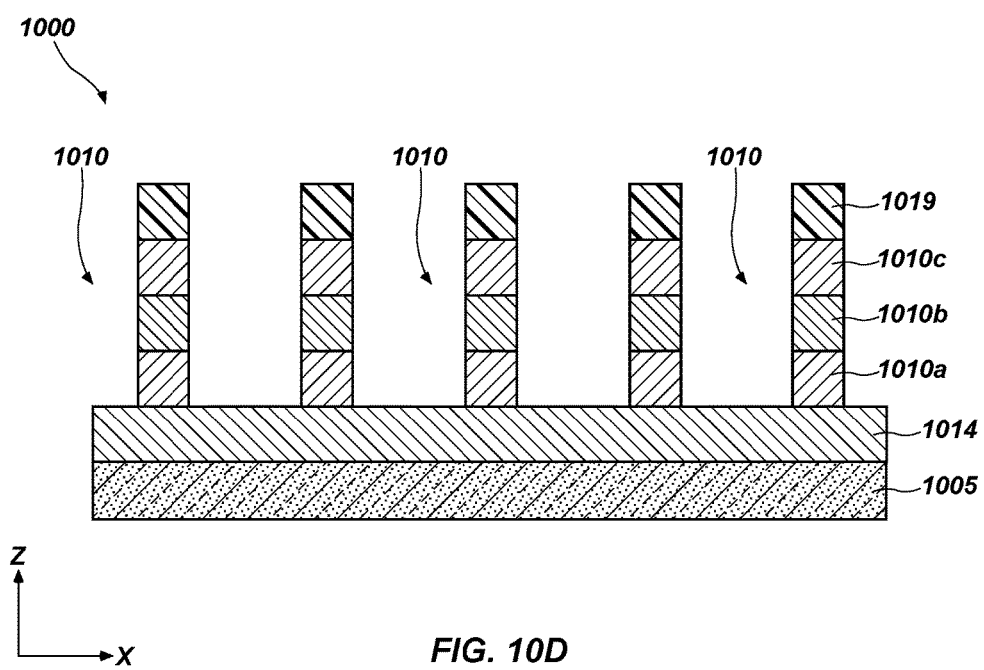
Figure 10E:
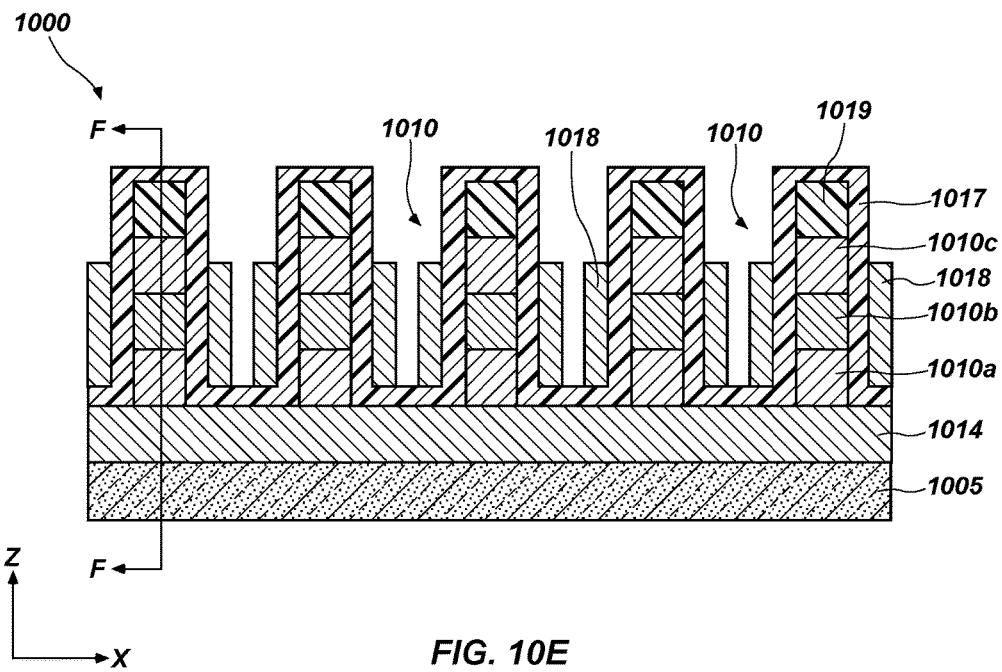
Figure 10F:
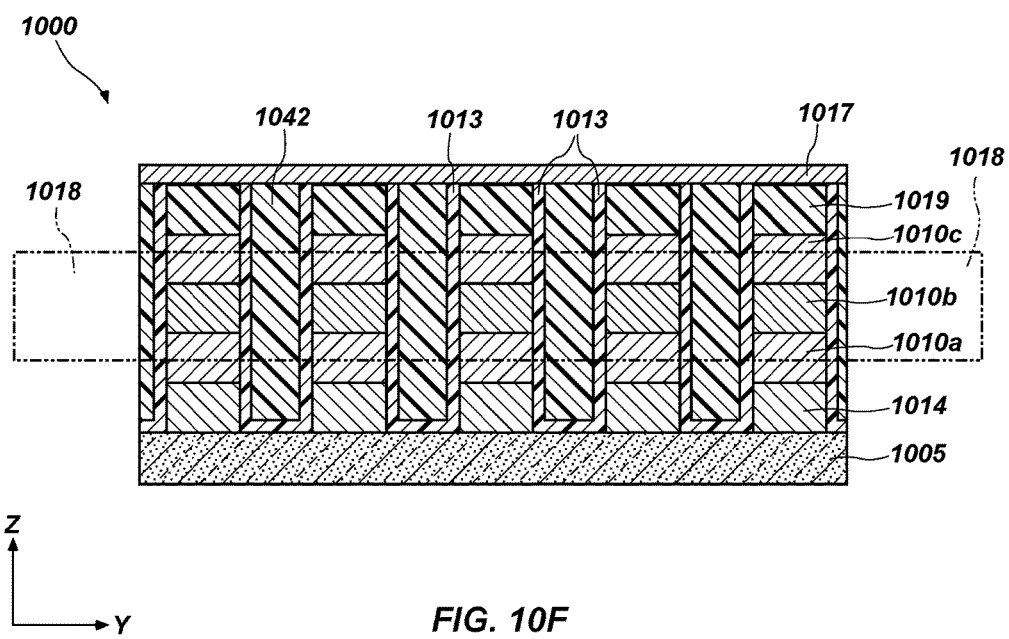
Figure 10G:
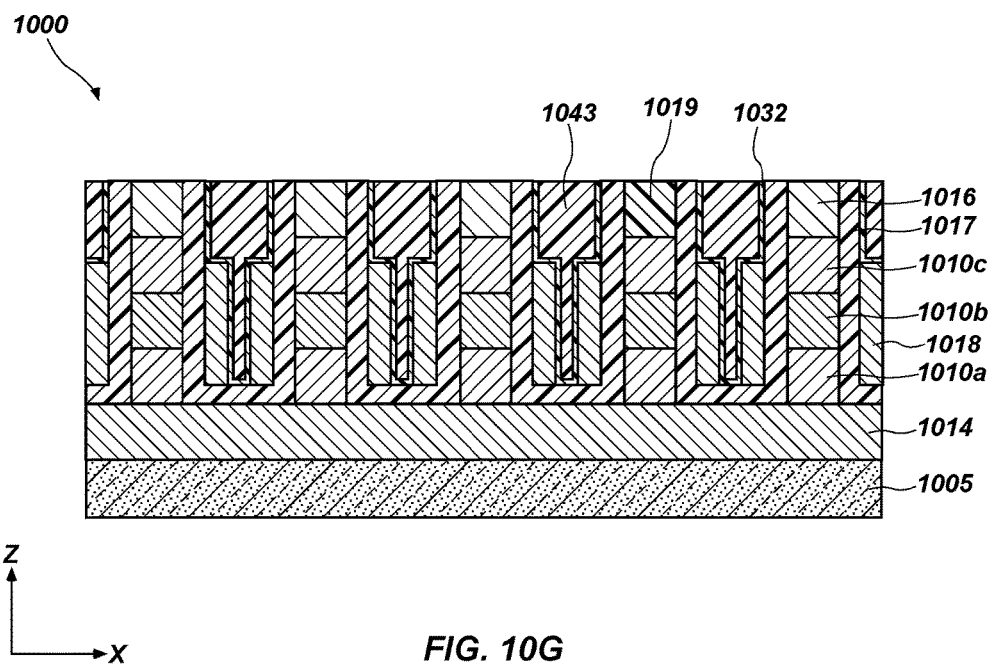
Figure 10H:
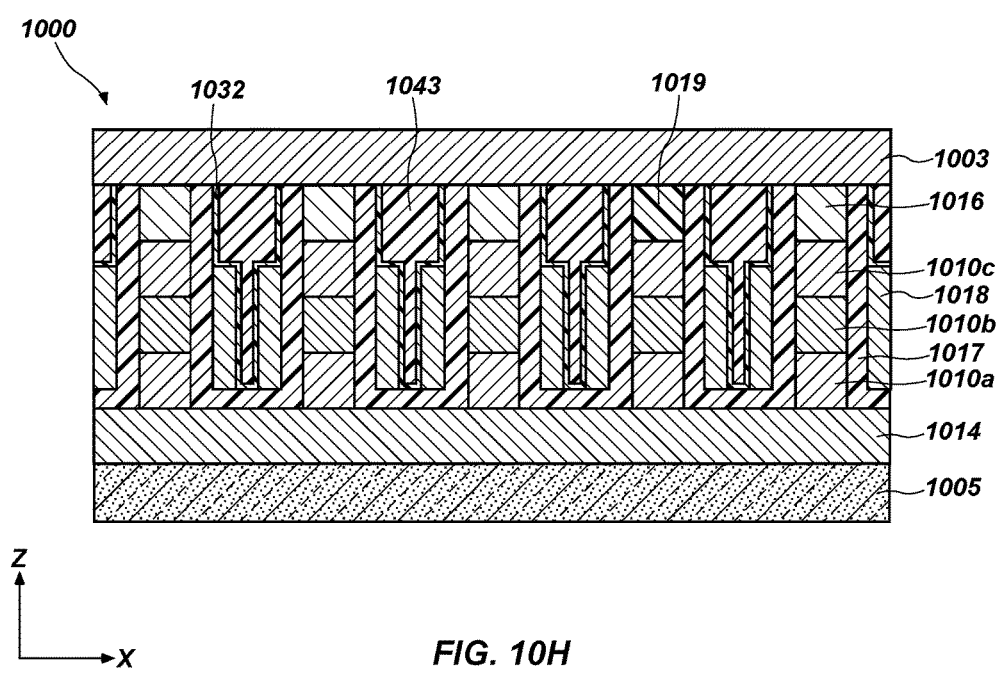
Figure 10I:
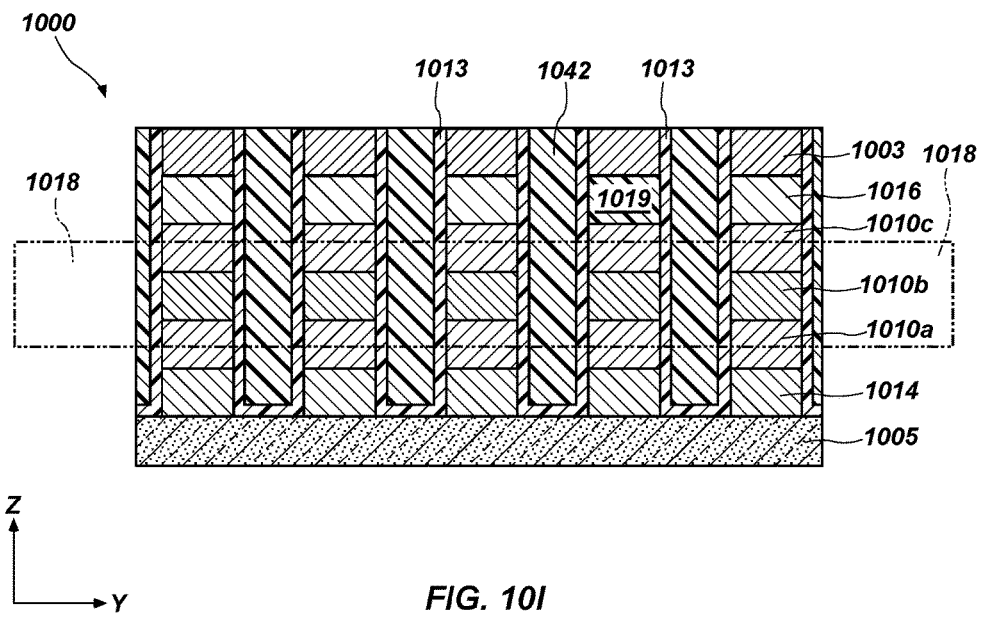
Figure 10J:
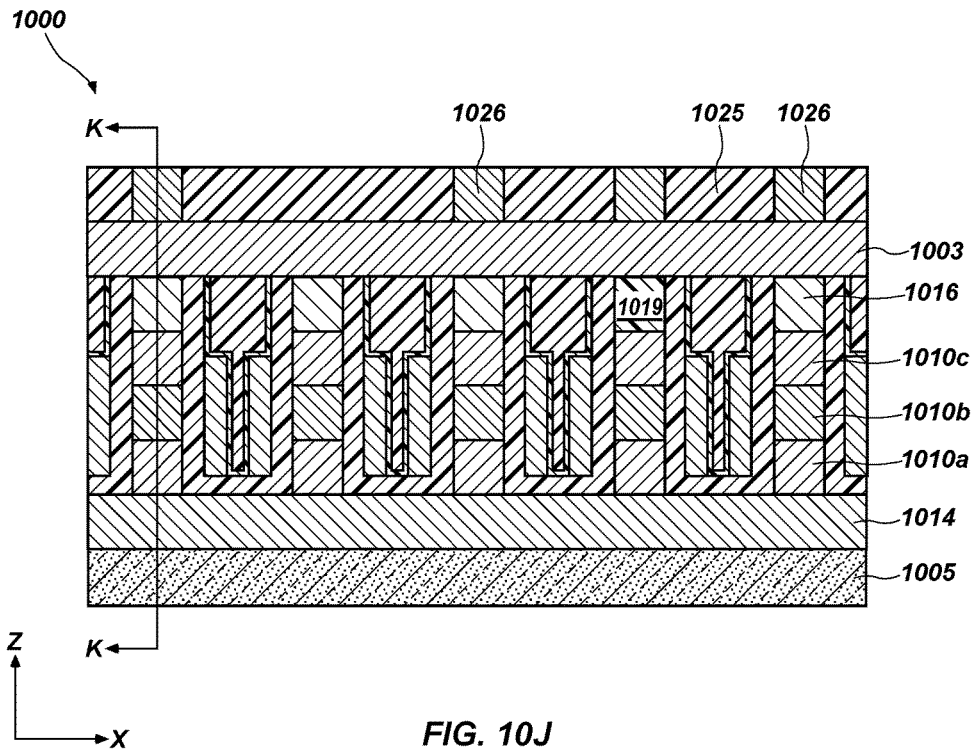
Figure 10K:
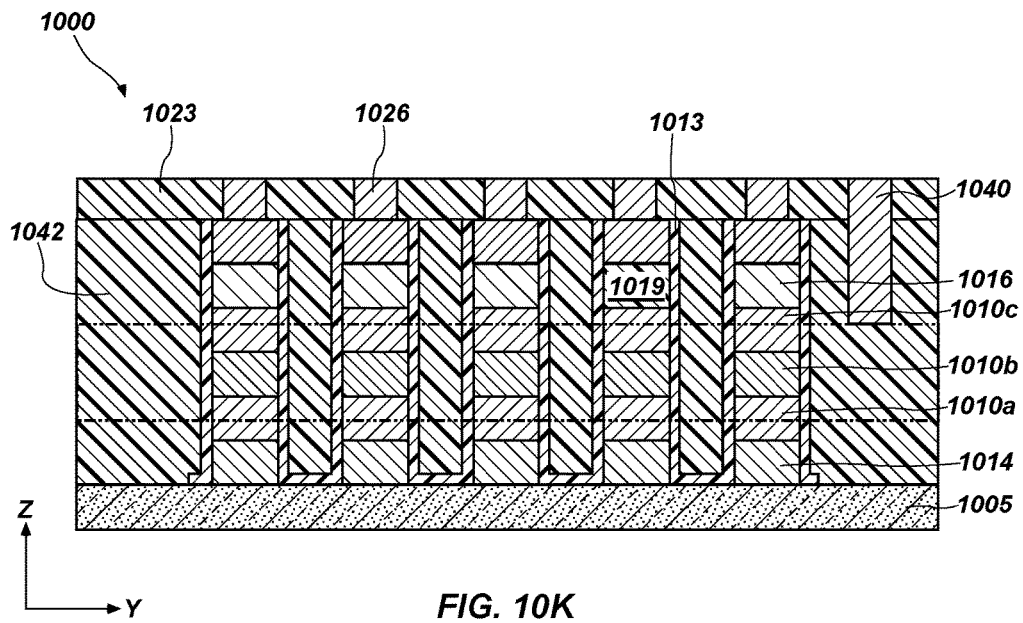
Figure 10L:
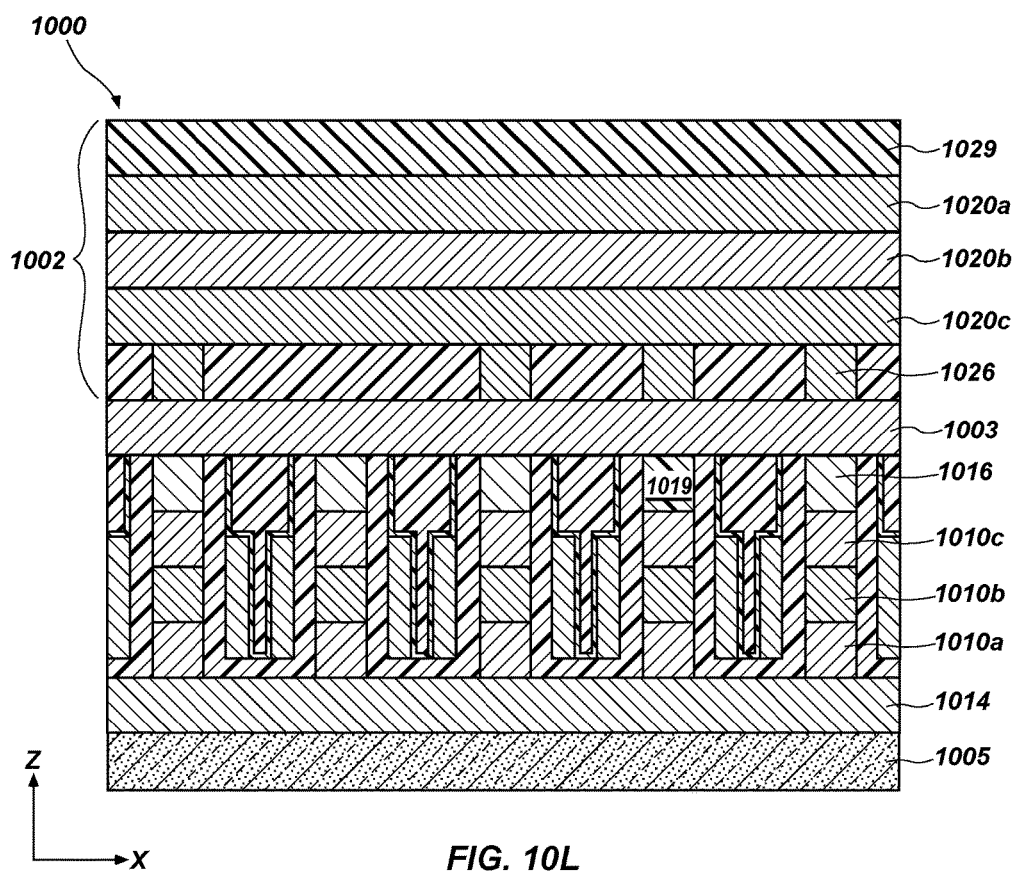
Figure 10M:
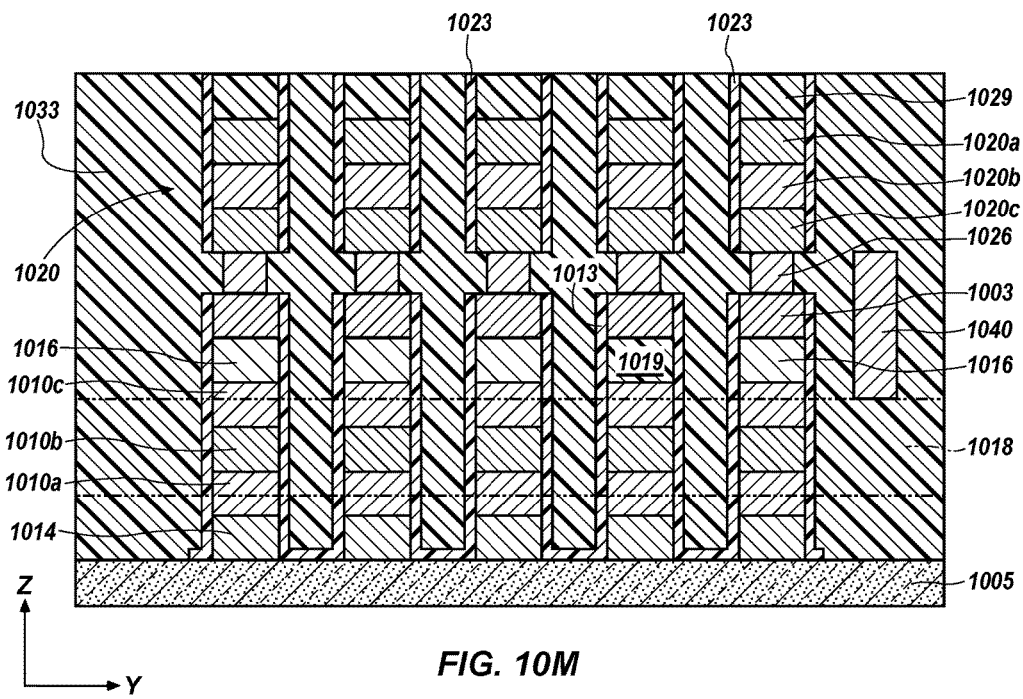
Figure 10N:
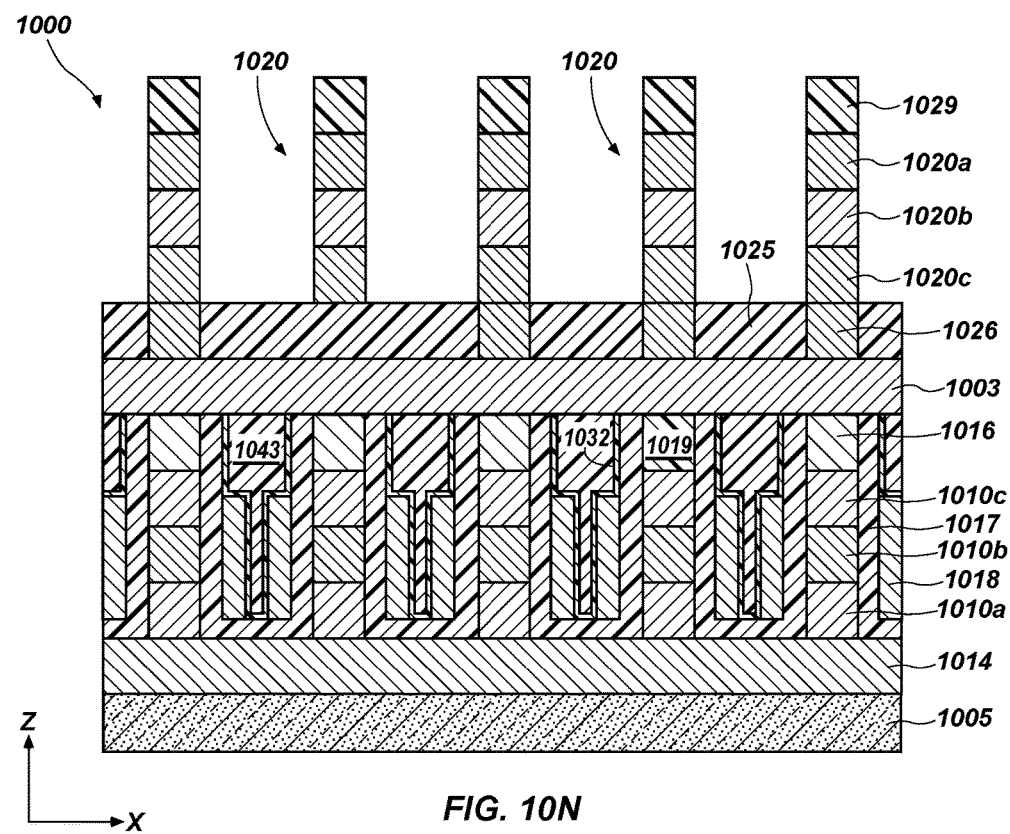
Figure 10O:
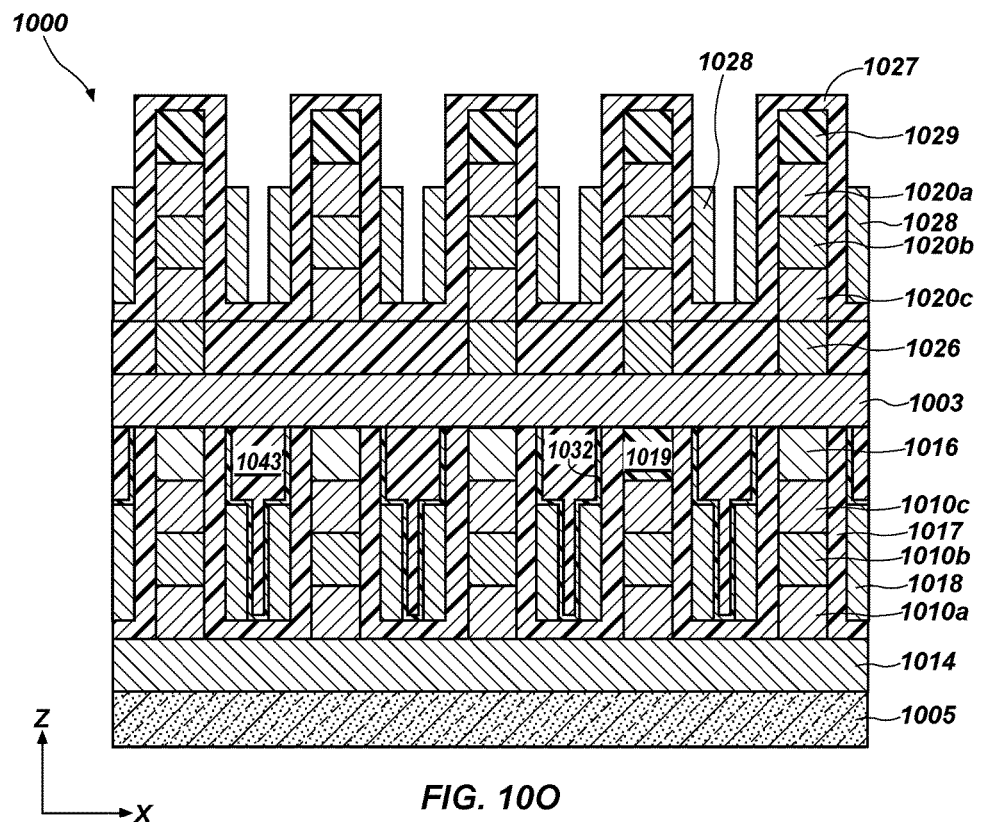
Figure 10P:
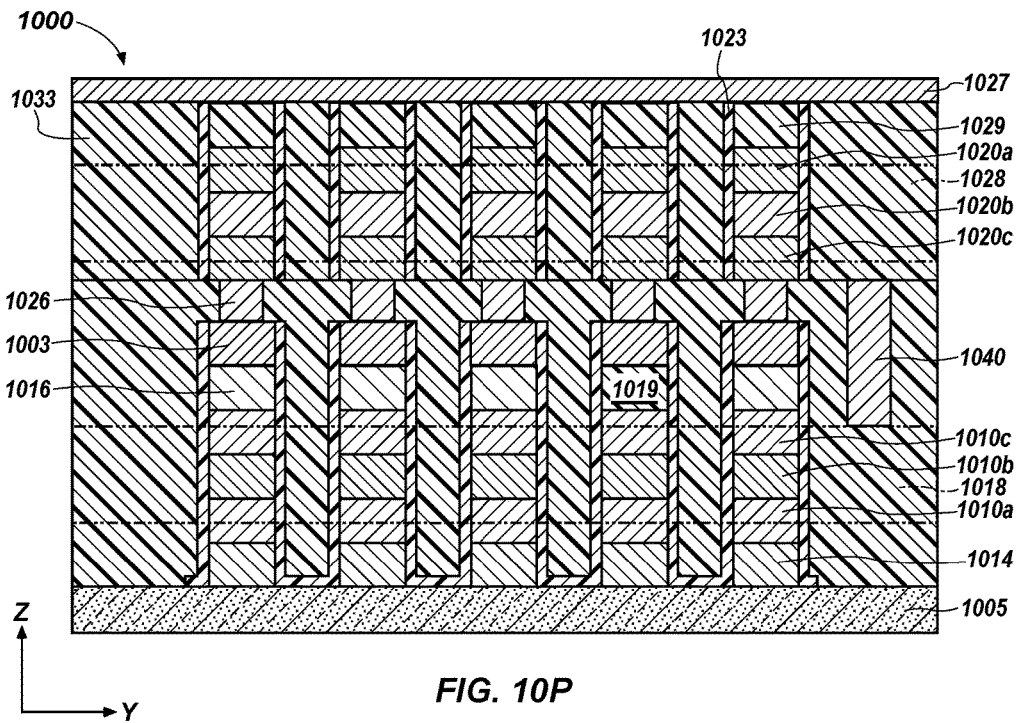
Figure 10Q:
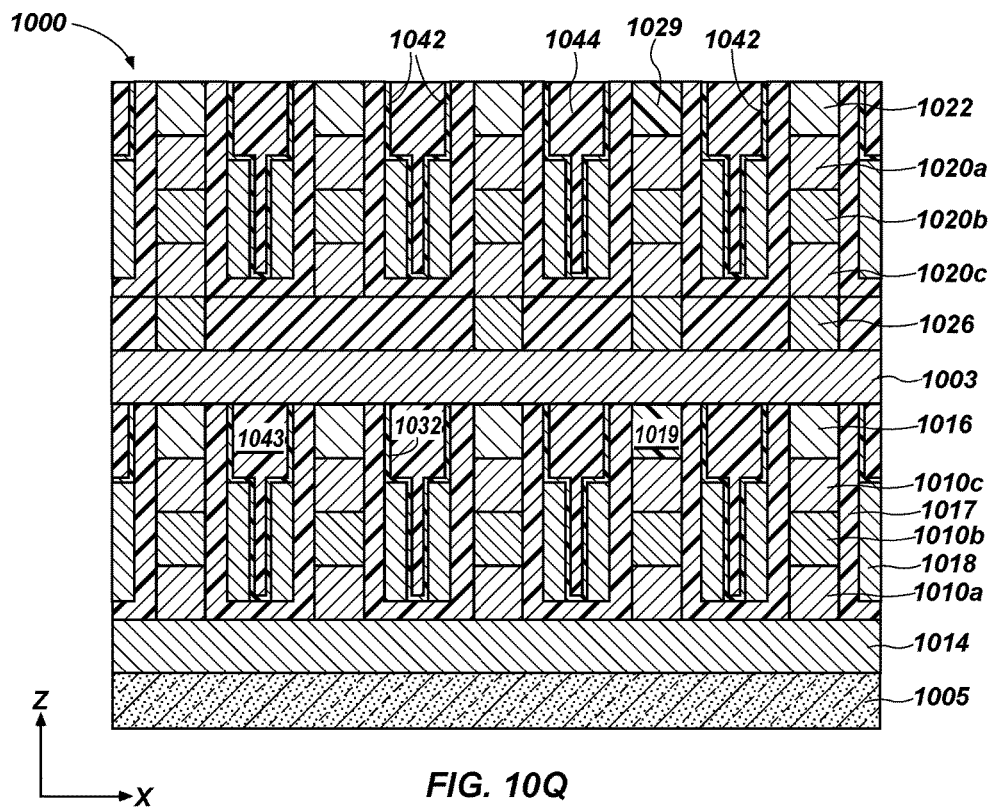
Figure 10R:
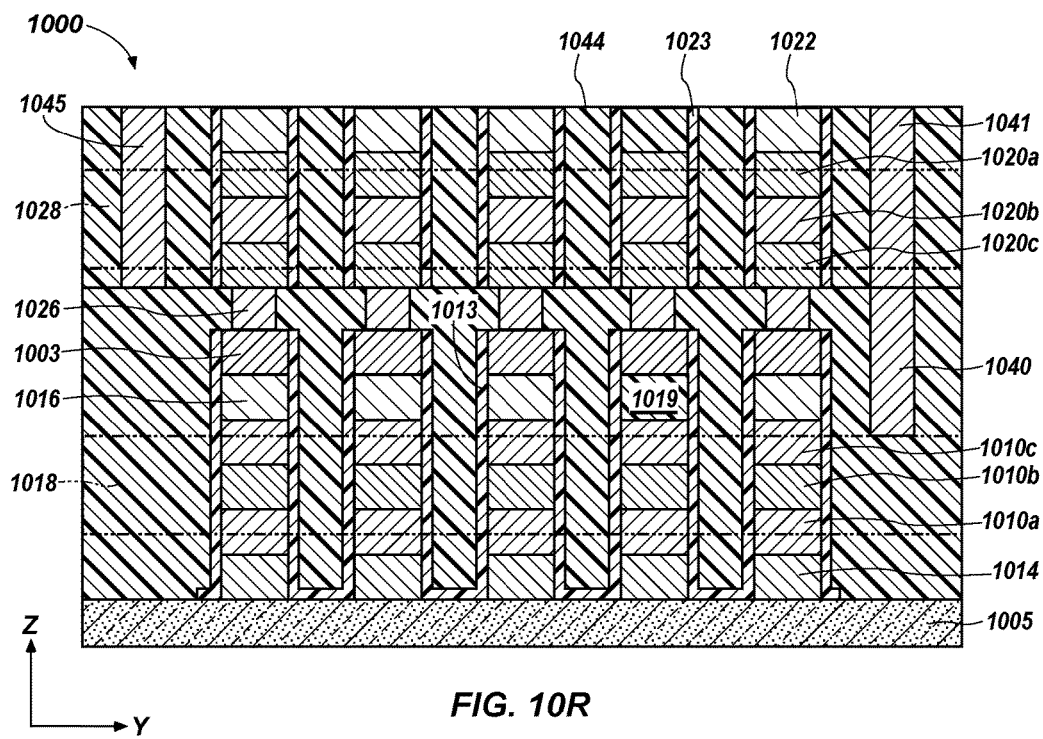
Figure 10S:
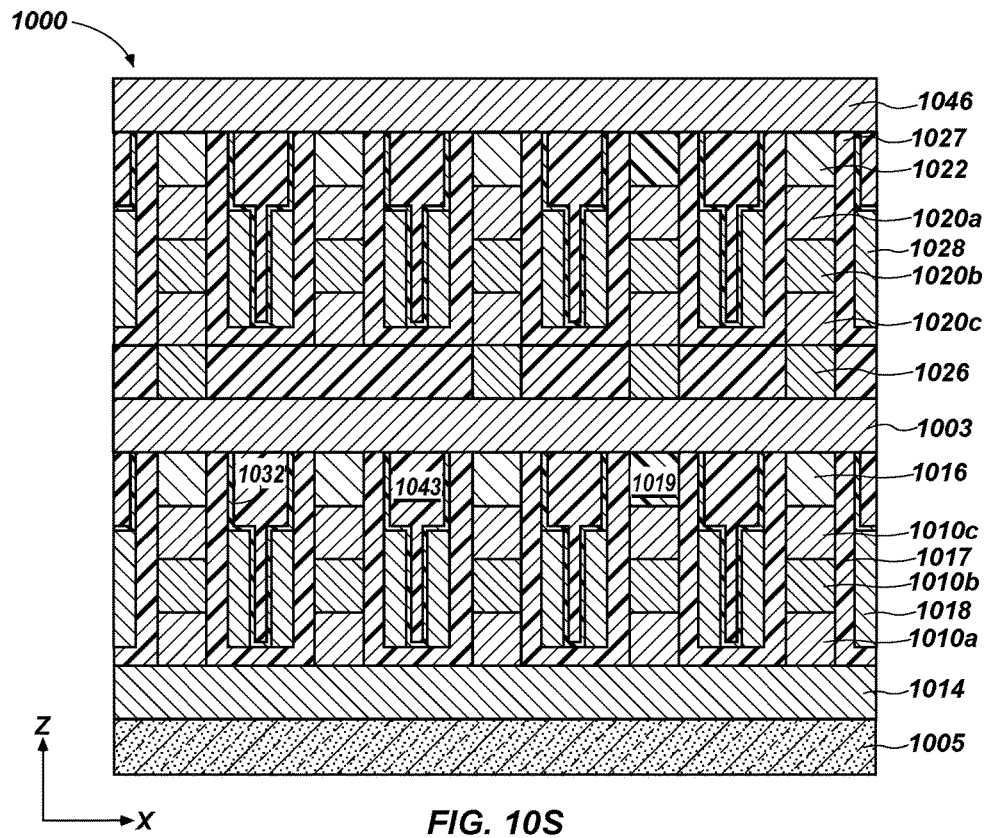
Figure 10T:
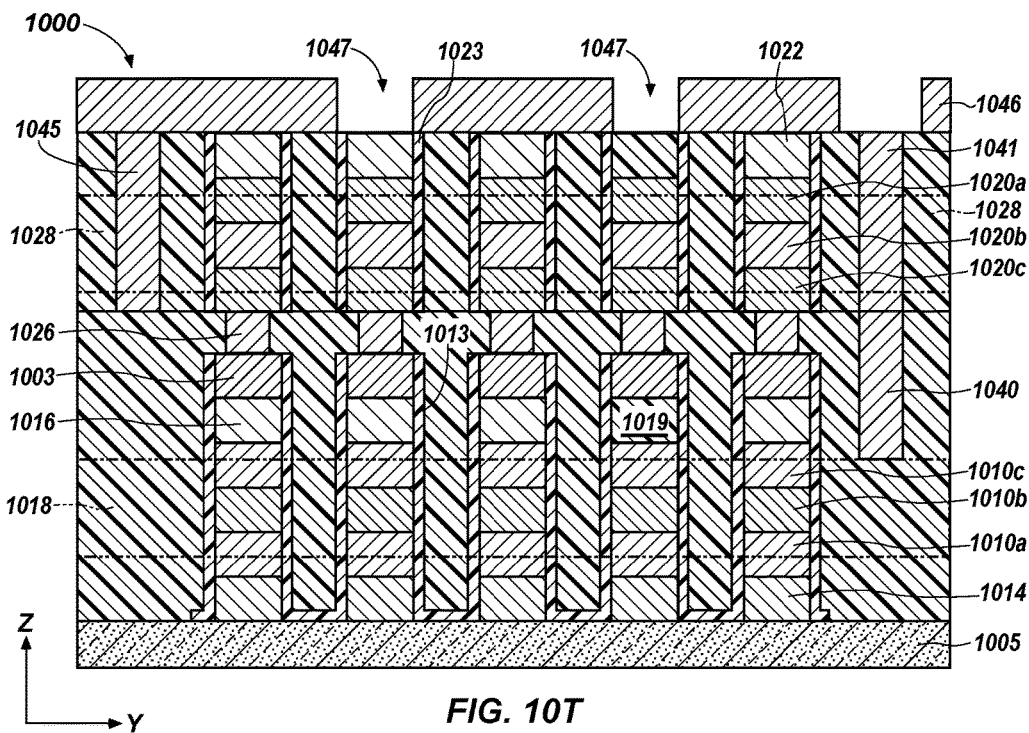
Figure 10U:
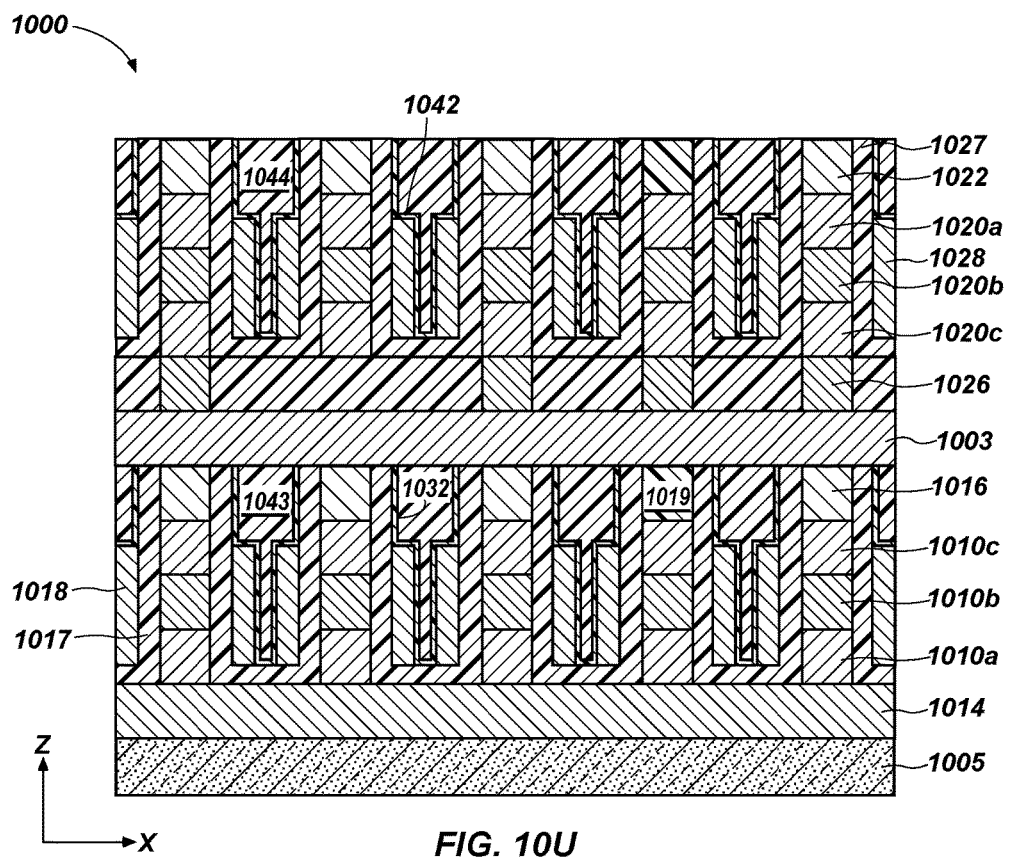
Figure 10V:
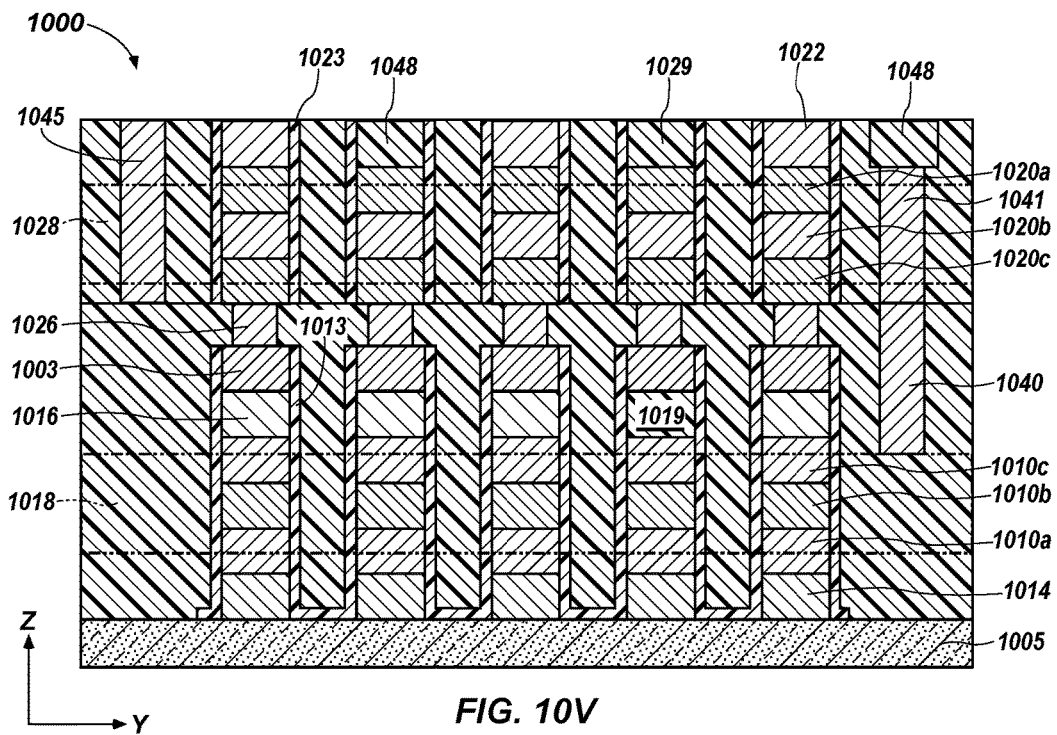
Figure 10W:
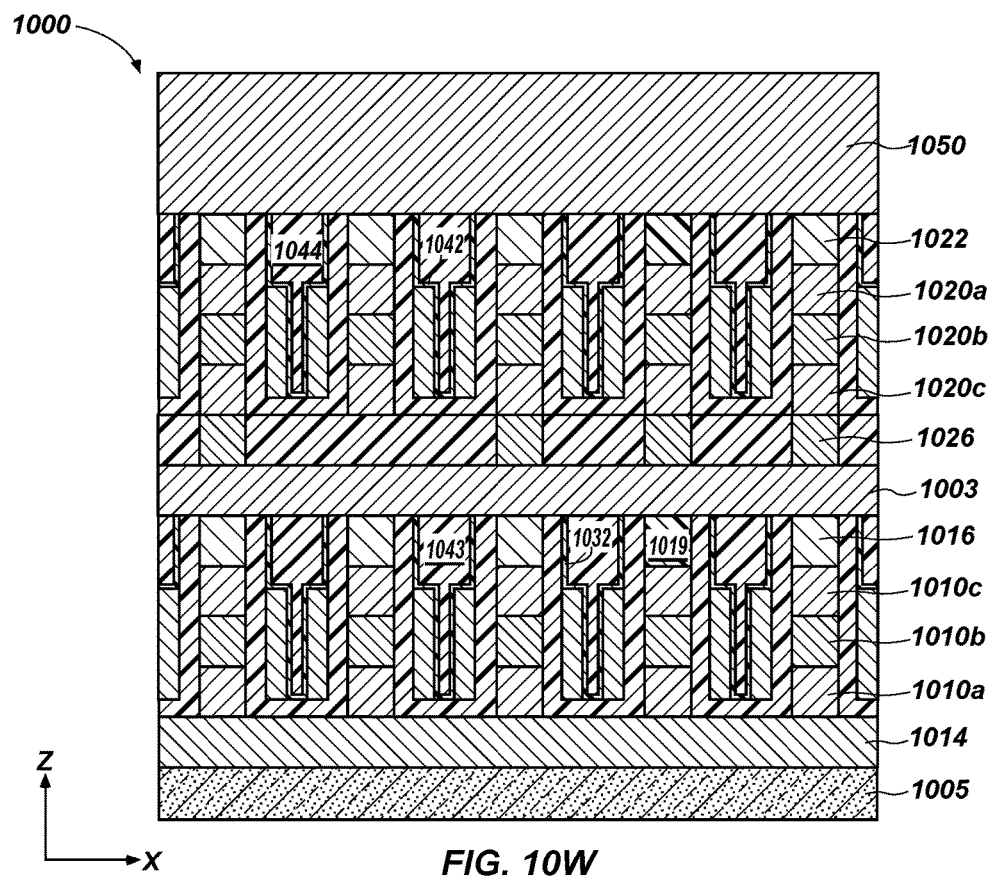
Figure 10X:
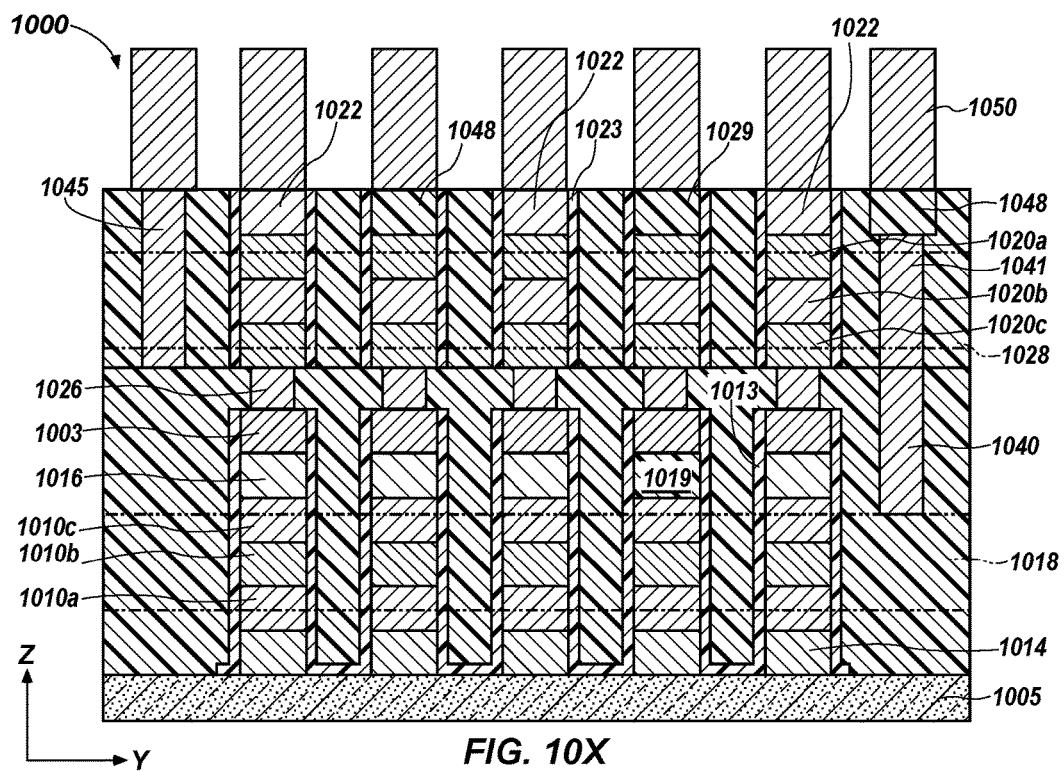
Figure 10Y:
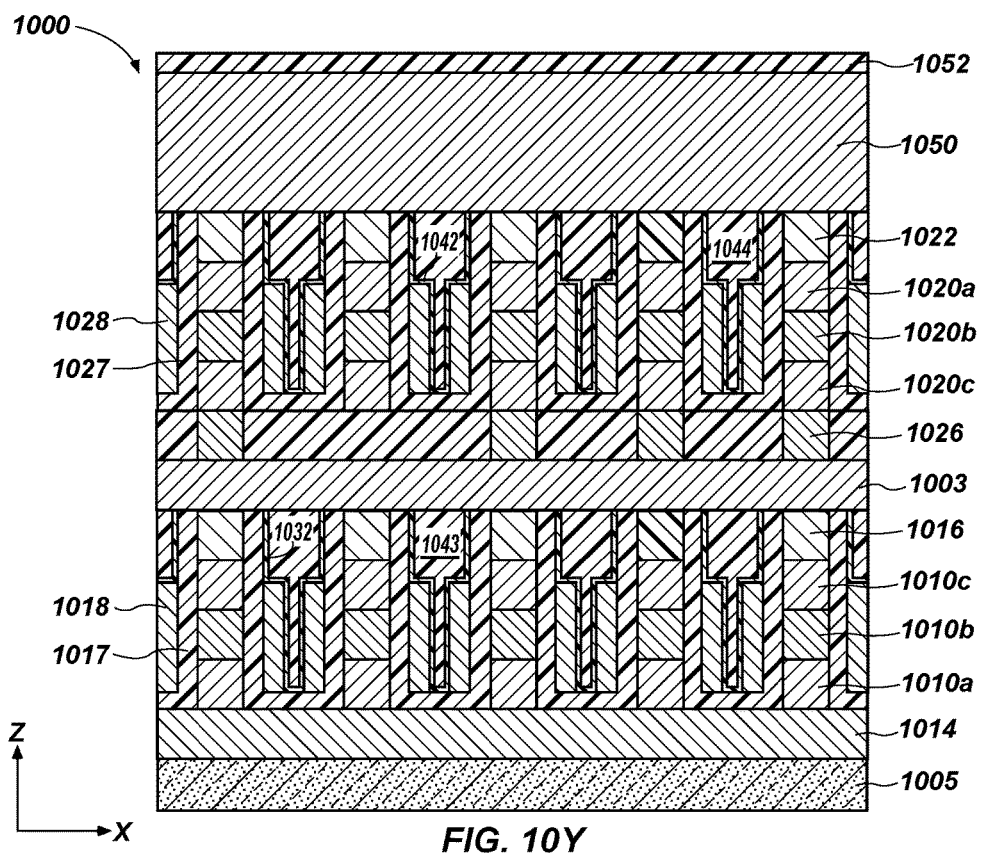
Figure 10Z:
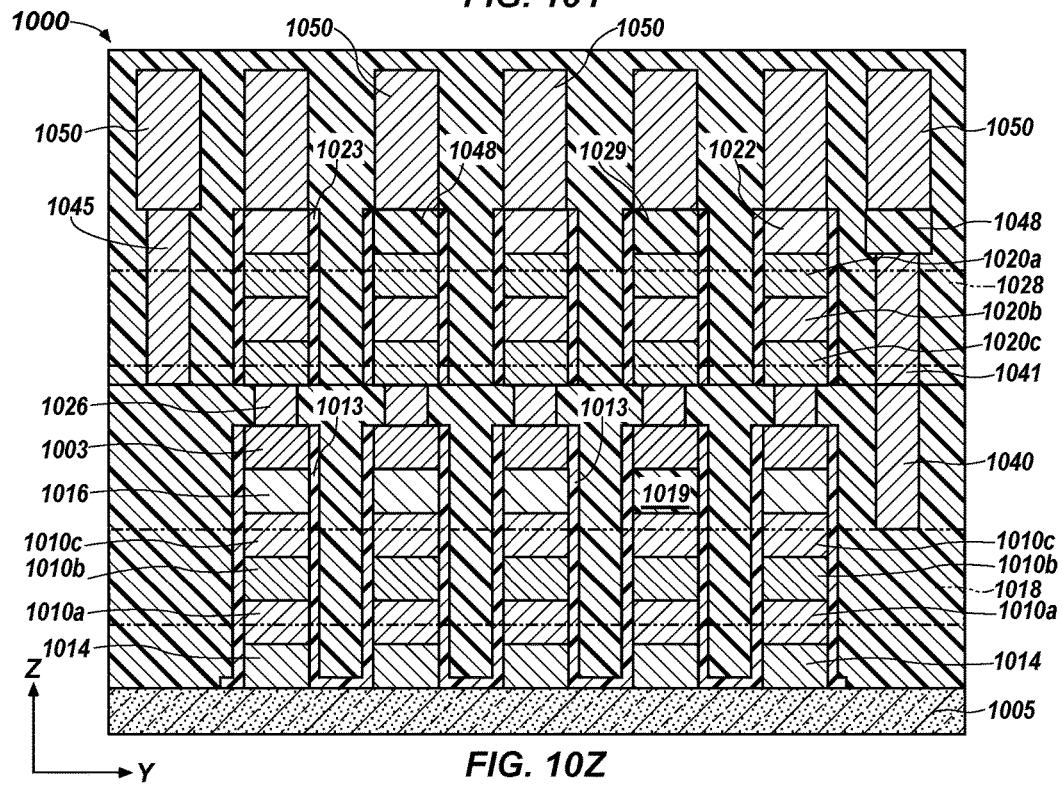

Referring to FIG. 10A through FIG. 10Z, a method of forming a TFT control logic level (e.g., the TFT control logic level 106A, 106B, 106C of FIG. 1) is described. In particular, FIG. 10A through FIG. 10Z illustrate a method of forming a TFT control logic level including a first subdeck structure comprising one of vertical NMOS transistors and PMOS transistors, and a second subdeck structure comprising the other of the vertical NMOS transistors and the vertical PMOS transistors over the first deck structure.

Referring to FIG. 10A, a semiconductor device 1000 including a conductive material 1014 may be formed over a substrate 1005. The conductive material 1014 may comprise a suitable electrically conductive material for forming, for example, a ground structure. By way of nonlimiting example, the conductive material 1014 may include metal (e.g., tungsten, titanium, nickel, platinum, aluminum, copper, ruthenium, molybdenum, gold), a metal alloy, a metal-containing material (e.g., metal nitrides, metal silicides, metal carbides, metal oxides), a conductively-doped semiconductor material (e.g., conductively-doped silicon, conductively-doped germanium, conductively-doped silicon germanium, etc.), or combinations thereof.

An N-type source material 1010a may be formed over the conductive material 1014, a P-type channel material 1010b may be formed over the N-type source material 1010a, and an N-type drain material 1010c may be formed over the P-type channel material 1010b. The N-type source material 1010a and the N-type drain material 1010c may include at least one N-type conductivity material. By way of nonlimiting example, the N-type source material 1010a and the N-type drain material 1010c may each comprise polysilicon doped with at least one N-type dopant, such as arsenic ions, phosphorous ions, antimony ions, and combinations thereof. The P-type channel material 1010b may include at least one P-type conductivity material. For example, the P-type channel material 1010b may include polysilicon doped with at least one P-type dopant, such as boron ions.

A sacrificial material 1019 may be formed over the N-type drain material 1010c. The sacrificial material 1019 may comprise, for example, silicon dioxide, silicon nitride, a polymer, another material, or combinations thereof. Although FIG. 10A has been described as including forming a sacrificial material 1019 over the N-type drain material 1010c, in other embodiments, the sacrificial material 1019 may not be formed over the N-type drain material 1010c and a conductive drain contact material may be formed over the N-type drain material.

FIG. 10B is a cross-sectional view of the semiconductor device 1000 taken along section line B-B of FIG. 10A. With reference to FIG. 10B, each of the conductive material 1014, the N-type source material 1010a, the P-type channel material 1010b, the N-type drain material 1010c, and the sacrificial material 1019 may be patterned to form an array region of NMOS structures comprising lines of vertical NMOS transistor structures 1010 extending in the x-direction. In some embodiments, the substrate 1005 may be exposed between adjacent lines of the vertical NMOS transistor structures 1010.

Referring to FIG. 10C, a liner material 1013 may be formed conformally over the NMOS transistor structures 1010 (FIG. 10B). The liner material 1013 may comprise, for example, silicon nitride, a silicon oxynitride, silicon dioxide, or another liner material. After forming the liner material 1013, a dielectric material 1042 may be formed in spaces between adjacent lines of the vertical NMOS transistor structures 1010. The dielectric material 1042 may be planarized, such as by chemical mechanical polishing (CMP) to remove the dielectric material 1042 from surfaces of the sacrificial material 1019. The dielectric material 1042 may comprise, for example, silicon dioxide, silicon nitride, phosphosilicate glass, borosilicate glass, borophosphosilicate glass, another electrically insulative material, or combinations thereof. Although FIG. 10C illustrates a dielectric material 1042 between the lines of the NMOS transistor structures 1010, the disclosure is not so limited. In other embodiments, spaces between adjacent lines of the NMOS transistor structures 1010 may include an air gap.

FIG. 10D is a cross-sectional view of the semiconductor device 1000 taken along section line D-D of FIG. 10C. After forming the dielectric material 1042, the lines of the vertical NMOS transistor structures 1010 may be patterned in the x-direction to form rows and columns of discrete vertical NMOS transistor structures extending in the x-direction and the y-direction. By way of nonlimiting example, each of the sacrificial material 1019, the N-type drain material 1010c, the P-type channel material 1010b, and the N-type source material 1010a may be pattered to form the discrete vertical NMOS transistor structures 1010. In some embodiments, the conductive material 1014 may remain exposed between the adjacent vertical NMOS transistor structures 1010.

Although FIG. 10D illustrates that substantially all of the N-type source material 1010a is removed from surfaces of the conductive material 1014 between adjacent vertical NMOS transistor structures 1010, the disclosure is not so limited. In other embodiments, at least a portion of the N-type source material 1010a remains between adjacent vertical NMOS transistor structures 1010.

Referring to FIG. 10E and FIG. 10F, a gate dielectric material 1017 and a gate electrode material 1018 may be formed over the semiconductor device 1000. The gate dielectric material 1017 may include any of the materials described above with reference to the gate dielectric material 317 (FIG. 3A through FIG. 3C). By way of nonlimiting example, the gate dielectric material 1017 may include phosphosilicate glass, borosilicate glass, borophosphosilicate glass, fluorosilicate glass, silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride, another gate dielectric material, or combinations thereof.

The gate electrode material 1018 may include any of the materials described above with reference to the gate electrode 318 (FIG. 3A through FIG. 3C). By way of nonlimiting example, the gate electrode material 1018 may include an electrically conductive material including, but not limited to, a metal (e.g., tungsten, titanium, nickel, platinum, aluminum, copper, ruthenium, molybdenum, gold), a metal alloy, a metal-containing material (e.g., metal nitrides, metal silicides, metal carbides, metal oxides), a conductively-doped semiconductor material (e.g., conductively-doped silicon, conductively-doped germanium, conductively-doped silicon germanium, etc.), or combinations thereof.

After forming the gate electrode material 1018 over the gate dielectric material 1017, the gate electrode material 1018 may be patterned to form distinct gate electrode structures on sides of each of the vertical NMOS transistor structures 1010. By way of nonlimiting example, the gate electrode material 1018 may be patterned by exposing the gate electrode material 1018 to an anisotropic etch process, such as a reactive ion etch (RIE) process. Methods of anisotropically etching are known in the art and are, therefore, not described in detail herein.

With reference to FIG. 10F, the gate electrode material 1018 may extend laterally beyond (e.g., in the y-direction) the array of the vertical NMOS transistor structures 1010. As will be described herein, one or more gate contacts may be formed to electrically connect the gate electrode material 1018 to one or more other conductive structures at such regions of the gate electrode material 1018. The gate electrode material 1018 is illustrated in FIG. 10F in broken lines to show that the gate electrode material 1018 is behind the vertical NMOS transistor structures 1010 in the view of FIG. 10F.

Although FIG. 10E and FIG. 10F illustrate that the gate electrode material 1018 extends vertically over sidewalls of the N-type source material 1010$a$ and the N-type drain material 1010$c$, the disclosure is not so limited. In other embodiments, the gate electrode material 1018 may not extend over one or both of sidewalls of the N-type source material 1010$a$ and the N-type drain material 1010$c$. In some embodiments, the gate electrode material 1018 may extend in a vertical direction over only a portion of the sidewalls of the P-type channel material 1010$b$. In some such embodiments, the gate electrode material 1018 may be said to underlap the N-type source material 1010$a$ and the N-type drain material 1010$c$.

Referring to FIG. 10G, a liner material 1032 may be formed over the gate electrode material 1018 and over sides of the gate dielectric material 1017. The liner material 1032 may include, for example, silicon nitride, silicon dioxide, a silicon oxynitride, another liner material, and combinations thereof. After forming the liner material 1032, a dielectric material 1043 may be formed over the liner material 1032 in between adjacent vertical NMOS transistor structures 1010. The dielectric material 1043 may include silicon dioxide, silicon nitride, phosphosilicate glass, borosilicate glass, borophosphosilicate glass, another electrically insulative material, or combinations thereof. The dielectric material 1043 may be planarized and removed from a top surface of the sacrificial material 1019. The top exposed surface of the dielectric material 1043 may be substantially planar with the top exposed surface of the sacrificial material 1019.

With continued reference to FIG. 10G, in some embodiments, the sacrificial material 1019 may be removed from at least some of the vertical NMOS transistor structures 1010 (e.g., from the N-type drain material 1010$c$ of at least some of the vertical NMOS transistor structures 1010). By way of nonlimiting example, the sacrificial material 1019 may be removed by exposing the sacrificial material 1019 to a wet etchant, a dry etchant, or a combination thereof. After the sacrificial material 1019 is removed, a drain contact material 1016 may be formed over the N-type drain material 1010$c$ of each of the vertical NMOS transistor structures 1010. The drain contact material 1016 may be planarized such that a top surface of the drain contact material 1016 is substantially planar with a top surface of the dielectric material 1043.

In some embodiments, the sacrificial material 1019 may not be removed from surfaces of at least some of the vertical NMOS transistor structures 1010. In some such embodiments, the vertical NMOS transistor structures 1010 on which the sacrificial material 1019 remains may not be electrically coupled to other regions of the semiconductor device and may comprise, for example, dummy NMOS transistors. Accordingly, depending on a desired circuit configuration, the sacrificial material 1019 may not be removed from at least some of the vertical NMOS transistor structures 1010.

Although FIG. 10G illustrates that the sacrificial material 1019 is removed from only some of the vertical NMOS transistor structures 1010, the disclosure is not so limited. In other embodiments, the sacrificial material 1019 may be removed from over the N-type drain material 1010$c$ of substantially all of the vertical NMOS transistor structures 1010 and the drain contact material 1016 may be formed over the N-type drain material 1010$c$ of substantially all of the vertical NMOS transistors 1010.

Although FIG. 10A through FIG. 10G have been described as including the sacrificial material 1019 over the vertical NMOS transistor structures 1010, the disclosure is not so limited. In other embodiments, the sacrificial material 1019 may not be formed over the N-type drain material 1010$c$ as described above with reference to FIG. 10A. In some such embodiments, the drain contact material 1016 may be formed directly over the N-type drain material 1010$c$ prior to patterning the vertical NMOS transistor structures 1010. The drain contact material 1016 may be formed over vertical NMOS transistor structures 1010 which are desired to be coupled to other regions of the semiconductor device.

Referring to FIG. 10H and FIG. 10I, a conductive material may be formed over the semiconductor device 1000 and patterned to form conductive lines 1003. The conductive lines 1003 may include the same material as described above with reference to the conductive material 1014. The conductive lines 1003 may be patterned such that the conductive lines 1003 extend in the y-direction. In some embodiments, the conductive lines 1003 may extend in the same direction as the conductive lines of the conductive material 1014.

Referring to FIG. 10J, conductive contacts 1026 may be formed over one or more of the vertical NMOS transistor structures 1010 to electrically couple the respective vertical NMOS transistor structures 1010 to the conductive line 1003. In some embodiments, the conductive contacts 1026 are not formed over all of the vertical NMOS transistor structures 1010 such that a later formed transistor structure is not electrically connected to the conductive line 1003, depending on a circuit layout and design of the semiconductor device 1000.

A dielectric material 1025 may be formed between the conductive contacts 1026. The dielectric material 1025 may comprise a suitable electrically insulative material, such as, for example, silicon dioxide, silicon nitride, phosphosilicate glass, borosilicate glass, borophosphosilicate glass, another electrically insulative material, or combinations thereof. The dielectric material 1025 may comprise the same material as the dielectric material 1042.

FIG. 10K is a cross-sectional view of the semiconductor device of FIG. 10J taken along section line K-K of FIG. 10J. In some embodiments, a gate contact 1040 may be formed at peripheral portions of the semiconductor device to form an electrical connection between the gate electrode material 1018 and at least one of a word line driver and another gate electrode material, as will be described herein. In some embodiments, and as will be described herein, at least some of the gate contacts 1040 may be configured to electrically coupled at least some of the gate electrode materials 1018 to a gate electrode material associated with an associated vertical PMOS transistor structure.

Referring to FIG. 10L, a second subdeck structure 1002 may be formed over the conductive lines 1003. The second subdeck structure 1002 may include a P-type drain material 1020$c$ over the conductive contacts 1026 and the dielectric material 1025, an N-type channel material 1020*b* over the P-type drain material 1020*c*, a P-type source material 1020*a* over the N-type channel material 1020*b*, and a sacrificial material 1029 over the P-type source material 1020*a*. Each of the P-type drain material 1020*c* and the P-type source material 1020*a* may include at least one P-type conductivity material and may comprise, for example, polysilicon doped with at least one P-type dopant, such as boron ions. The N-type channel material 1020*b* may include a material similar to the N-type source material 1010*a* and the N-type drain material 1010*c*, such as, for example, polysilicon doped with at least one N-type dopant, such as arsenic ions, phosphorous ions, antimony ions, and combinations thereof. The sacrificial material 1029 may include one or more of the materials described above with reference to the sacrificial material 1019.

Referring to FIG. 10M, the sacrificial material 1029, the P-type source material 1020*a*, the N-type channel material 1020*b*, and the P-type drain material 1020*c* may be patterned in the y-direction to form lines of vertical PMOS transistor structures 1020 extending in the x-direction (into the page in the view of FIG. 10M) in an array region of the second subdeck structure 1002. After forming the lines of the vertical PMOS transistor structures 1020 in the array region, a liner material 1023 may be formed (e.g., deposited) over at least sidewalls of the stack structures 1020. The liner material 1023 may be removed from a top surface of the sacrificial material 1029 and from laterally extending surfaces extending between adjacent lines of vertical PMOS transistor structures 1020. The liner material 1023 may comprise one or more of the materials described above with reference to the liner material 1013 such as, for example, a silicon nitride material, a silicon oxynitride material, silicon dioxide, another material, or combinations thereof.

After forming the liner material 1023, a dielectric material 1033 may be formed between adjacent lines of the vertical PMOS transistor structures 1020. The dielectric material 1033 may comprise a suitable electrically insulative material, such as, for example, silicon dioxide, silicon nitride, phosphosilicate glass, borosilicate glass, borophosphosilicate glass, another electrically insulative material, or combinations thereof. The dielectric material 1033 may be removed from over surfaces of the sacrificial material 1029 and the dielectric material 1033 may be planarized, such as by chemical mechanical polishing.

Referring to FIG. 10N, each of the lines of the vertical PMOS transistor structures 1020 may be patterned in the y-direction by removing portions of the each of the sacrificial material 1029, the P-type source material 1020*a*, the N-type channel material 1020*b*, and the P-type drain material 1020*c* to form an array of isolated vertical PMOS transistor structures 1020, which may be arranged in rows and columns or in another orientation. In some embodiments, removing the portions of the each of the sacrificial material 1029, the P-type source material 1020*a*, the N-type channel material 1020*b*, and the P-type drain material 1020*c* may expose the dielectric material 1025 between adjacent vertical PMOS transistor structures 1020.

Referring to FIG. 10O and FIG. 10P, a gate dielectric material 1027 may be formed over the vertical PMOS transistor structures 1020 and a gate electrode material 1028 may be formed over the gate dielectric material 1027. The gate dielectric material 1027 may overlie at least sidewalls of the vertical PMOS transistor structures 1020, such as, at least sidewalls of the P-type source material 1020*a*, the N-type channel material 1020*b*, and the P-type drain material 1020*c*. The gate dielectric material 1027 may include one or more of the materials described above with reference to the gate dielectric material 1017. In some embodiments, the gate dielectric material 1027 comprises the same material as the gate dielectric material 1017.

The gate electrode material 1028 may be formed over the gate dielectric material 1027. The gate electrode material 1028 may extend over an entire vertical length (in the z-direction) of the N-type channel material 1020*b* and may extend, at least partially, over the P-type source material 1020*a* and the P-type drain material 1020*c*. In other embodiments, the gate electrode material 1028 may not extend over one or both of the P-type source material 1020*a* and the P-type drain material 1020*c*. In some such embodiments, the gate electrode material 1028 may be said to underlap the P-type source material 1020*a* and the P-type drain material 1020*c*.

Referring to FIG. 10Q, the sacrificial material 1029 (FIG. 10P) may be removed and replaced with an electrically conductive material 1022. The electrically conductive material 1022 may comprise suitable electrically conductive material for forming a conductive contact, such as, for example, tungsten, tungsten nitride, titanium, titanium nitride, aluminum, copper, ruthenium, molybdenum, silver, gold, polysilicon, another conductive material, or combinations thereof.

Although FIG. 10Q has been described as including removing the sacrificial material 1029 from over the P-type source material 1020*a* of each of the vertical PMOS transistor structures 1020, the disclosure is not so limited. In other embodiments, and depending on a desired circuit configuration of the semiconductor device 1000, the sacrificial material 1029 may not be removed and may remain on the P-type source material 1020*a* of at least some of the vertical PMOS transistor structures 1020. In some such embodiments, vertical PMOS transistor structures 1020 on which the sacrificial material 1029 remains may be electrically isolated from a later formed conductive line (e.g., a $V_{DD}$ structure).

Although FIG. 10L through FIG. 10P have been described as including the sacrificial material 1029 over the vertical PMOS transistor structures 1020, the disclosure is not so limited. In other embodiments, the sacrificial material 1029 may not be formed over the P-type source material 1020*a* as described above with reference to FIG. 10L. In some such embodiments, the electrically conductive material 1022 may be formed directly over the P-type source material 1020*a* prior to patterning the vertical PMOS transistor structures 1020.

With continued reference to FIG. 10Q, the electrically conductive material 1022 may be planarized, such as by chemical mechanical polishing. A dielectric material 1042 may be formed over sides of the gate dielectric material 1027 and the dielectric material 1042. The dielectric material 1042 may comprise one or more of the materials described above with reference to the liner material 1032.

A dielectric material 1044 may be formed in regions between the adjacent vertical PMOS transistor structures 1020. The dielectric material 1044 may include a suitable electrically insulative material and may include one or more of the materials described above with reference to the dielectric material 1042.

Referring to FIG. 10R, one or more gate contacts 1041, 1045 may be formed. In some embodiments, a gate contact 1041 may be formed in electrical communication with the gate contact 1040 formed in the first deck structure 1001. The gate contacts 1041, 1045 may be formed in peripheral regions of the semiconductor device, such as outside an array area of the vertical PMOS transistor structures 1020. The gate contacts 1041, 1045 may include a suitable electrically conductive material and may include one or more of the materials described above with reference to the gate contact 1040. In some embodiments, the gate contacts 1041, 1045 comprise the same material as the gate contact 1040.

In some embodiments, all of the gate electrode materials 1028 may be electrically connected to a gate contact 1041, 1045. In other embodiments, only some of the gate electrode materials 1028 are electrically connected to a gate contact 1041, 1045. In some embodiments, the gate electrode material 1028 is in electrical communication with a gate electrode material from another deck (e.g., the first deck structure 1001), such as one or more of the gate electrode materials 1018.

Referring to FIG. 10S and FIG. 10T, a mask 1046 may be formed (e.g., deposited) over the semiconductor device 1000, such as over the electrically conductive material 1022 and the dielectric material 1044 between adjacent vertical PMOS transistor structures 1020. With reference to FIG. 10T, openings 1047 may be formed at one or more locations of the mask 1046. By way of nonlimiting example, at least one opening 1047 may be formed in the mask 1046 over a gate contact (e.g., the gate contact 1041) and at least one opening 1047 may be formed over at least one of the vertical PMOS transistor structures 1020.

Referring to FIG. 10U and FIG. 10V, the electrically conductive material 1022 exposed through the openings 1047 (FIG. 10T) in the mask 1046 (FIG. 10T) may be removed and the mask 1046 may be removed (e.g., stripped) from the semiconductor device 1000. Referring to FIG. 10y, the openings 1047 may be filled with a dielectric material 1048, which may comprise an insulative material, such as, for example silicon dioxide.

Referring to FIG. 10W and FIG. 10X, a conductive material may be formed and patterned over the semiconductor device 1000 to form conductive lines 1050 (such as V$_{DD}$ structures). The conductive lines 1050 may comprise any suitable conductive material, such as, for example, tungsten, tungsten nitride, titanium, titanium nitride, aluminum, copper, ruthenium, molybdenum, silver, gold, polysilicon, another conductive material, or combinations thereof.

Since the conductive material 1022 over at least some of the vertical PMOS transistor structures 1020 was removed, at least some of the vertical PMOS transistor structures 1020 may not be electrically connected to a respective conductive line 1050. Accordingly, some of the vertical PMOS transistor structures 1020 may be electrically isolated from a respective conductive line 1050 at least through the dielectric material 1048. In other embodiments, and referring back to FIG. 10T), the conductive material 1022 may not be removed from any of the vertical PMOS transistor structures 1020. In some such embodiments, substantially all of the vertical PMOS transistor structures 1020 may be in electrical communication with the conductive line 1050.

Referring to FIG. 10Y and FIG. 10Z, a dielectric material 1052 may be formed over the semiconductor device 1000 and may fill regions between adjacent conductive lines 1050. The dielectric material 1052 may be planarized, such as by chemical mechanical polishing.

Forming the semiconductor device 1000 to include the NMOS transistors and the PMOS transistors over the other of the NMOS transistors and the PMOS transistors may facilitate forming the NMOS transistors separately from the PMOS transistors of a CMOS circuit. In addition, since the semiconductor structure may include stacked decks over a base control logic structure, each deck comprising TFT control logic structure comprising CMOS circuits, an amount of interconnect circuitry (e.g., conductive sockets, conductive plugs, conductive lines, etc.) from each deck structure to the base control logic structure may be reduced.

Accordingly, in some embodiments, a method of forming a semiconductor device comprises forming deck structures over a substrate, wherein forming deck structures comprises forming each deck structure to comprise a memory element level and a control logic level. Forming at least one control logic level of at least one deck structure comprises forming a first subdeck structure comprising first transistors, at least some transistors of the first transistors comprising one of N-type channel regions or P-type channel regions, forming a second subdeck structure comprising second transistors over the first subdeck structure, at least some of the second transistors comprising the other of the N-type channel regions or the P-type channel regions, and electrically connecting the at least some transistors of the first transistors to the at least some transistors of the second transistors to form a device.

Although FIG. 3 through FIG. 8B and FIG. 10A through FIG. 10Z have been described and illustrated as including transistor structures comprising a double gate structure wherein the channel regions of the NMOS transistors and the channel regions of the PMOS transistors include a gate on two sides thereof, the disclosure is not so limited. In other embodiments, the NMOS transistors and the PMOS transistors of a semiconductor device may be arranged as bottom gate transistors, top gate transistors, gate all around (GAA) transistors, saddle gate transistors, or other transistor structures.

Figure 11A:
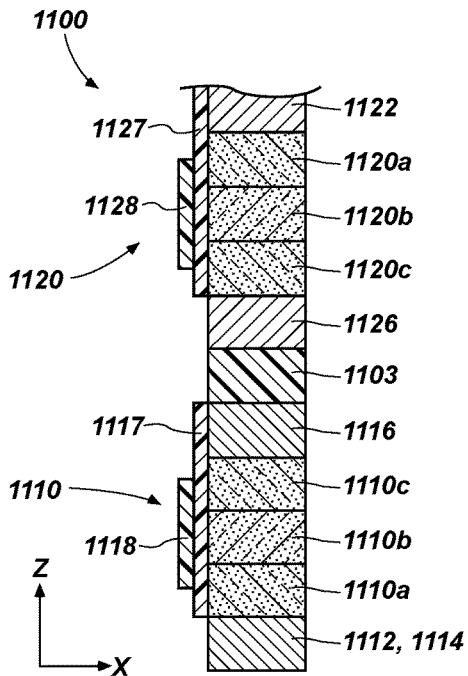
FIG. 11A and FIG. 11B are simplified cross-sectional views of a semiconductor device including a vertical NMOS transistor and a vertical PMOS transistor, in accordance with embodiments of the disclosure.
Figure 11B:
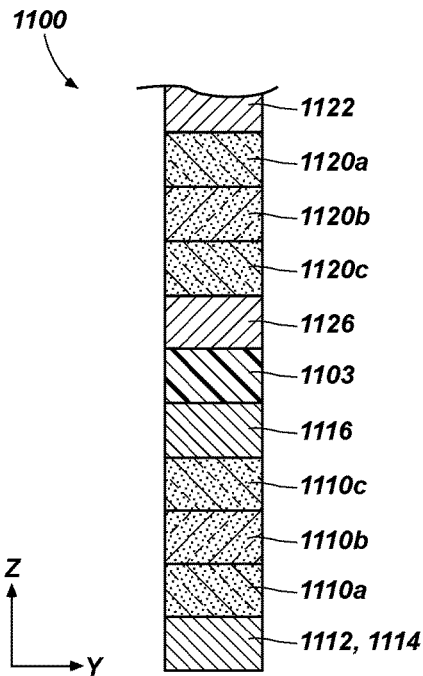

FIG. 11A and FIG. 11B are simplified cross-sectional views of a portion of a TFT control logic level 200 (FIG. 2) including vertical transistors arranged as single gate transistors. Referring to FIG. 11A, a portion of a semiconductor device 1100 including a vertical NMOS transistor 1110 and a vertical PMOS transistor 1120 over the vertical NMOS transistor 1110 is illustrated.

The vertical NMOS transistor 1110 may include an N-type source region 1110a, a P-type channel region 1110b over the N-type source region 1110a, and an N-type drain region 1110c over the P-type channel region 1110b. The vertical PMOS transistor 1210 may include a P-type drain region 1120c, an N-type channel region 1120b over the P-type drain region 1110c, and a P-type source region 1120a over the N-type channel region 1120b.

The vertical NMOS transistor 1110 overlies a source contact 1112 and GND structure 1114, which may be substantially the same as the source contact 312 and the GND structure 314 described above with reference to FIG. 3A through FIG. 3C. A drain contact 1116 may overlie the N-type drain region 1110c of the vertical NMOS transistor 1110. An output structure 1103 may overlie the drain contact 1116. A drain contact 1126 may overlie the output structure 1103 and may be in electrical communication with the P-type drain region 1120c. The drain contact 1116, the drain contact 1126, the output structure 1103 may be substantially the same as the drain contact 316, the drain contact 326, and the output structure 303, respectively described above with reference to FIG. 3A through FIG. 3C. A source contact 1122 may overlie and be in electrical communication with the P-type source region 1120a and may comprise substantially the same material described above with respect to the source contact 322 (FIG. 3A through FIG. 3C).

A gate dielectric material 1117 may overlie sidewalls of at least the P-type channel region 1110b. In some embodiments, the gate dielectric material 1117 overlies sidewalls of one or more of the N-type source region 1110*a*, the N-type drain region 1110*c*, and the drain contact 1116. The gate dielectric material 1117 may comprise substantially the same materials described above with respect to the gate dielectric material 317 (FIG. 3A, FIG. 3B).

A gate electrode 1118 may overlie sides of at least a portion of the gate dielectric material 1117. The gate electrode 1118 may comprise substantially the same materials described above with respect to the gate electrode 318 (FIG. 3A through FIG. 3C).

A gate dielectric material 1127 may overlie sidewalls of at least the N-type channel region 1120*b*. In some embodiments, the gate dielectric material 1127 overlies sidewalls of one or more of the P-type source region 1120*a*, the P-type drain region 1120*c*, and the source contact 1122. The gate dielectric material 1127 may comprise substantially the same materials described above with respect to the gate dielectric material 1117.

A gate electrode 1128 may overlie at least a portion of the gate dielectric material 1117. The gate electrode 1128 may comprise substantially the same materials described above with respect to the gate electrode 1118.

With continued reference to FIG. 11A and FIG. 11B, each of the vertical NMOS transistor 1110 and the vertical PMOS transistor 1120 may include a respective gate electrode 1118, 1128 on only one side thereof. In other words, the vertical NMOS transistor 1110 and the vertical PMOS transistor 1120 may comprise a so-called single gate or a gate one side transistor. Accordingly, in some embodiments, the devices described above with reference to FIG. 3 through FIG. 8B and FIG. 10A through FIG. 10Z may include one or more vertical NMOS transistors 1110 and/or one or more vertical PMOS transistors 1120.

Figure 12A:
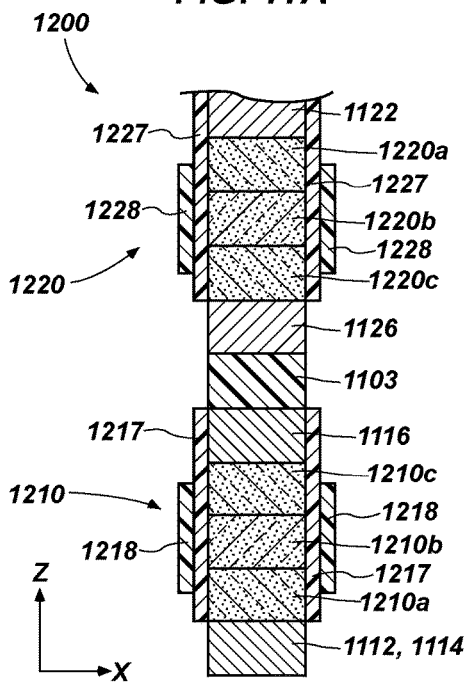
FIG. 12A and FIG. 12B are simplified cross-sectional views of a semiconductor device including a vertical NMOS transistor and a vertical PMOS transistor, in accordance with other embodiments of the disclosure.
Figure 12B:
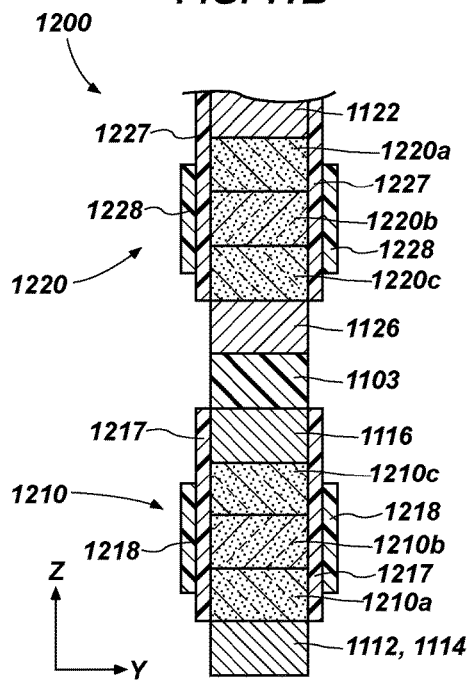

Referring to FIG. 12A and FIG. 12B, a portion of a semiconductor device 1200 including a vertical NMOS transistor 1210 and a vertical PMOS transistor 1220 over the vertical NMOS transistor 1210 is illustrated. FIG. 12A and FIG. 12B are cross-sectional views of the semiconductor device 1200. The semiconductor device 1200 may be substantially the same as the semiconductor device 1100, except that the semiconductor device 1200 may include a vertical NMOS transistor 1210 and a vertical PMOS transistor 1220 including a gate around all sides thereof, as will be described herein.

The vertical NMOS transistor 1210 includes an N-type source region 1210*a*, a P-type channel region 1210*b* over the N-type source region 1210*a*, and an N-type drain region 1210*c* over the P-type channel region 1210*b*. A gate dielectric material 1217 may overlie at least sidewalls of the P-type channel region 1210*b*. In some embodiments, the gate dielectric material 1217 overlies sidewalls of one or more of the N-type source region 1210*a*, the N-type drain region 1210*c*, and the drain contact 1116. The gate dielectric material 1127 may comprise substantially the same materials described above with respect to the gate dielectric material 1117 (FIG. 11A, FIG. 11B).

A gate electrode 1218 may overlie sides of the gate dielectric material 1217. The gate electrode 1218 may comprise substantially the same materials described above with respect to the gate electrode 1118 (FIG. 11A, FIG. 11B). With reference to FIG. 12A and FIG. 12B, the gate electrode 1218 may be located around all sidewalls of the vertical NMOS transistor 1210. In some such embodiments, the vertical NMOS transistor 1210 may be referred to as a so-called gate all around (GAA) transistor.

The vertical PMOS transistor 1220 includes a P-type drain region 1220*c*, an N-type channel region 1220*b* over the P-type drain region 1220*c*, and a P-type source region 1220*a* over the N-type channel region 1220*b*. A gate dielectric material 1227 may overlie at least sidewalls of the N-type channel region 1220*b*. In some embodiments, the gate dielectric material 1227 overlies sidewalls of one or more of the P-type source region 1220*a*, the P-type drain region 1220*c*, and the source contact 1122. The gate dielectric material 1227 may include substantially the same materials described above with reference to the gate dielectric material 1217.

A gate electrode 1228 may overlies sides of the gate dielectric material 1227. The gate electrode 1228 may comprise substantially the same materials described above with respect to the gate electrode 1218. With reference to FIG. 12A and FIG. 12B, the gate electrode 1228 may be located around all sidewalls of the vertical PMOS transistor 1220. In some such embodiments, the vertical PMOS transistor 1220 may comprise a GAA transistor.

Accordingly, in some embodiments, the devices described above with reference to FIG. 3 through FIG. 8B and FIG. 10A through FIG. 10Z may include one or more vertical NMOS transistors 1210 and/or one or more vertical PMOS transistors 1220.

In further embodiments, the devices described above with reference to FIG. 3 through FIG. 10Z may include transistor structures including so-called saddle channel regions. In some such embodiments, one or more transistors (e.g., one or more NMOS transistors, one or more PMOS transistors, or a combination thereof) may comprise a transistor including a saddle-shaped channel wherein the channel region is shaped and configured such that current flows in both a lateral direction and a vertical direction.

Although FIG. 3A through FIG. 12B have been illustrated as including only a particular arrangement of NMOS transistors and PMOS transistors, the disclosure is not so limited. In some embodiments, the devices and structures described above with reference to FIG. 3A through FIG. 12B may include one or more NMOS transistors and/or one or more PMOS transistors that are in electrical communication with CMOS devices that are not illustrated. In some embodiments, the devices and structures described above with reference to FIG. 3A through FIG. 12B may include one or more NMOS transistors and/or one or more PMOS transistors that are not in electrical communication with any other devices.

Figure 13:
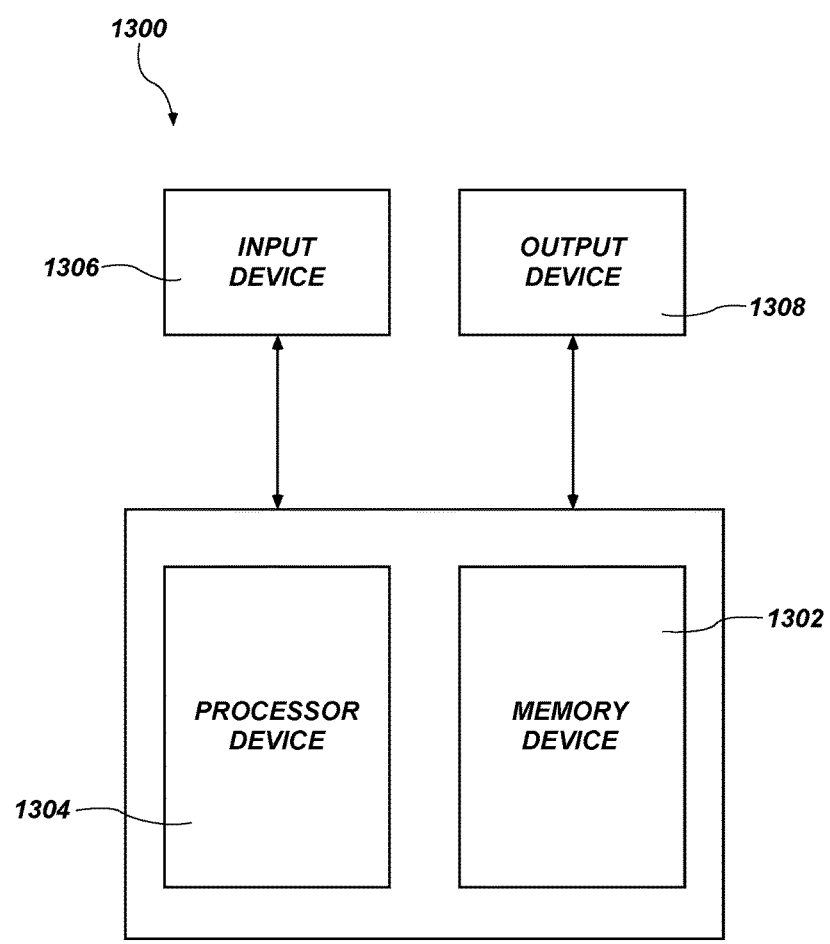
FIG. 13 is a schematic block diagram of an electronic system, in accordance with embodiments of the disclosure.

Semiconductor devices (e.g., the semiconductor devices 100, 1000, 1100, 1200) including semiconductor device structures and circuits (e.g., the circuits, structures, and devices described above with reference to FIG. 3A through FIG. 9) in accordance with embodiments of the disclosure may be used in embodiments of electronic systems of the disclosure. For example, FIG. 13 is a block diagram of an illustrative electronic system 1300 according to embodiments of disclosure. The electronic system 1300 may comprise, for example, a computer or computer hardware component, a server or other networking hardware component, a cellular telephone, a digital camera, a personal digital assistant (PDA), portable media (e.g., music) player, a WiFi or cellular-enabled tablet such as, for example, an iPad® or SURFACE® tablet, an electronic book, a navigation device, etc. The electronic system 1300 includes at least one memory device 1302. The at least one memory device 1302 may include, for example, an embodiment of the semiconductor device 100 previously described with respect to FIG. 1. The electronic system 1300 may further include at least one electronic signal processor device 1304 (often referred to as a "microprocessor"). The electronic signal processor device 1304 may, optionally, include a semiconductor device structure similar to an embodiment of the semiconductor device 100 previously described with respect to FIG. 1. The electronic system 1300 may further include one or more input devices 1306 for inputting information into the electronic system 1300 by a user, such as, for example, a mouse or other pointing device, a keyboard, a touchpad, a button, or a control panel. The electronic system 1300 may further include one or more output devices 1308 for outputting information (e.g., visual or audio output) to a user such as, for example, a monitor, a display, a printer, an audio output jack, a speaker, etc. In some embodiments, the input device 1306 and the output device 1308 may comprise a single touch screen device that can be used both to input information to the electronic system 1300 and to output visual information to a user. The one or more input devices 1306 and output devices 1308 may communicate electrically with at least one of the memory device 1302 and the electronic signal processor device 1304.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A semiconductor device, comprising:
  a stack structure comprising decks, each deck of the stack structure comprising:
    a memory element level comprising memory elements;
    a control logic level in electrical communication with the memory element level, the control logic level comprising a first subdeck structure comprising a first number of transistors comprising a P-type channel region or an N-type channel region and a second subdeck structure comprising a second number of transistors comprising the other of the P-type channel region and the N-type channel region overlying the first subdeck structure; and
  a base control logic structure in electric communication with the stack structure and comprising control logic devices, the control logic level of each individual deck of the stack structure comprising a word line driver in electrical communication with the memory elements of the memory element level of the individual deck of the stack structure.

2. The semiconductor device of claim 1, wherein control logic devices of the base control logic structure exhibit different configurations and have different operational functions than control logic devices of the control logic level of each of the decks of the stack structure.

3. The semiconductor device of claim 1, wherein:
  at least one deck of the stack structure comprises control logic devices comprising one or more of local deck decoders, column decoders, row decoders, sense amplifiers, word line drivers, repair devices, memory test devices, multiplexers, error checking and correction devices, and self-refresh devices; and
  the control logic devices of the base control logic structure comprise one or more of charge pumps, delay-locked loop devices, and drain supply voltage regulators.

4. The semiconductor device of claim 1, wherein the control logic level of at least one deck of the stack structure is above the memory element level of the at least one deck of the stack structure.

5. The semiconductor device of claim 1, wherein the control logic level of at least one deck of the stack structure is below the memory element level of the at least one deck of the stack structure.

6. The semiconductor device of claim 1, wherein the first number of transistors of at least one deck of the stack structure comprises gate all around transistors.

7. The semiconductor device of claim 1, wherein the first number of transistors of at least one deck of the stack structure comprises single gate transistors.

8. The semiconductor device of claim 1, wherein the first number of transistors of at least one deck of the stack structure comprises gate two side transistors.

9. The semiconductor device of claim 1, wherein the first number of transistors of at least one deck of the stack structure comprises channel regions configured such that current flows in at least one of a lateral direction and a vertical direction.

10. The semiconductor device of claim 1, wherein the first number of transistors of at least one deck of the stack structure comprises at least some transistors that are electrically isolated from other structures in the at least one deck.

11. The semiconductor device of claim 1, wherein the control logic level of each deck in the stack structure is substantially the same.

12. The semiconductor device of claim 1, wherein the first number of transistors and the second number of transistors comprise vertical transistors.

13. The semiconductor device of claim 1, wherein the first number of transistors and the second number of transistors comprise planar transistors.

14. The semiconductor device of claim 1, wherein each deck in the stack structure further comprises an access device level comprising access devices electrically connected to the memory elements of the memory element level.

15. The semiconductor device of claim 1, wherein the control logic level of at least one deck in the stack structure is in electrical communication with the base control logic structure.

16. The semiconductor device of claim 1, wherein the control logic level of at least one deck of the stack structure comprises at least one ring oscillator.

17. The semiconductor device of claim 1, wherein the control logic level of at least one deck of the stack structure comprises at least one inverter.

18. The semiconductor device of claim 1, wherein the control logic level of at least one deck of the stack structure comprises at least one of a balanced inverter, a transmission pass gate, a two-input NAND circuit, and a balanced two-input NAND circuit.

19. The semiconductor device of claim 1, wherein the first subdeck structure of at least one of the decks of the stack structure comprises vertical NMOS transistors and the second subdeck structure of the at least one deck of the stack structure comprises vertical PMOS transistors.

20. The semiconductor device of claim 1, wherein the transistors comprising a P-type channel region comprise an N-type source region, an N-type drain region, and the P-type channel region between the N-type source region and the N-type drain region, the P-type channel region extending in a direction substantially parallel with a major surface of a substrate of the semiconductor device.

21. A semiconductor device, comprising:
a stack structure comprising multiple decks, each deck of the stack structure comprising:
a memory element level comprising memory elements;
an access device level comprising access devices electrically connected to the memory elements of the memory element level; and
a control logic level comprising:
a first subdeck structure comprising a first number of transistors each transistor of the first number of transistors comprising one of an N-type channel region or a P-type channel region, the first subdeck structure comprising a first column decoder; and
a second subdeck structure over the first subdeck structure and comprising a second number of transistors, each transistor of the second number of transistors comprising the other of the N-type channel region or the P-type channel region, at least some transistors of the second number of transistors structure electrically coupled to at least some transistors of the first number of transistors, the second subdeck structure comprising a second column decoder.

22. The semiconductor device of claim 21, wherein the control logic level of at least one of the decks of the multiple decks of the stack structure comprises at least one inverter.

23. The semiconductor device of claim 21, wherein a gate electrode of at least one transistor of the first number of transistors is in electrical communication with a gate electrode of a respective transistor of the second number of transistors through a gate contact extending between the first subdeck structure and the second subdeck structure.

24. The semiconductor device of claim 21, wherein the first number of transistors comprises vertical transistors and the second number of transistors comprises vertical transistors.

25. The semiconductor device of claim 21, wherein the control logic level of at least one deck of the multiple decks comprises at least one of an inverter, a two-input NAND circuit, a balanced inverter, a balanced two-input NAND circuit, and a ring oscillator.

26. The semiconductor device of claim 25, wherein an output structure of the at least one of a inverter, a two-input NAND circuit, a balanced inverter, a balanced two-input NAND circuit, and a ring oscillator is located vertically between the first subdeck structure and the second subdeck structure.

27. The semiconductor device of claim 21, wherein the channel region of at least one transistor of the first number of transistors extends in a lateral direction.

28. A semiconductor device, comprising:
a first deck structure comprising a first memory element level, a first access device level, and a first control logic level comprising a first word line driver; and
a second deck structure over the first deck structure, the second deck structure comprising a second memory element level, a second access device level, and a second control logic level comprising a second word line driver,
wherein at least one of the first control logic level and the second control logic level comprises at least one CMOS device in electrical communication with a base control logic structure.

29. The semiconductor device of claim 28, wherein the first control logic level is substantially the same as the second control logic level.

30. The semiconductor device of claim 28, wherein at least one of the first control logic level and the second control logic level comprises transistors having one of N-type channel regions or P-type channel regions over transistors having the other of the N-type channel regions or the P-type channel regions.

31. The semiconductor device of claim 30, wherein the N-type channel regions and the P-type channel regions extend in a vertical direction relative to the base control logic structure.

32. The semiconductor device of claim 30, wherein the N-type channel regions and the P-type channel regions extend in a lateral direction relative to the base control logic structure.

33. The semiconductor device of claim 28, further comprising a third deck structure over the second deck structure, the third deck structure comprising a third memory element level, a third access device level, and a third control logic level.

34. A method of forming a semiconductor device, the method comprising:
forming deck structures over a substrate, wherein forming deck structures comprises forming each deck structure to comprise a memory element level and a control logic level, forming at least one control logic level of at least one deck structure comprising:
forming a first subdeck structure comprising first transistors, at least some transistors of the first transistors comprising one of N-type channel regions or P-type channel regions;
forming a second subdeck structure comprising second transistors over the first subdeck structure, at least some of the second transistors comprising the other of the N-type channel regions or the P-type channel regions; and
electrically connecting the at least some transistors of the first transistors to the at least some transistors of the second transistors to form a device; and
forming a base control logic structure comprising control logic devices in electrical communication with the deck structures, wherein forming deck structures comprises forming the control logic level of each individual deck structure to comprise a word line driver in electrical communication with memory elements of the memory element level of the individual deck structure of the deck structures.

35. The method of claim 34, wherein forming a first subdeck structure comprises forming an N-type source material, forming a P-type channel material over the N-type source material, forming an N-type drain material over the P-type channel material and patterning the N-type source material, the P-type channel material, and the N-type drain material to form the first transistors to comprise vertical transistors.

36. The method of claim 34, wherein forming a first subdeck structure comprises forming a sacrificial material over the first transistors.

37. The method of claim 36, further comprising removing the sacrificial material from over surfaces of the first transistors and forming conductive contacts over the first transistors.

38. The method of claim 34, wherein forming a first subdeck structure comprises forming the first transistors to comprise planar transistors.

39. The method of claim 34, wherein electrically connecting the at least some transistors of the first transistors to the at least some transistors of the second transistors to form a device comprises forming at least one of an inverter, a two-input NAND circuit, a balanced inverter, a balanced two-input NAND circuit, and a ring oscillator.

40. An electronic system, comprising:
a memory device in communication with at least one of an electronic signal processor device, an input device, and an output device, the memory device including a stack structure comprising decks, each deck of the stack structure comprising:
  a memory element level comprising memory elements; and
  a control logic level in electrical communication with a base control logic structure and the memory element level, the control logic level comprising a first subdeck structure comprising a first number of transistors comprising a P-type channel region or an N-type channel region and a second subdeck structure over the first subdeck structure and comprising a second number of transistors comprising the other of the P-type channel region and the N-type channel region, the control logic level comprising a word line driver in electrical communication with memory elements of the memory element level.

41. A method of operating a semiconductor device, the method comprising:
controlling functions of a stack structure having multiple decks, each deck of the stack structure comprising memory cells using control logic levels of the multiple decks, the control logic levels each comprising at least one multiplexer and at least one control logic device comprising a first subdeck structure comprising transistors having one of a P-type channel region and an N-type channel region overlying a second subdeck structure comprising transistors having the other of the P-type channel region and the N-type channel region; and
controlling additional functions of the stack structure using a base control logic structure in electrical communication with the control logic levels of the stack structure.

* * * * *

UNITED STATES PATENT AND TRADEMARK OFFICE
CERTIFICATE OF CORRECTION

PATENT NO.       : 10,366,983 B2                          Page 1 of 1
APPLICATION NO.  : 15/858128
DATED            : July 30, 2019
INVENTOR(S)      : Kurt D. Beigel et al.

It is certified that error appears in the above-identified patent and that said Letters Patent is hereby corrected as shown below:

In the Specification

| | | |
|---|---|---|
| Column 1, | Line 31, | change "access memory (PRAM)" to --access memory (DRAM)-- |
| Column 1, | Line 56, | change "a memo array" to --a memory array-- |
| Column 8, | Line 61, | change "fix use in" to --for use in-- |
| Column 37, | Line 31, | change "to FIG. $10y$," to --to FIG. $10V$,-- |

Signed and Sealed this
Tenth Day of September, 2019

Andrei Iancu
*Director of the United States Patent and Trademark Office*